(12) United States Patent  (10) Patent No.: US 9,230,904 B2
Eun et al.  (45) Date of Patent: Jan. 5, 2016

(54) METHODS OF FORMING A STACK OF ELECTRODES AND THREE-DIMENSIONAL SEMICONDUCTOR DEVICES FABRICATED THEREBY

(71) Applicants: Dongseog Eun, Seongnam-si (KR); Young-Ho Lee, Hwaseong-si (KR); Joonhee Lee, Seongnam-si (KR); Seok-won Lee, Yongin-si (KR); Yoocheol Shin, Hwaseong-si (KR)

(72) Inventors: Dongseog Eun, Seongnam-si (KR); Young-Ho Lee, Hwaseong-si (KR); Joonhee Lee, Seongnam-si (KR); Seok-won Lee, Yongin-si (KR); Yoocheol Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/973,627

(22) Filed: Aug. 22, 2013

(65) Prior Publication Data

US 2014/0054787 A1 Feb. 27, 2014

(30) Foreign Application Priority Data

Aug. 22, 2012 (KR) .................. 10-2012-0091920

(51) Int. Cl.
| | | |
|---|---|---|
| *H01L 23/48* | (2006.01) | |
| *H01L 23/498* | (2006.01) | |
| *H01L 27/115* | (2006.01) | |

(52) U.S. Cl.
CPC .... *H01L 23/49844* (2013.01); *H01L 27/11548* (2013.01); *H01L 27/11575* (2013.01); *H01L 27/11551* (2013.01); *H01L 27/11578* (2013.01); *H01L 2924/0002* (2013.01)

(58) Field of Classification Search
CPC ................................................ H01L 23/49844
See application file for complete search history.

(56) References Cited

U.S. PATENT DOCUMENTS

| | | |
|---|---|---|
| 7,847,342 B2 | 12/2010 | Fukuzumi et al. |
| 7,910,432 B2 | 3/2011 | Tanaka et al. |
| 7,910,973 B2 | 3/2011 | Sakaguchi et al. |
| 7,989,880 B2 | 8/2011 | Wada et al. |
| 8,013,383 B2 | 9/2011 | Kidoh et al. |
| 8,084,809 B2 | 12/2011 | Maeda et al. |
| 8,178,917 B2 | 5/2012 | Tanaka et al. |
| 8,183,624 B2 | 5/2012 | Mizukami et al. |
| 8,278,695 B2 | 10/2012 | Kidoh et al. |
| 8,334,551 B2 | 12/2012 | Itagaki et al. |
| 8,350,314 B2 | 1/2013 | Fukuzumi et al. |
| 2008/0067583 A1 | 3/2008 | Kidoh et al. |
| 2008/0253183 A1 | 10/2008 | Mizukami et al. |
| 2009/0146190 A1 | 6/2009 | Fukuzumi et al. |

(Continued)

FOREIGN PATENT DOCUMENTS

| | | |
|---|---|---|
| JP | 2011-204829 A | 10/2011 |
| JP | 2011-222994 A | 11/2011 |

(Continued)

*Primary Examiner* — Stephen W Smoot
(74) *Attorney, Agent, or Firm* — Sughrue Mion, PLLC

(57) ABSTRACT

Provided are methods of forming a stack of electrodes and three-dimensional semiconductor devices fabricated thereby. The device may include electrodes sequentially stacked on a substrate to constitute an electrode structure. each of the electrodes may include a connection portion protruding horizontally and outward from a sidewall of one of the electrodes located thereon and an aligned portion having a sidewall coplanar with that of one of the electrodes located thereon or thereunder. Here, at least two of the electrodes provided vertically adjacent to each other may be provided in such a way that the aligned portions thereof have sidewalls that are substantially aligned to be coplanar with each other.

17 Claims, 63 Drawing Sheets

(56) References Cited

U.S. PATENT DOCUMENTS

| | | |
|---|---|---|
| 2009/0146206 A1 | 6/2009 | Fukuzumi et al. |
| 2009/0212350 A1 | 8/2009 | Kidoh et al. |
| 2009/0230449 A1 | 9/2009 | Sakaguchi et al. |
| 2009/0230462 A1 | 9/2009 | Tanaka et al. |
| 2009/0242968 A1 | 10/2009 | Maeda et al. |
| 2009/0267135 A1 | 10/2009 | Tanaka et al. |
| 2010/0213526 A1 | 8/2010 | Wada et al. |
| 2010/0320526 A1 | 12/2010 | Kidoh et al. |
| 2011/0169071 A1 | 7/2011 | Uenaka et al. |
| 2011/0175159 A1 | 7/2011 | Itagaki et al. |
| 2011/0204420 A1 | 8/2011 | Kim et al. |
| 2011/0244666 A1 | 10/2011 | Kim et al. |
| 2011/0286275 A1 | 11/2011 | Jeon et al. |
| 2012/0068259 A1 * | 3/2012 | Park et al. .................. 257/329 |
| 2013/0009274 A1 | 1/2013 | Lee et al. |
| 2013/0032875 A1 | 2/2013 | Yun et al. |

FOREIGN PATENT DOCUMENTS

| | | |
|---|---|---|
| KR | 10-2011-0001527 A | 1/2011 |
| KR | 10-2011-0013699 A | 2/2011 |
| KR | 10-2011-0015338 A | 2/2011 |
| KR | 10-1027349 B1 | 4/2011 |
| KR | 10-1055587 B1 | 8/2011 |
| KR | 10-2013-0015616 A | 2/2013 |

\* cited by examiner

Fig. 3

| | First Patterning Process | | | Second Patterning Process | | |
|---|---|---|---|---|---|---|
| | Depth | Region | The Number of Times | Depth | Region | The Number of Times |
| First Example | Multi-Layer | Multi Regions | At Least Once | Single-Layer | Local Region | Once |
| Second Example | Single-Layer | Local Region | Once | Multi-Layer | Multi Regions | At Least Once |
| Third Example | Single-Layer | Multi Regions | At Least Once | Multi-Layer | Local Region | Once |
| Fourth Example | Multi-Layer | Local Region | Once | Single-Layer | Multi Regions | At Least Once |

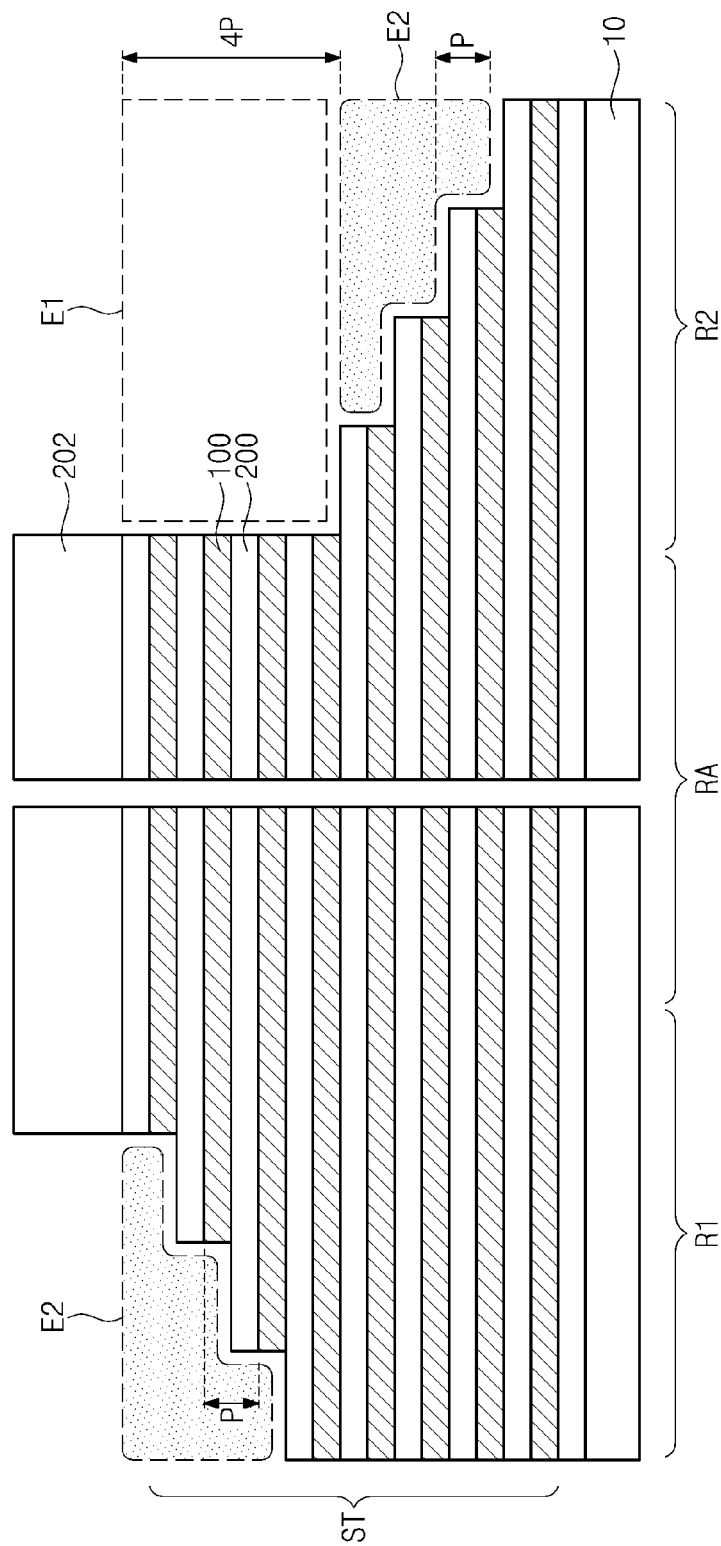

Fig. 19

|  | First Patterning Process | | | Second Patterning Process | | | Third Patterning Process | | |
|---|---|---|---|---|---|---|---|---|---|
|  | Depth | Region | The Number of Times | Depth | Region | The Number of Times | Depth | Region | The Number of Times |
| Fifth Example | Single-Layer | Multi Regions | Once | Double-Layer | Local Region | Once | Quadruple-Layer | Multi Regions | At Least Once |
| Sixth Example | Single-Layer | Multi Regions | Once | Quadruple-Layer | Multi Regions | At Least Once | Double-Layer | Local Region | Once |
| Seventh Example | Double-Layer | Local Region | Once | Single-Layer | Multi Regions | Once | Quadruple-Layer | Multi Regions | At Least Once |
| Eighth Example | Double-Layer | Local Region | Once | Quadruple-Layer | Multi Regions | At Least Once | Single-Layer | Multi Regions | Once |
| Ninth Example | Quadruple-Layer | Multi Regions | At Least Once | Single-Layer | Multi Regions | Once | Double-Layer | Local Region | Once |
| Tenth Example | Quadruple-Layer | Multi Regions | At Least Once | Double-Layer | Local Region | Once | Single-Layer | Multi Regions | Once |

METHODS OF FORMING A STACK OF ELECTRODES AND THREE-DIMENSIONAL SEMICONDUCTOR DEVICES FABRICATED THEREBY

CROSS-REFERENCE TO RELATED APPLICATIONS

This U.S. non-provisional patent application claims priority under 35 U.S.C. §119 to Korean Patent Application No. 10-2012-0091920, filed on Aug. 22, 2012, in the Korean Intellectual Property Office, the entire contents of which are hereby incorporated by reference.

BACKGROUND

Exemplary embodiments relate to a semiconductor device, and in particular, to methods of forming a stack of electrodes and three-dimensional semiconductor devices fabricated thereby.

Higher integration of semiconductor devices is required to satisfy consumer demands for superior performance and lower prices. In the case of semiconductor memory devices, integration is an important factor in determining product prices and thus, increased integration is important. In the case of typical two-dimensional or planar semiconductor memory devices, their integration is mainly determined by the area occupied by a unit memory cell, and thus, integration is greatly influenced by the level of a fine pattern forming technology. However, the extremely expensive process equipment needed to increase pattern fineness sets a practical limitation on increasing integration for two-dimensional or planar semiconductor devices.

To overcome such a limitation, three-dimensional semiconductor memory devices having three-dimensionally arranged memory cells have been proposed. The three-dimensional semiconductor memory device may also include three-dimensionally arranged conductive lines (for example, word lines) serving as electrical paths for accessing the memory cells.

SUMMARY

Exemplary embodiments provide a method allowing to reduce an occupying area of a stepwise connection structure of electrodes provided in a semiconductor device.

Other exemplary embodiments provide a simplified method of forming electrodes with a stepwise connection structure.

Still other exemplary embodiments provide a semiconductor device, in which electrodes with a stepwise connection structure are provided.

Even other exemplary embodiments provide a semiconductor device, in which an area required to realize an electric connection structure can be reduced.

An exemplary embodiment of the invention includes a three-dimensional semiconductor device, including an electrode structure including electrodes sequentially stacked on a substrate, wherein each of the electrodes includes: a connecting portion horizontally protruding outward relative to a plane at which a sidewall of one of the electrodes located thereon, is disposed; and an aligned portion having a sidewall that is coplanar with a sidewall of the one of the electrodes located thereon or another of the electrodes located thereunder, wherein aligned portions of vertically adjacent at least two of the electrodes have sidewalls that are coplanar.

The electrode structure may include at least one first group and at least one second group, and each of the at least one first and the at least one second groups includes plural ones of the electrodes that are consecutively stacked on the substrate along a direction perpendicular to a top surface of the substrate, wherein the connecting portions of the electrodes of the at least one first group are positioned at a left side of the electrode structure and the aligned portions of the at least one first group are positioned at a right side of the electrode structure, and the connecting portions of the electrodes of the at least one second group are positioned at a right side of the electrode structure and the aligned portions of the at least one second group are positioned at a left side of the electrode structure.

A number of the electrodes of each of the at least one first and the at least one second groups may range from 2 to 16.

The connecting portions of even-numbered ones of the electrodes are positioned at a left side of the electrode structure and the aligned portions of the even-numbered ones of the electrodes are positioned at a right side of the electrode structure, and connecting portions of odd-numbered ones of the electrodes are positioned at a right side of the electrode structure and the aligned portions of odd-numbered ones of the electrodes are positioned at a left side of the electrode structure.

The electrode structure may include a first group and a second group, each of which includes consecutively-stacked plural ones of the electrodes, and the second group is disposed on or below the first group, connecting portions of the electrodes of the first group are positioned at a left side of the electrode structure and the aligned portions of the first group are positioned at a right side of the electrode structure, the connecting portions of the electrodes of the second group are positioned at a right side of the electrode structure and the aligned portions of the second group are positioned at a left side of the electrode structure.

The connecting portions of (4n+1)-th and (4n+2)-th ones of the electrodes are positioned at a left side of the electrode structure and the aligned portions of the (4n+1)-th and the (4n+2)-th ones of the electrodes are positioned at a right side of the electrode structure, and the connecting portions of (4n+3)-th and (4n+4)-th ones of the electrodes are positioned at a right side of the electrode structure and the aligned portions of the (4n+3)-th and the (4n+4)-th ones of the electrodes are positioned at a left side of the electrode structure, wherein n is at least one selected from zero or natural numbers in such a way that (4n+4) is smaller a total stacking number of the electrodes.

The connecting and the aligned portions of each of the electrodes are positioned at both opposite end portions of corresponding electrode.

The electrode structure includes a first region, a second region, and an array region interposed therebetween, and each of the connecting portions and the aligned portions is positioned on one of the first and the second regions.

The device may further include vertical patterns vertically penetrating the array region of the electrode structure; and memory elements interposed between the vertical patterns and the electrodes.

The memory elements includes a material or a layer structure configured to be able to store charges or exhibit a variable resistance property.

The device may further include at least one dummy pattern that is spaced apart horizontally from and formed of the same material as one of the electrodes.

The at least one dummy pattern is in an electrical floating state.

The device may further include plugs disposed on the electrode structure, wherein the electrode structure includes: a body portion including ones of the electrodes that are electrically connected to the plugs; and a dummy portion including ones of the electrodes that are electrically separated from the plugs, wherein the dummy portion is spaced apart horizontally from the body portion.

The body portion includes at least one body sidewall portion, and the dummy portion includes a first dummy sidewall portion facing the body sidewall portion, wherein the body sidewall portion and the first dummy sidewall portion are disposed to have mirror symmetry to each other, and each of the body sidewall portion and the first dummy sidewall portion has a stepwise section.

The dummy portion further includes a second dummy sidewall portion facing the first dummy sidewall portion, and the second dummy sidewall portion is smaller than the first dummy sidewall portion, in terms of angle with respect to a line normal to a top surface of the substrate.

The second dummy sidewall portion has a stepwise section.

The dummy portion includes plural ones of the electrodes that are consecutively stacked on the substrate.

An exemplary embodiment provides a method of manufacturing a semiconductor device, the method including: alternatingly stacking a plurality of electrode layers and insulating layers to form a stack, the stack having a first region and a second region, and the stack having a vertical pitch of a distance between a top surface of one electrode layer and a top surface of another electrode layer adjacent to the one electrode layer; first patterning the stack, the first patterning including multilayer etching at least one from among the first and the second regions to a first depth that is at least twice the vertical pitch; and second patterning the stack, the second patterning including single layer etching at least another from among the first and the second regions to a second depth that is approximately equal to the vertical pitch, wherein a shape of a first profile of the first region is offset from a shape of a second profile of the second region, the offset being an amount equal to at least the vertical pitch.

The shape of the first profile and the shape of the second profile may be the same.

Further, in the first patterning, the multilayer etching may be performed once or repeatedly performed on multiple areas of the first and the second regions with a mask or masks of different shapes so the first and the second profile shapes have stepped shapes.

Furthermore, the second patterning may include single layer etching the second region.

In the one electrode layer of the plurality of electrode layers may include a connection portion and a aligned portion, the connection portion being disposed at the first region and connected to a conductive plug and the aligned portion being disposed at the second region and aligned with a connection portion of another electrode layer disposed on the one electrode layer.

The connection portion of the other electrode layer may be disposed above the aligned portion of the one electrode layer and a the aligned portion of the other electrode layer is not aligned over the connection portion of the one electrode layer.

The first patterning may be performed before the second patterning.

The second patterning may be performed before the first patterning.

The multilayer etching the first and the second regions may be a first multilayer etching based on a first mask, and the first patterning may further include a second multilayer etching the first and the second regions based on a second mask, and wherein the second mask may be smaller than the first mask.

The first region and the second region may be at opposite ends of the stack.

The stack may include one end and another end that are disposed at opposite sides of the stack, and wherein the first and the second regions may be disposed at the one end of the stack.

In one exemplary embodiment, in the first patterning, the multilayer etching is performed once on the second region with a mask.

In the second patterning, the single layer etching may be performed once or repeatedly performed on multiple areas of the first and the second regions with a mask or masks of different shapes so the first and the second profile shapes have stepped shapes.

The one electrode layer of the plurality of electrode layers may include a connection portion and an aligned portion, the connection portion being disposed at the first region, which is connected to a conductive plug and the aligned portion being disposed at the second region, which is aligned with a connection portion of another electrode layer disposed on the one electrode layer.

The connection portion of the other electrode layer may be disposed above the aligned portion of the one electrode layer and the aligned portion of the other electrode layer may not be aligned over the connection portion of the one electrode layer.

The first patterning may be performed before the second patterning.

The second patterning may be performed before the first patterning.

The single layer etching the first and the second regions may be a first single layer etching based on a first mask, and the second patterning may further include a second single layer etching the first and the second regions based on a second mask, and wherein the second mask may be smaller than the first mask.

The first and the second regions may be at opposite ends of the stack.

The multilayer etching may be a first multilayer etching, and the method may further include a third patterning, the third pattering including a second multilayer etching the first and the second regions, wherein the second multilayer etching etches to a second depth that is greater than the first distance.

The first, the second, and the third patterning may overlap in the vertical direction.

Another exemplary embodiment includes a method of manufacturing a semiconductor device, the method including: alternatingly stacking a plurality of electrode layers and insulating layers to form a stack, the stack having a first region at one side of the stack and a second region at another side of the stack; first patterning the plurality of electrode and insulating layers, the first patterning including repeatedly etching the first region to form a first stepped profile at the first region; and second patterning the plurality of electrode and insulating layers, the second patterning, including repeatedly etching the second region to form a second stepped profile that is lower than the first stepped profile the first region; wherein the first and the second patterning form a dummy pattern between the first region and the second region.

A top of the dummy pattern and a top of the first stepped profile region may be at a same level.

One exemplary embodiment includes a method of manufacturing a semiconductor device, the method including: alternatingly stacking a plurality of electrode layers and insulating layers to form a stack, the stack having a first region and a second region disposed at one end of the stack, and having a vertical pitch, the vertical pitch being a distance between top surfaces of one electrode layer and an adjacent electrode layer; first patterning the plurality of electrode and insulating layers, the first patterning including multilayer etching at least one from among the first and the second regions to a first depth that is at least twice the vertical pitch; and second patterning the plurality of electrode and insulating layers, the second patterning including single layer etching at least one from among the first and the second regions to a second depth this is approximately equal to the vertical pitch, wherein a first profile of an etched portion of the first region of the plurality of electrode and insulating layers is offset from a second profile of an etched portion of the second region of the plurality of electrode and insulating layers, the offset being an amount equal to the vertical pitch and wherein the first profile overlaps the second profile in a horizontal direction.

The stack may include the one end and another end that are disposed at opposite sides of the stack, and wherein the first and the second region are disposed at the one end of the stack and not at the other end.

A connection portion of an electrode layer of the first profile may be disposed in between two connection portions of two electrode layers of the second profile.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

FIG. 3 is a table illustrating methods of fabricating a semiconductor device according to exemplary embodiments.

FIGS. 17 and 18 are sectional views exemplarily illustrating a method of fabricating a semiconductor device according to the fourth example exemplified in FIG. 3.

FIG. 19 is a table illustrating methods of fabricating a semiconductor device according to other exemplary embodiments.

Figure 1:
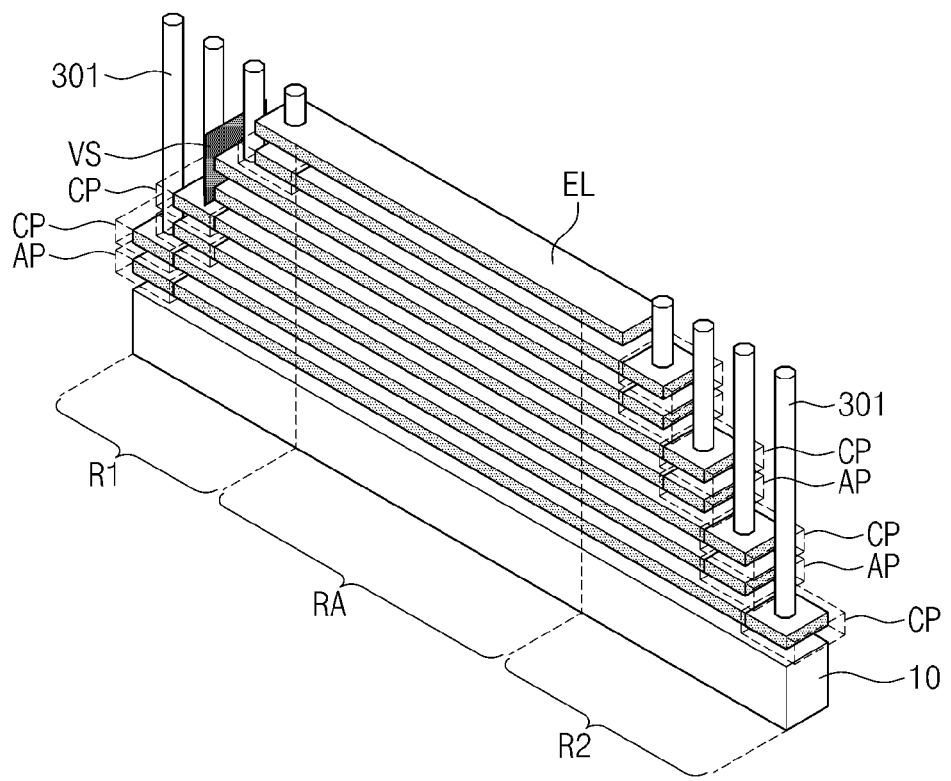
FIG. 1 is a perspective view exemplarily illustrating a semiconductor device according to exemplary embodiments.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXEMPLARY EMBODIMENTS

Exemplary embodiments will now be described more fully with reference to the accompanying drawings, in which exemplary embodiments are shown. Exemplary embodiments may, however, be embodied in many different forms and should not be construed as being limited to the exemplary embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view exemplarily illustrating a semiconductor device according to exemplary embodiments.

Referring to FIG. 1, an electrode structure may be provided on a substrate 10 with a connection region and an array region RA. For example, the connection region may include a first region R1 and a second region R2 positioned at both sides of the array region RA, but exemplary embodiments may not be limited thereto. The electrode structure may include a plurality of electrodes EL stacked in a sequential manner. The electrodes EL may be formed of a conductive material (for example, a doped semiconductor layer or a metal layer). In certain exemplary embodiments, the electrodes EL may be formed of the same material.

Lengths of the electrodes EL may decrease, i.e., become shorter, with increasing distance from the substrate 10. Furthermore, in plan view, one of the electrodes EL may be disposed within a region occupied by other electrode disposed thereunder. For example, the electrodes EL may be disposed to form a multi-layered structure having a stepwise portion(s), and one of the electrodes EL may include at least one endportion (hereinafter, referred as to a "connection portion CP", i.e., connecting portion), which is not covered by other electrode disposed thereon. If the connection portion CP has a sufficiently large area, the connection portion CP may serve as an electrical path (hereinafter, referred as to a "contact region"), allowing the corresponding electrode to be electrically connected to other wires.

According to some aspects of the inventive concept, at least one of the electrodes EL may include an endportion (hereinafter, referred as to an "aligned portion AP") having a side surface aligned to that of other electrode disposed thereon. For example, a pair of the electrodes EL adjacent to each other in a vertical direction may have sidewalls aligned to a specific vertical plane VS, whose normal direction is substantially perpendicular to a top surface of the substrate 10, or coplanar with each other.

In example embodiments, both endportions of each of the electrodes EL may be configured to have the technical features of the connection portion CP and the aligned portion AP described above. For example, one endportion of each electrode EL (for example, the connection portion CP) may protrude horizontally from other electrode disposed thereon, while opposite endportion thereof (for example, the aligned portion AP) may have a sidewall coplanar with or aligned with that of other electrode disposed thereon.

In some example embodiments, as shown in FIG. 1, the connection portion CP and the aligned portion AP may be formed on the first and second regions R1 and R2, respectively, for even-numbered ones of the electrodes EL and on the second and first regions R2 and R1, respectively, for odd-numbered ones of the electrodes EL.

Figure 2:
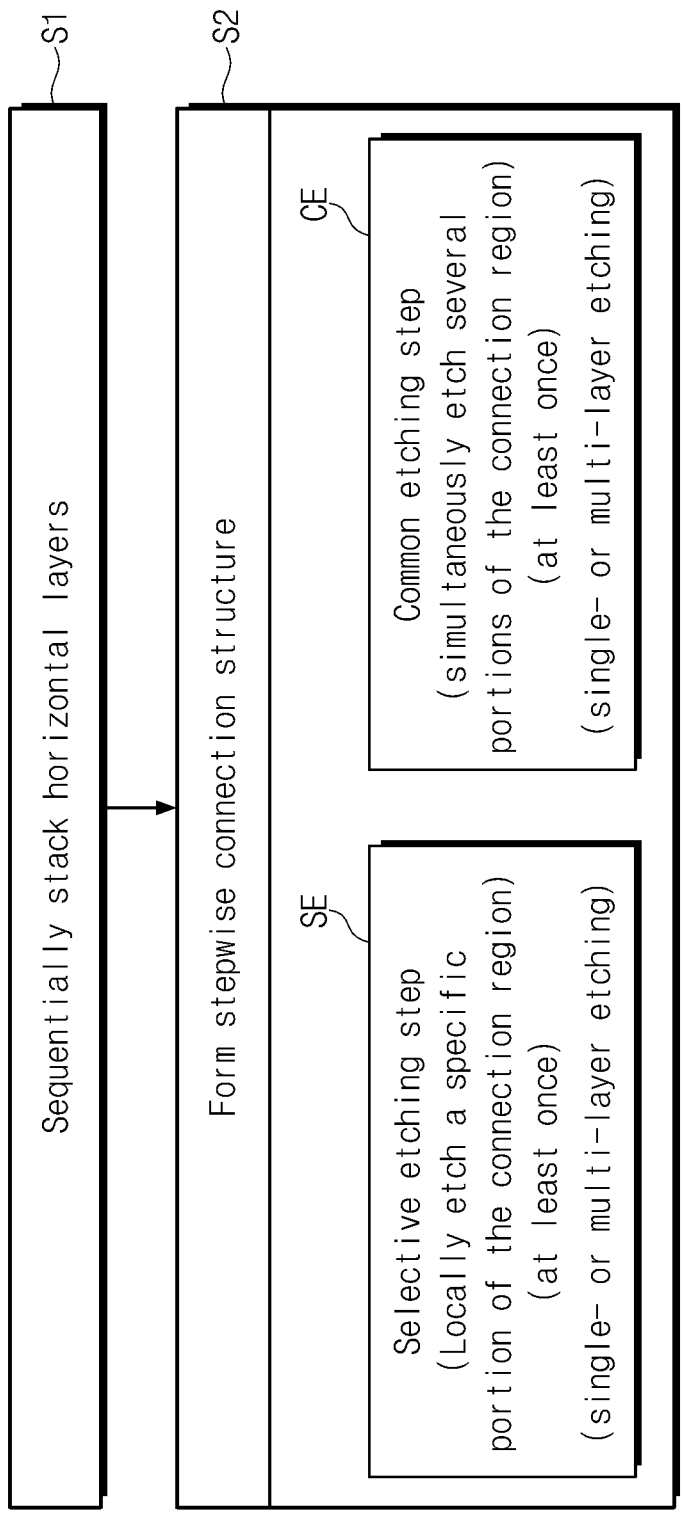
FIG. 2 is a schematic flow chart illustrating methods of fabricating a semiconductor device according to exemplary embodiments.

FIG. 2 is a schematic flow chart illustrating methods of fabricating a semiconductor device according to exemplary embodiments.

According to exemplary embodiments, a formation of a semiconductor device may include a process of forming a stack of electrodes, and the formation of the electrode stack may include a process of forming a stepwise connection structure (e.g., shown in FIG. 1). Hereinafter, a process of forming the stepwise connection structure according to exemplary embodiments will be described with reference to FIG. 2.

Referring to FIG. 2, horizontal layers may be sequentially stacked on a substrate to form a stack (in S1). A plurality of electrode layers and insulating layers may be alternatingly stacked to form a stack, the stack having a first region and a second region, and the stack having a vertical pitch of a distance between a top surface of one electrode layer and a top surface of another electrode layer adjacent to the one electrode layer. In certain embodiments, the electrodes EL of FIG. 1 may be a resulting structure obtained by etching the horizontal layers using a patterning method described below. For example, the horizontal layers may be used as the electrodes EL. In other example embodiments, the electrodes EL of FIG. 1 may be formed by etching the horizontal layers using a patterning method described below, selectively removing the horizontal layers to form empty spaces, and then, filling the empty spaces with a conductive layer. For example, the horizontal layers may serve as sacrificial layers for forming the empty spaces, in which the electrodes EL will be provided.

The stack may be patterned to form a stepwise connection structure on the connection region of the substrate (in S2). During the patterning of the stack, a selective etching step SE and a common etching step CE may be performed at least once. Here, the selective etching step SE may be performed to locally etch a specific portion of the connection region. By contrast, the common etching step CE may be performed to simultaneously etch several portions of the connection region. In certain embodiments, the specific portion associated with the selective etching step SE may be included in the several portions that will be etched during the common etching step CE.

During the formation of the stepwise connection structure, the selective etching step SE and the common etching step CE may be performed at least once, and each of them may be performed in a single- or multi-layer etching manner. In the case of the single-layer etching manner, the selective or common etching step SE or CE may be performed in such a way that an etched portion thereby has a second depth equivalent to a vertical pitch of each horizontal layer, and in the case of the multi-layer etching manner, the selective or common etching step SE or CE may be performed to a first depth in such a way that at least two layers of the horizontal layers can be continuously etched. The stepwise connection structure, e.g., stepped profile shape, may be realized through various combinations of the selective and common etching steps SE and CE, and some examples of such combinations will be described in more detail with reference to FIGS. 3 through 52. Therefore, a shape of a first profile of the first region is offset from a shape of a second profile of the second region, the offset being an amount equal to at least the vertical pitch.

FIG. 3 is a table illustrating methods of fabricating a semiconductor device according to exemplary embodiments.

According to exemplary embodiments, the formation of the connection structure (in S2) may include first and second patterning processes S21 and S22, which differ from each other in terms of both of an etch depth and an etching region. For example, one of the first and second patterning processes S21 and S22 may be performed in such a way that an etch depth thereof is at least twice a vertical pitch of the horizontal layer, and the other may be performed in such a way that an etch depth thereof is about the vertical pitch of the horizontal layer. Here, the vertical pitch of the horizontal layer may refer to a difference in height between top surfaces of one of the horizontal layers and other located thereon or thereunder. In other words, one of the first and second patterning processes S21 and S22 may be performed in a multi-layer etching manner, while the other may be performed in a single-layer etching manner. For example, the first and second patterning processes S21 and S22 may be performed in the multi- and single-layer etching manners, respectively, for first and fourth examples enumerated in FIG. 3, and may be performed in the single- and multi-layer etching manners, respectively, for second and third examples.

With regard to the etching region, one of the first and second patterning processes S21 and S22 may be performed on every portion of the connection region, and the other may be performed on a specific portion of the connection region. For example, one of the first and second patterning processes S21 and S22 may be performed to etch several portions of the horizontal layers positioned on all the first and second regions R1 and R2 or in a common etching manner, and the other may be performed to etch a specific portion of the horizontal layers positioned on the second region R2 or in a selective etching manner. Referring back to FIG. 3, in the first and third examples, the first patterning process may be performed in the common etching manner, and the second patterning process may be performed in the selective etching manner. Further, in the second and fourth examples, the first patterning process may be performed in the selective etching manner, and the second patterning process may be performed in the common etching manner.

In certain embodiments, the patterning process based on the common etching manner may include two or more steps of etching the horizontal layers on both the first and second regions R1 and R2, and the patterning process based on the selective etching manner may include a single step of etching the horizontal layers on the second region. For example, in the first and third examples in FIG. 3, the first patterning process S21 may include several steps of etching the horizontal layers in the common etching manner, and the second patterning process S22 may include a single step of etching the horizontal layers in the selective etching manner.

Hereinafter, methods of fabricating a semiconductor device according to the first to fourth examples of FIG. 3 will exemplarily be described with reference to FIGS. 4 through 18.

Figure 4:
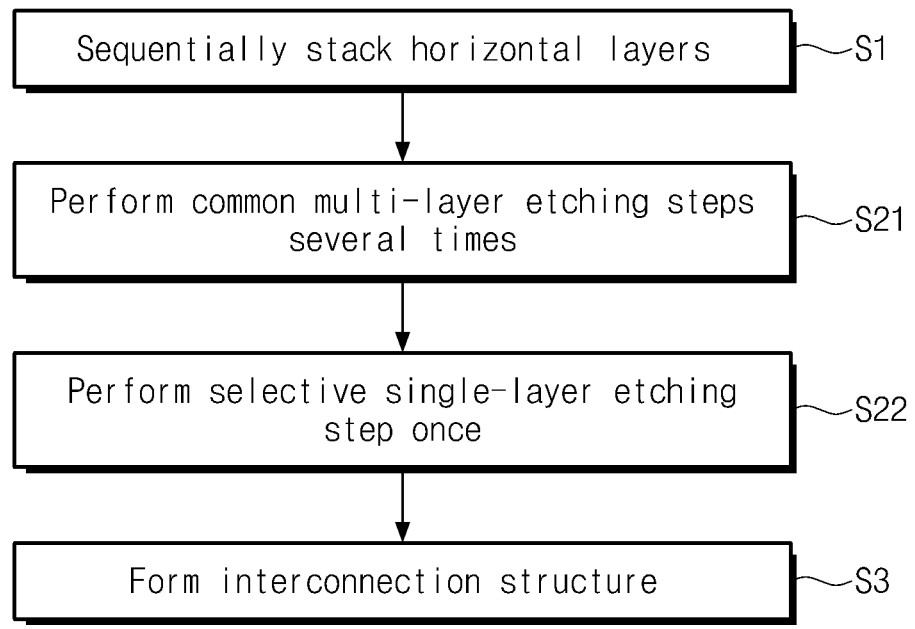
FIG. 4 is a flow chart illustrating a method of fabricating a semiconductor device according to the first example exemplified in FIG. 3.

FIG. 4 is a flow chart illustrating a method of fabricating a semiconductor device according to the first example exemplified in FIG. 3, and FIGS. 5 through 8 are sectional views exemplarily illustrating a method of fabricating a semiconductor device according to the first example exemplified in FIG. 3.

Figure 5:
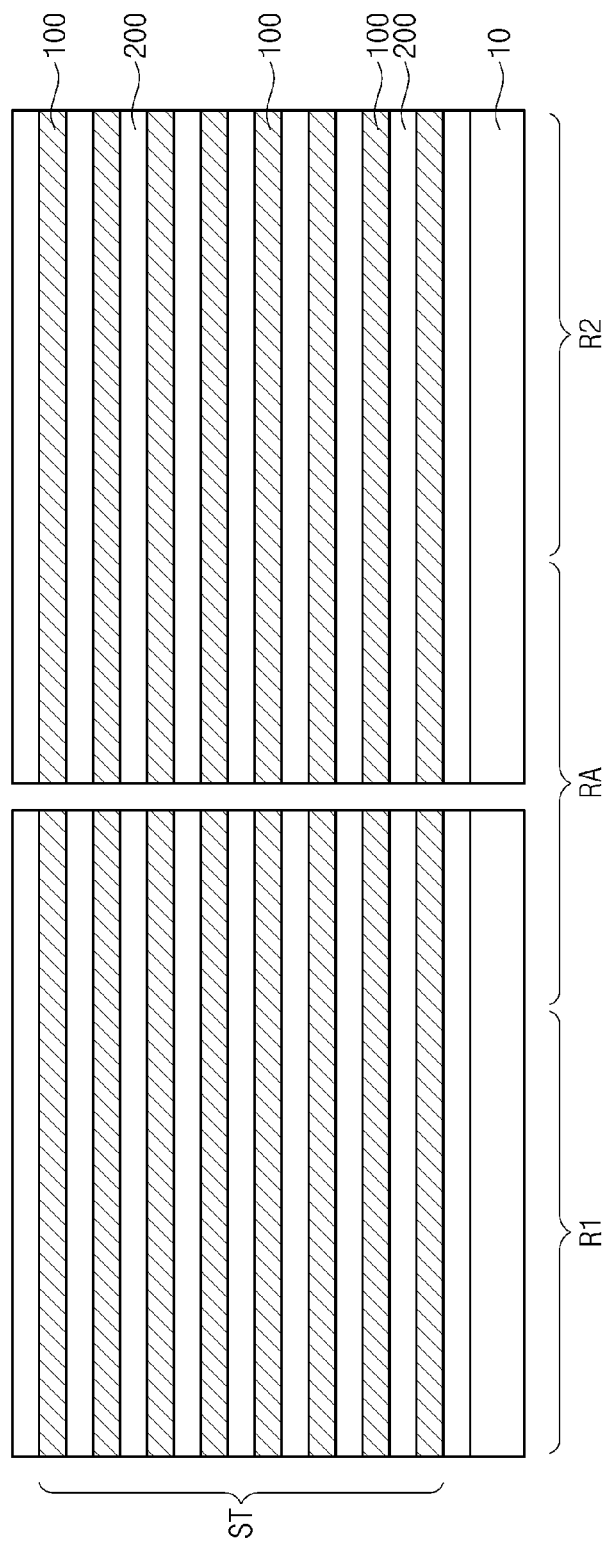
FIGS. 5 through 8 are sectional views exemplarily illustrating a method of fabricating a semiconductor device according to the first example exemplified in FIG. 3.

Referring to FIGS. 3 through 5, horizontal layers 100 and interlayered insulating layers 200 may be alternatingly stacked on a substrate 10 to form a stack ST (in S1). The substrate 10 may include a first region R1, a second region R2 and an array region RA therebetween. The horizontal layers 100 may be formed of a material having etch selectivity with respect to the interlayered insulating layers 200. For example, the interlayered insulating layers 200 may be formed of a silicon oxide layer, while the horizontal layers 100 may include at least one of a silicon nitride layer, a silicon oxynitride layer, a poly silicon layer, or metal layer. In example embodiments, the horizontal layers 100 may be formed of the same material.

Figure 6:
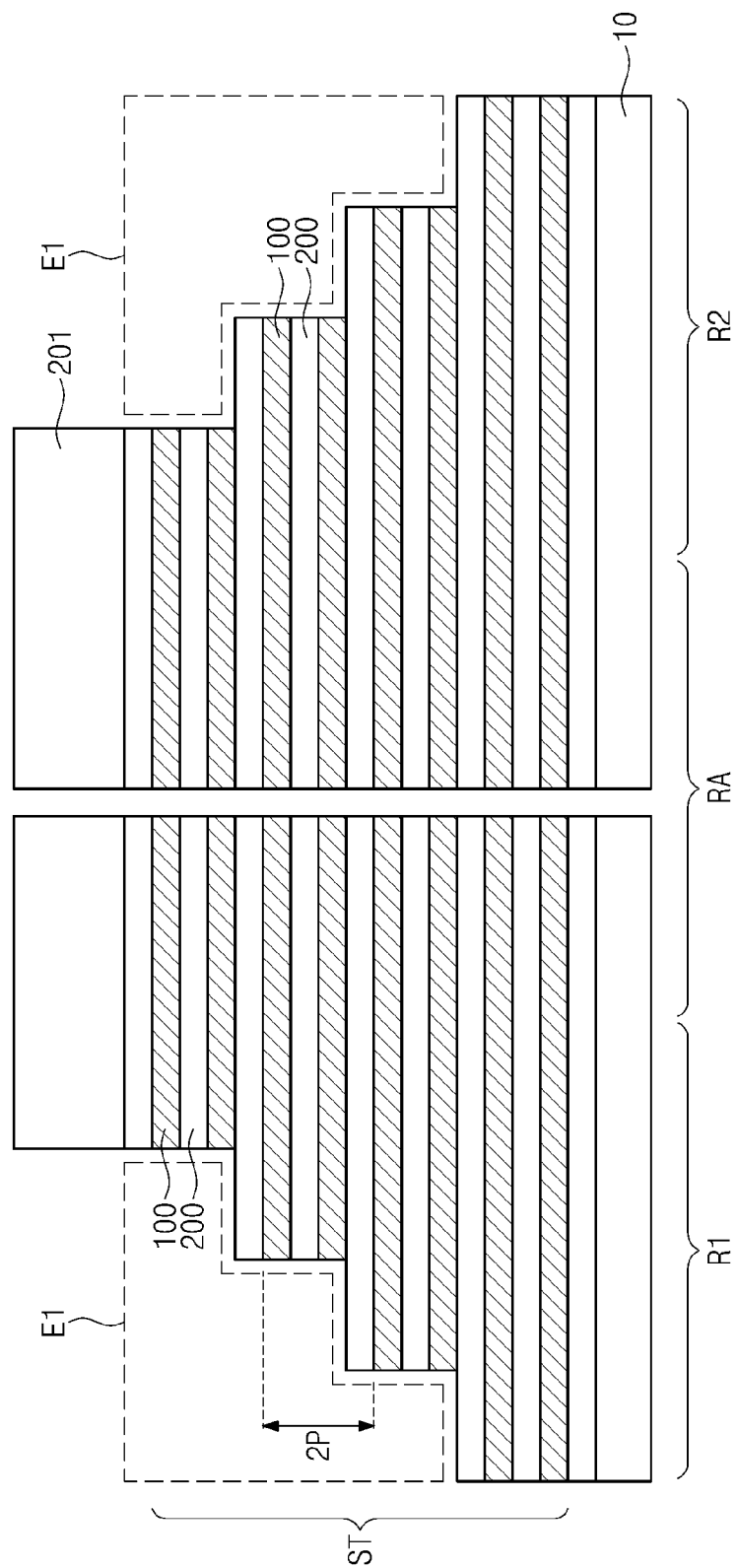

Referring to FIGS. 3, 4 and 6, the first patterning process S21 may be performed on the stack ST. In the present example, the first patterning process S21 may include a plurality of etching steps performed in the common multi-layer etching manner.

For example, the first patterning process S21 may include at least two etching steps, each of which is performed to etch portions of the stack ST positioned on the first and second regions R1 and R2 to the same etch depth. To realize the etching steps in the common etching manner, the etching steps may be performed using their respective etch mask exposing both the first and second regions R1 and R2. As shown in FIG. 6, in certain embodiments, an etch depth in each etching step may be about twice the vertical pitch of the horizontal layers 100.

Meanwhile, in the case where the first patterning process S21 includes a plurality of etching steps performed in the common etching manner, a single etch mask may be used in common for at least successive two of the etching steps. For example, a following one of the etching step may include a step of reducing or shrinking a horizontal size or width of a first etch mask 201 that has been used in a preceding one of the etching steps. The reduced first etch mask 201 may be re-used as an etch mask in the following etching step. The re-use of the etch mask may relieve technical difficulties caused by a misalignment in a subsequent process and reduce the number of an expensive photolithography process.

In the case where, like the present embodiment, the first patterning process S21 includes the step of shrinking an etch mask, the number of the etching steps to be applied may be greater at outer portions of the stack ST than at inner portions thereof. Accordingly, a portion(s) of the stack ST to be etched during the first patterning process S21 (hereinafter, referred to as a first etched portion E1) may have an etch depth increasing with increasing distance from the array region RA. As a result, as shown in FIG. 6, the stack ST and the first etched portion E1 may be formed to have stepwise structures, e.g., stepped profiles, on the first and second regions R1 and R2.

As described above, since the first patterning process S21 is performed in the common etching manner, two portions or the first etched portions E1 of the stack ST positioned on the first region R1 and the second region R2 may be formed to have mirror symmetry with respect to each other.

Figure 7:
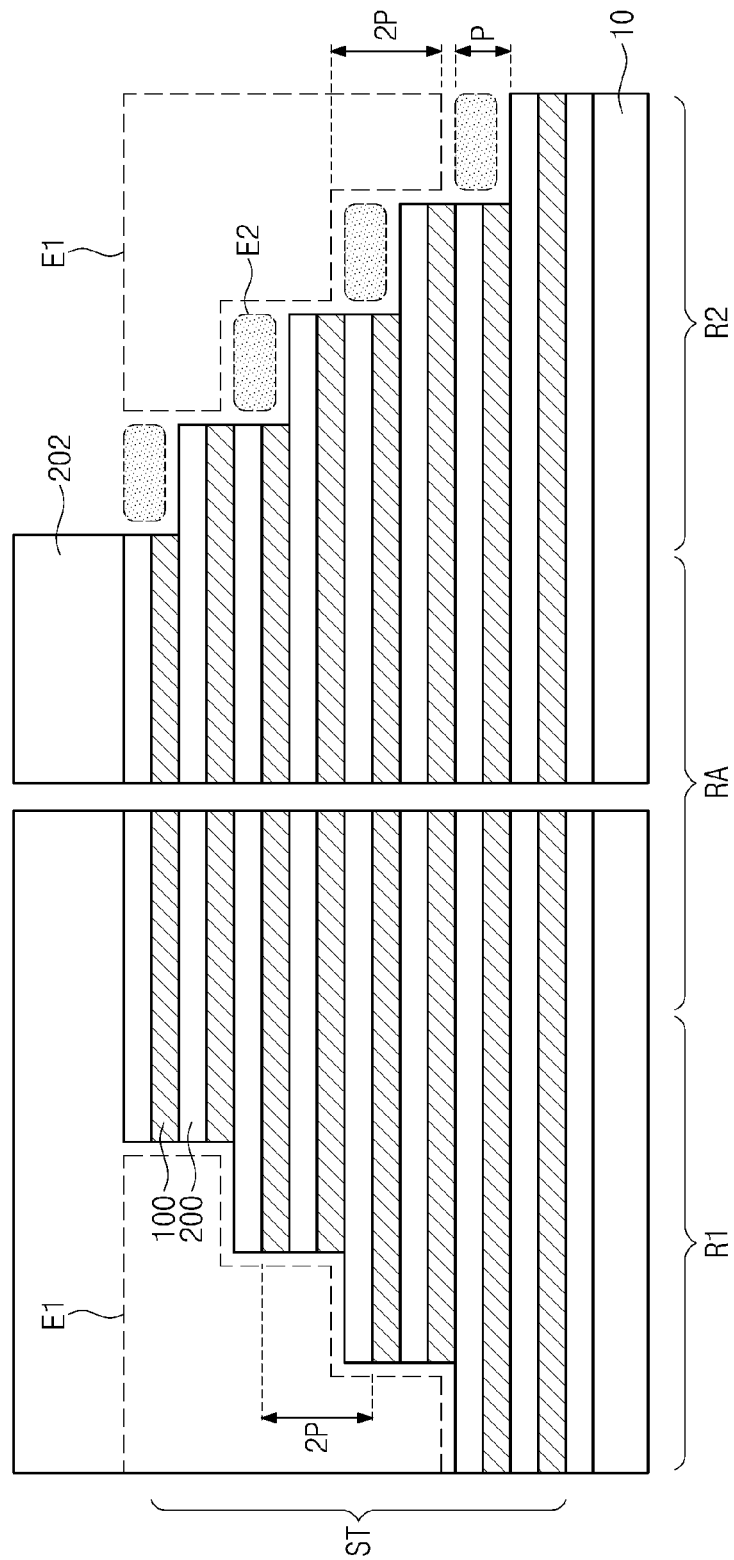

Referring to FIGS. 3, 4 and 7, the second patterning process S22 may be performed on the stack ST. According to the present example, the second patterning process S22 may include an etching step performed in the selective singe-layer etching manner.

For example, the second patterning process S22 may include a step of etching a portion of the stack ST positioned on the second region R2 to the vertical pitch P of the horizontal layer 100. The second patterning process S22 may be performed using a second etch mask 202, which may be formed to cover the first region R1 and expose the second region R2. The second etch mask 202 may be formed to expose the first etched portion E1 on the second region R2 and a neighboring region thereof, as shown in FIG. 7.

Hereinafter, for the sake of brevity, the portion of the stack ST that is newly etched through the second patterning process S22 will be referred to as a "second etched portion E2". According to the present embodiment, since the second patterning process S22 is performed in the selective etching manner, the second etched portion E2 may be locally formed on, for example, only the second region R2. Accordingly, two portions of the stack ST positioned on the first region R1 and the second region R2 may no longer have the mirror symmetry with respect to each other.

Further, since the second patterning process S22 is performed in the single-layer etching manner, two portions of the stack ST positioned on the first region R1 and the second region R2 may be formed to have a height difference corresponding to the vertical pitch P of the horizontal layer 100. Accordingly, the horizontal layers 100 constituting the stack ST can be formed to have the stepwise connection structure described with reference to FIG. 1. In addition, according to the above described embodiments, each of the horizontal layers 100 may be formed to have the connection portion CP and the aligned portion AP.

Figure 8:
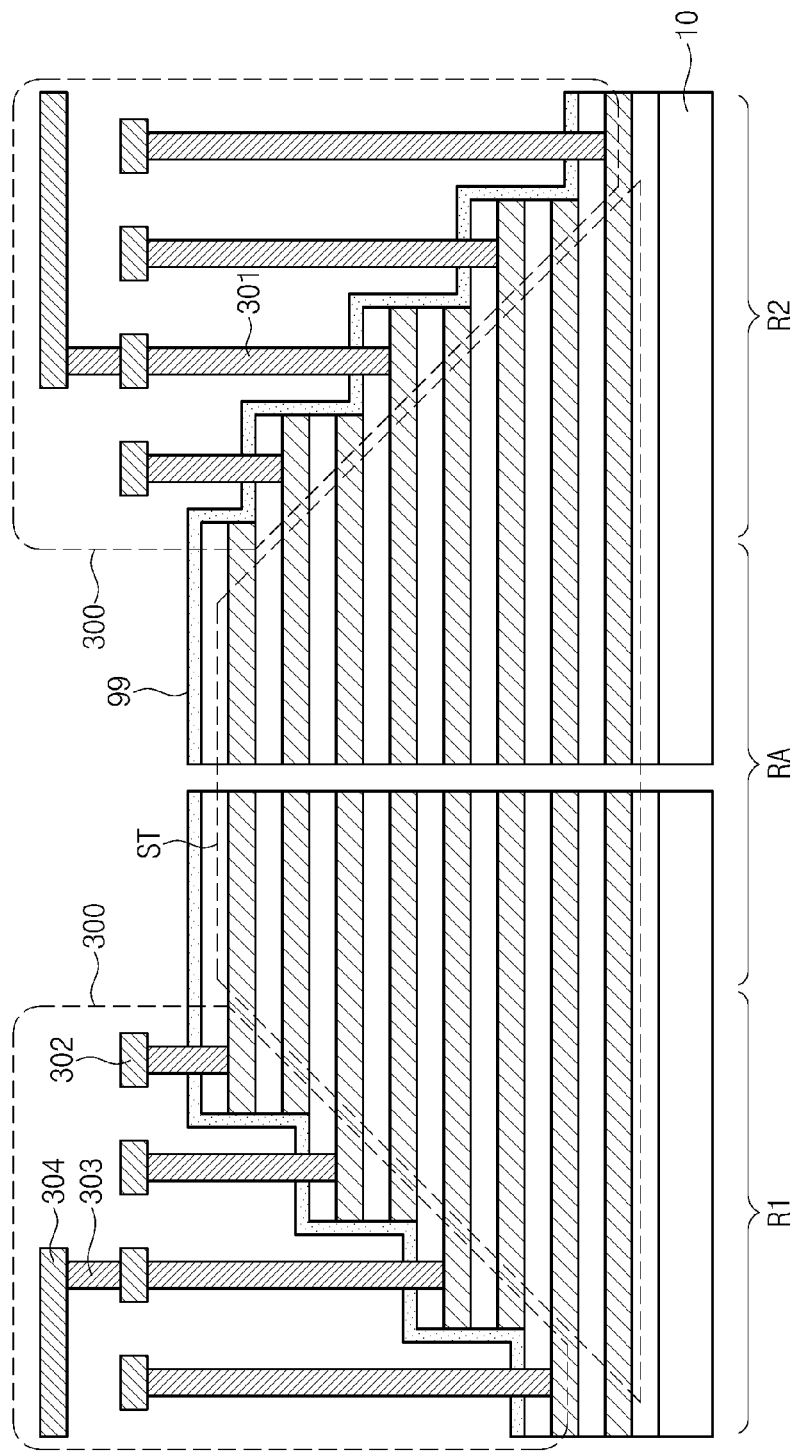

Referring to FIGS. 3, 4 and 8, an interconnection structure 300 may be formed on the structure, to which the second patterning process S22 has performed (in S3). In some embodiments, as shown in FIG. 8, the interconnection structure 300 may include plugs 301 coupled to the connection portions CP of the horizontal layers 100, respectively, and pads 302, via plugs 303, and metal line 304, which may be electrically connected to the plugs 301, respectively, but exemplary embodiments may not be limited thereto. Furthermore, before the formation of the interconnection structure 300, an etch stop layer 99 may be further formed to cover the resulting structure, to which the second patterning process S22 has performed. In other embodiments, an insulating spacer (not shown) may be further formed on exposed sidewalls of the horizontal layers 100. Due to the presence of the insulating spacer and/or the etch stop layer 99, it is possible to prevent an unintended electric path from being formed between the horizontal layer 100 and the plug 301.

According to the above described examples, an etch depth in each etching step of the first patterning process S21 may be twice the vertical pitch of the horizontal layer 100 (i.e., 2P), while an etch depth in the second patterning process S22 may be the vertical pitch of the horizontal layer 100 (i.e., P). In this case, as shown in FIG. 8, even-numbered ones of the horizontal layers 100 may be connected to a portion of the interconnection structure 300 on the first region R1, while odd-numbered ones of the horizontal layers 100 may be connected to other portion of the interconnection structure 300 on the second region R2.

Figure 9:
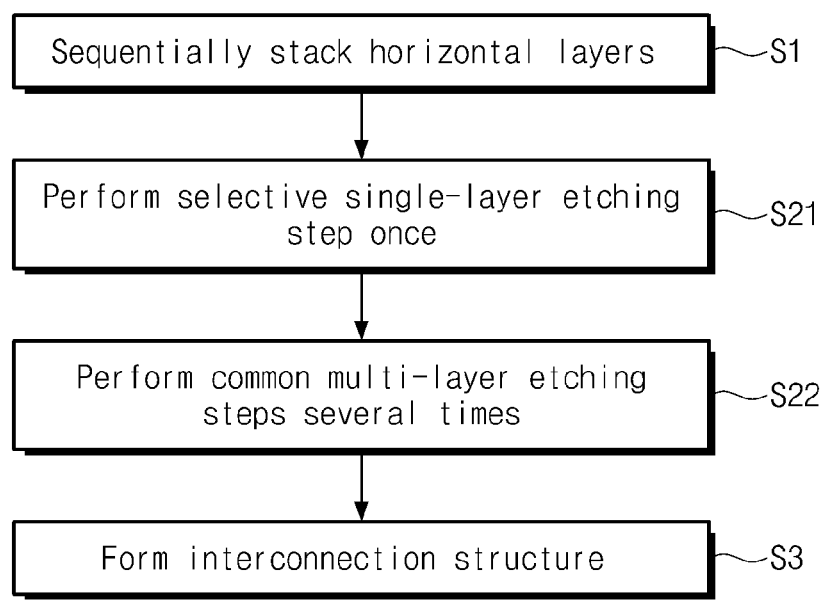
FIG. 9 is a flow chart illustrating a method of fabricating a semiconductor device according to the second example exemplified in FIG. 3.
Figure 10:
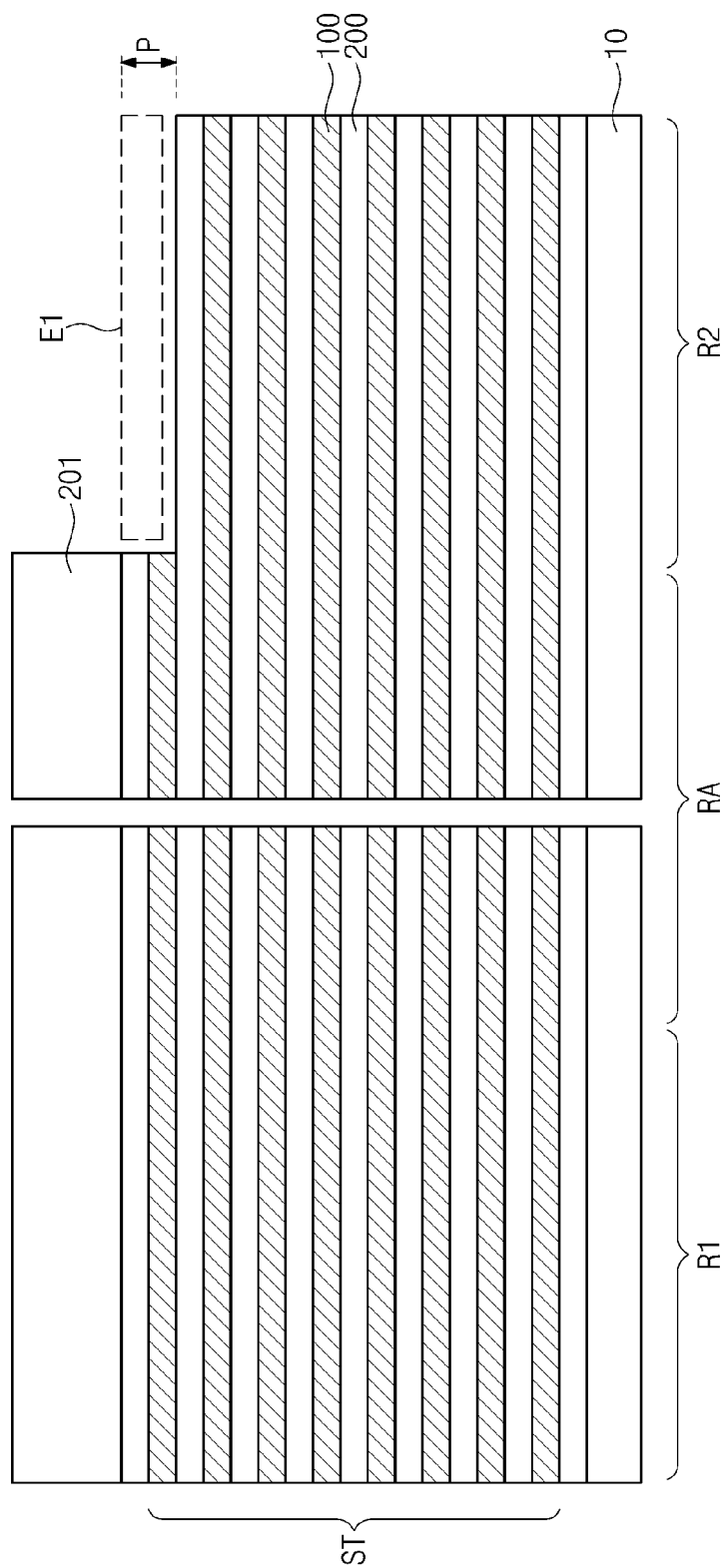
FIGS. 10 and 11 are sectional views exemplarily illustrating a method of fabricating a semiconductor device according to the second example exemplified in FIG. 3.
Figure 11:
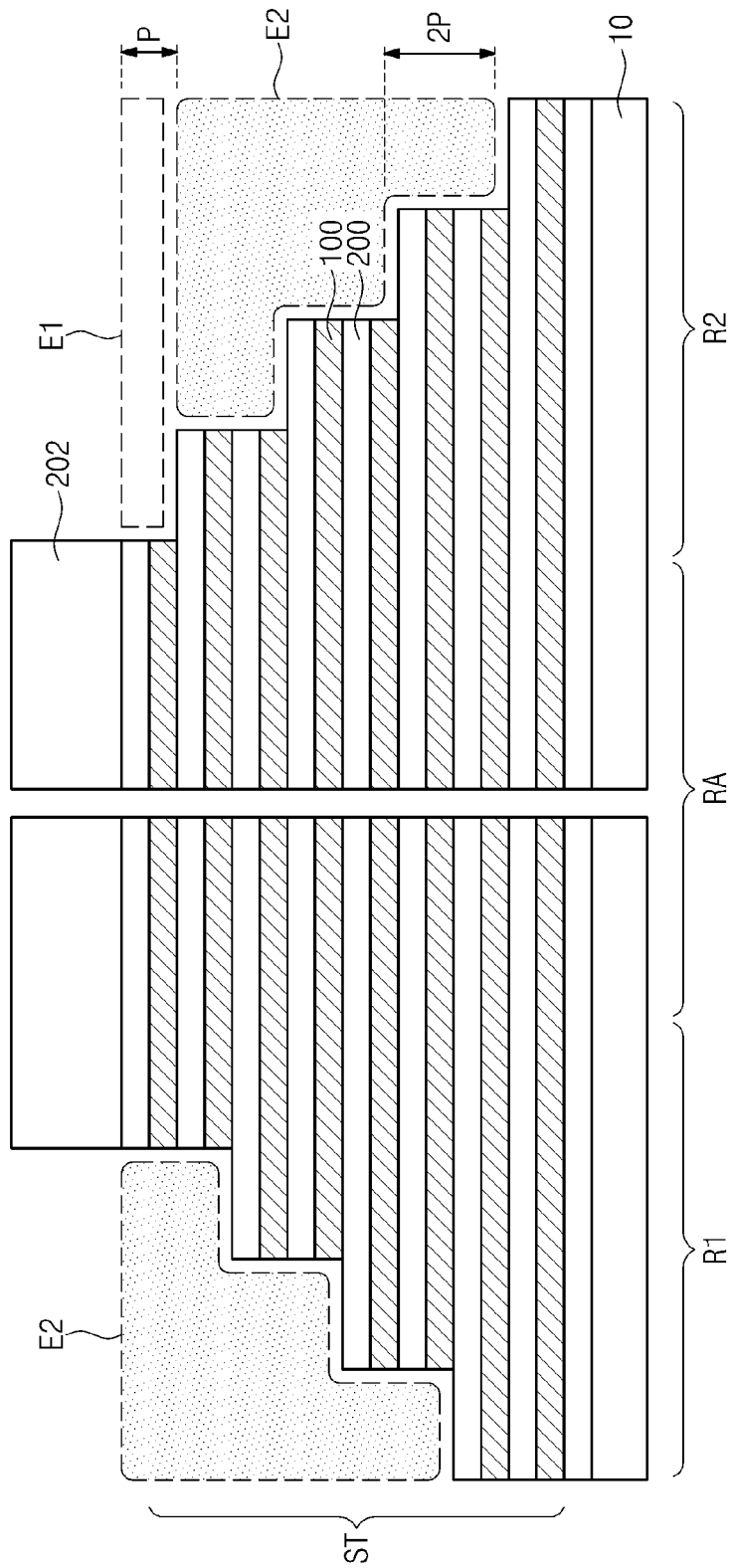

FIG. 9 is a flow chart illustrating a method of fabricating a semiconductor device according to the second example exemplified in FIG. 3, and FIGS. 10 and 11 are sectional views exemplarily illustrating a method of fabricating a semiconductor device according to the second example exemplified in FIG. 3.

Referring to FIGS. 3, 9 and 10, a first patterning process S21 may be performed on the stack ST described with reference to FIG. 6. In the present example, the first patterning process S21 may include an etching step performed in the selective singe-layer etching manner.

For example, the first patterning process S21 may include etching a portion of the stack ST positioned on the second region R2 to the vertical pitch P of the horizontal layer 100. The first patterning process S21 may be performed using the first etch mask 201, which may be formed to cover the first region R1 and expose the second region R2.

Since the first patterning process S21 is performed in the selective etching manner, the first etched portion E1 may be locally formed on the second region R2. Accordingly, two portions of the stack ST positioned on the first region R1 and the second region R2 may be formed to have a height difference corresponding to the vertical pitch P of the horizontal layer 100.

Referring to FIGS. 3, 9 and 11, a second patterning process S22 may be performed on the stack ST. According to the present example, the second patterning process S22 may include a plurality of etching steps, each of which may be performed in the common multi-layer etching manner previously described with reference to FIG. 6.

As a result, the stack ST and the first etched portion E1 may be formed to have stepwise structures on the first and second regions R1 and R2. However, the first region R1 of the stack ST may have a stepwise structure formed by the first patterning process S21 and delimited by the first etched portion E1, while the second region R2 of the stack ST may have other stepwise structure formed by the first and second patterning processes S21 and S22 and delimited by the first and second etched portions E1 and E2. Consequently, even-numbered horizontal layers 100 may be formed to have the connection portions CP on the first region R1 and the aligned portions AP on the second region R2, while odd-numbered horizontal layers 100 may be formed to have the connection portions CP on the second region R2 and the aligned portions AP on the first region R1.

Thereafter, the interconnection structure 300 may be formed on the structure described with reference to FIG. 11, and the resulting structure may have the same structural features as those of FIG. 8.

Figure 12:
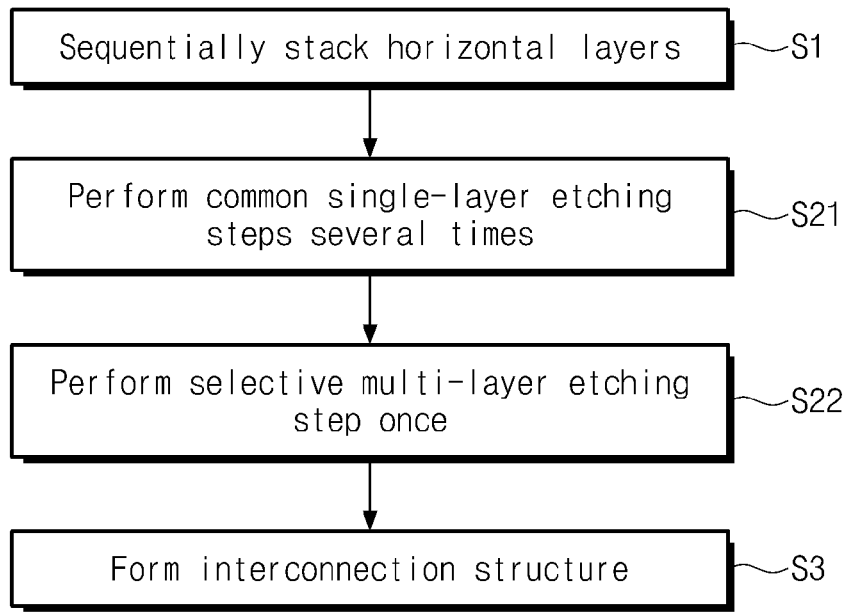
FIG. 12 is a flow chart illustrating a method of fabricating a semiconductor device according to the third example exemplified in FIG. 3.

FIG. 12 is a flow chart illustrating a method of fabricating a semiconductor device according to the third example exemplified in FIG. 3, and FIGS. 13 through 15 are sectional views exemplarily illustrating a method of fabricating a semiconductor device according to the third example exemplified in FIG. 3.

Figure 13:
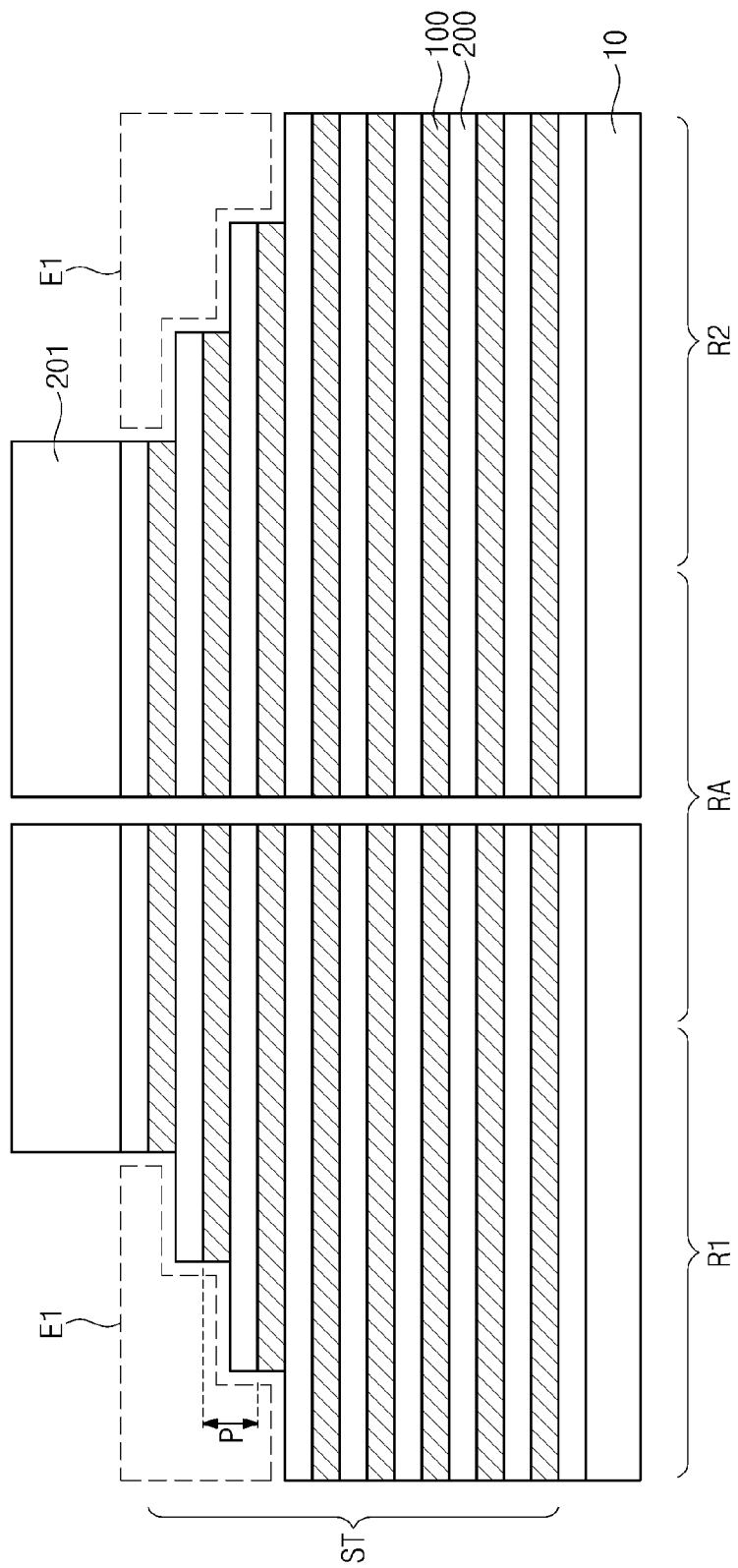
FIGS. 13 through 15 are sectional views exemplarily illustrating a method of fabricating a semiconductor device according to the third example exemplified in FIG. 3.

Referring to FIGS. 3, 12 and 13, a first patterning process S21 may be performed on the stack ST. According to the present example, the first patterning process S21 may include a plurality of etching steps, each of which may be performed in the common single-layer etching manner.

For example, the first patterning process S21 may include at least two etching steps, each of which is performed to etch portions of the stack ST positioned on the first and second regions R1 and R2 to the vertical pitch P of the horizontal layers 100. To realize the etching steps in the common etching manner, the etching steps may be performed using their respective etch mask exposing both the first and second regions R1 and R2.

Meanwhile, in the case where the first patterning process S21 includes a plurality of etching steps performed in the common etching manner, a single etch mask may be used in common for at least successive two of the etching steps. For example, a following one of the etching step may include a step of reducing or shrinking a horizontal size or width of a first etch mask 201 that has been used in a preceding one of the etching steps. The reduced first etch mask 201 may be re-used as an etch mask in the following etching step. The re-use of the etch mask may relieve technical difficulties caused by a misalignment in a subsequent process and reduce the number of expensive photolithography processes.

In the case where, like the present embodiment, the first patterning process S21 includes the step of shrinking an etch mask, the number of the etching step to be applied may be greater at outer portions of the stack ST than at inner portions thereof. Accordingly, a portion(s) of the stack ST to be etched during the first patterning process S21 (hereinafter, referred to as a first etched portion E1) may have an etch depth increasing with increasing distance from the array region RA. As a result, as shown in FIG. 13, the stack ST and the first etched portion E1 may be formed to have stepwise structures on the first and second regions R1 and R2.

As described above, since the first patterning process S21 is performed in the common etching manner, two portions or the first etched portions E1 of the stack ST positioned on the first region R1 and the second region R2 may be formed to have mirror symmetry with respect to each other.

Figure 14:
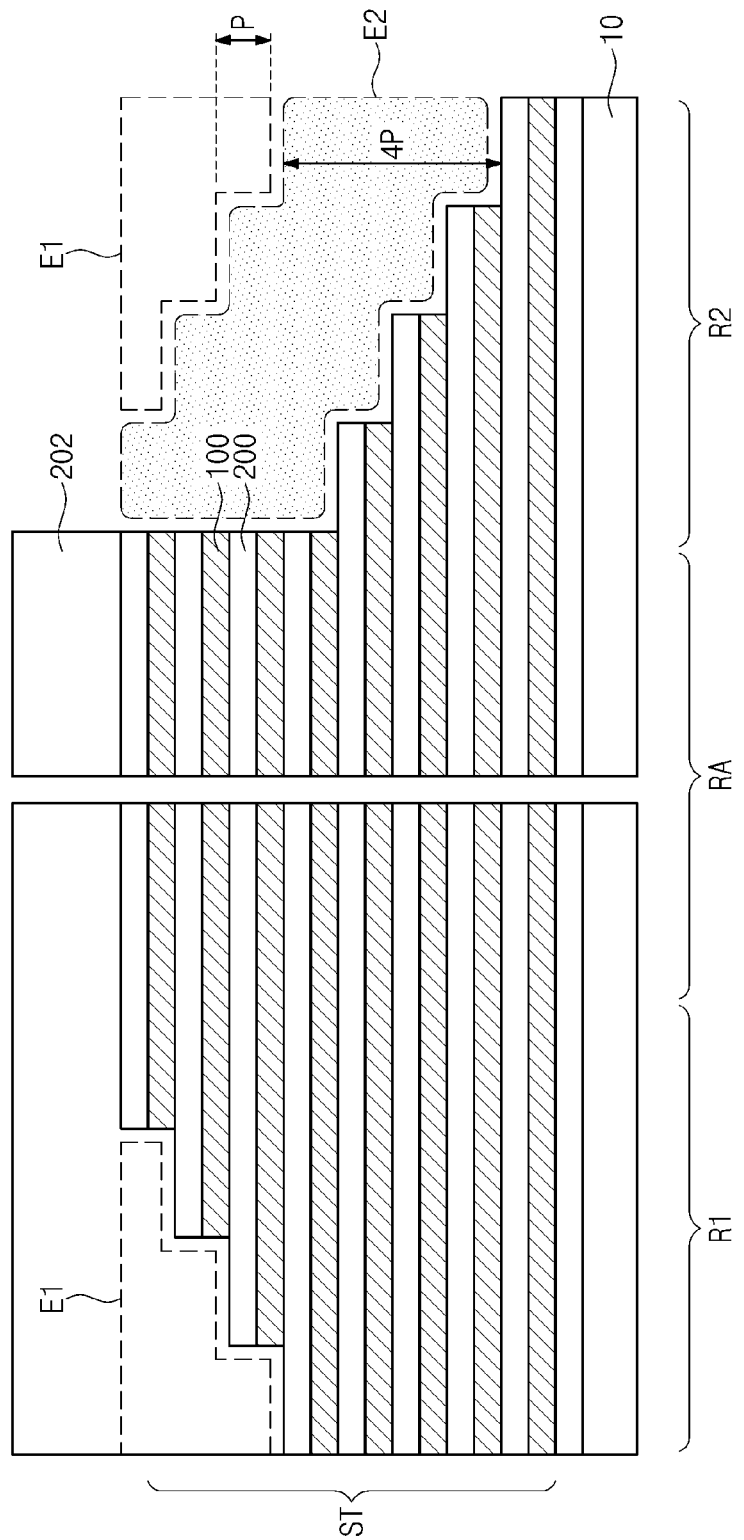

Referring to FIGS. 3, 12 and 14, a second patterning process S22 may be performed on the stack ST. According to the present example, the second patterning process S22 may include an etching step performed in the selective multi-layer etching manner.

For example, the second patterning process S22 may include a step of etching a portion of the stack ST positioned on the second region R2 to an etch depth corresponding to multiples of the vertical pitch P of the horizontal layer 100. In certain embodiments, the etch depth may be half a height of the stack ST or half the total stacking height of the horizontal layers 100. The second patterning process S22 may be performed using a second etch mask 202, which may be formed to cover the first region R1 and expose the second region R2. The second etch mask 202 may be formed to expose the first etched portion E1 on the second region R2 and a neighboring region thereof, as shown in FIG. 14.

Since the second patterning process S22 is performed in the selective etching manner, the second etched portion E2 may be locally formed on, for example, only the second region R2. Accordingly, two portions of the stack ST positioned on the first region R1 and the second region R2 may no longer have the mirror symmetry with respect to each other.

Figure 15:
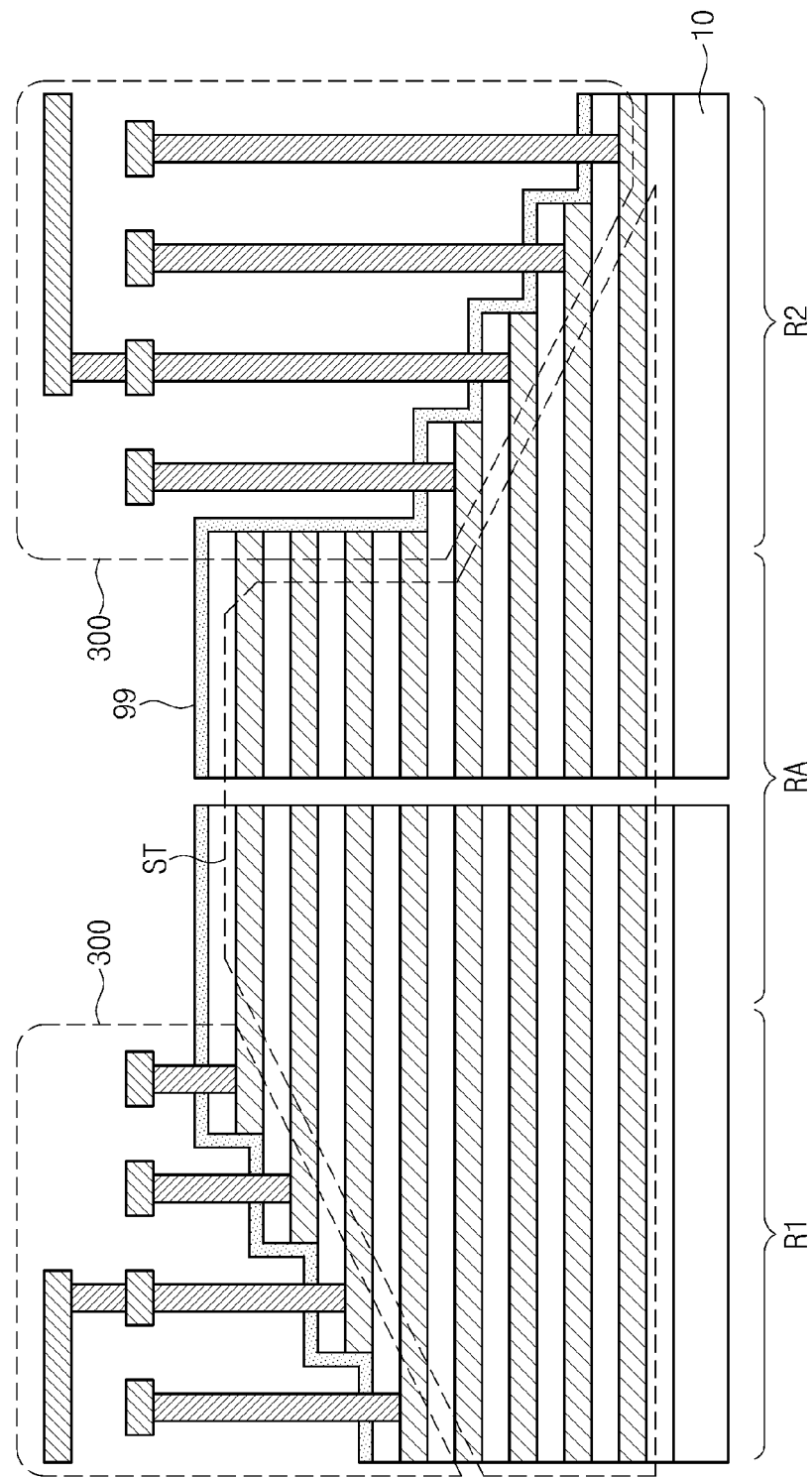

Referring to FIGS. 3, 12 and 15, an interconnection structure 300 may be formed on the structure, to which the second patterning process S22 has performed (in S3). Except for a difference related to lengths of the plugs 301, the interconnection structure 300 may be formed to have the same technical features as those of the examples described with reference to FIG. 8.

Figure 16:
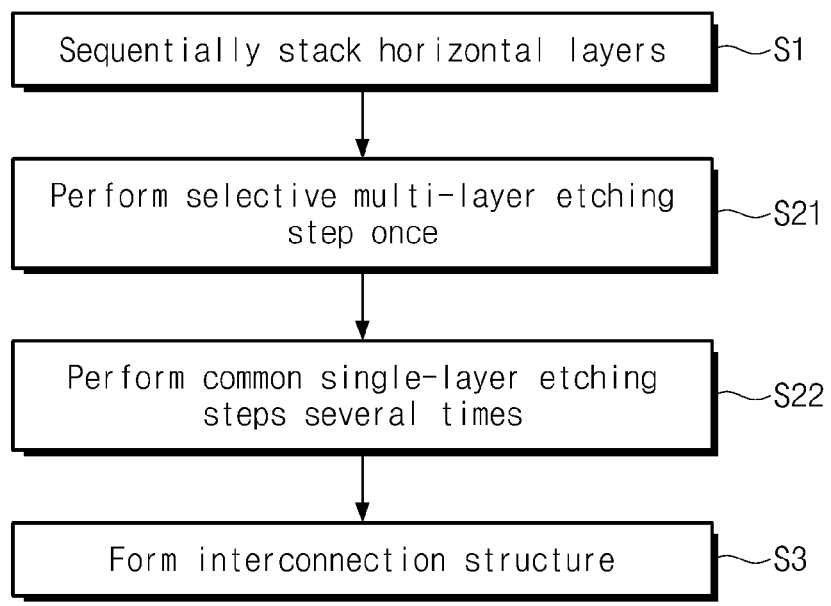
FIG. 16 is a flow chart illustrating a method of fabricating a semiconductor device according to the fourth example exemplified in FIG. 3.
Figure 17:
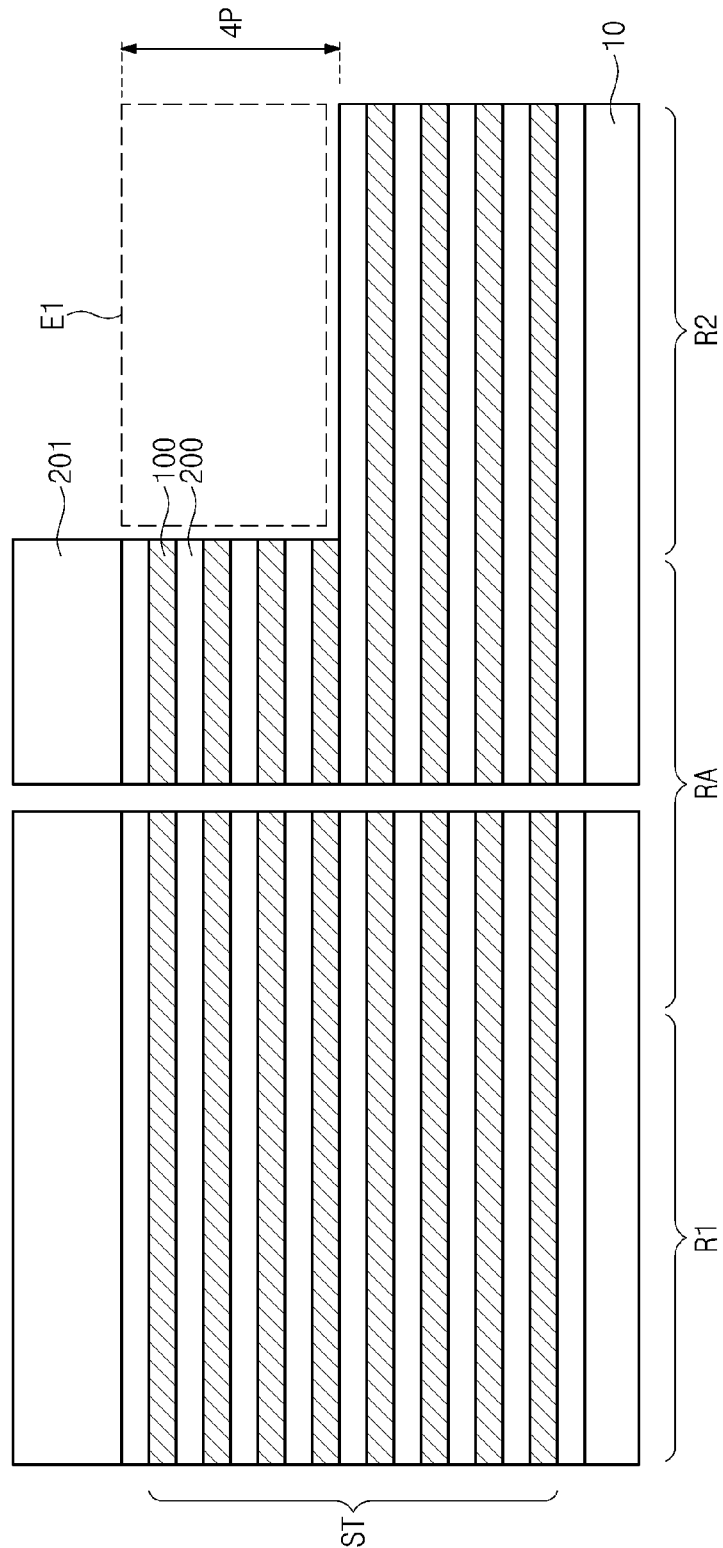

FIG. 16 is a flow chart illustrating a method of fabricating a semiconductor device according to the fourth example exemplified in FIG. 3, and FIGS. 17 and 18 are sectional views exemplarily illustrating a method of fabricating a semiconductor device according to the fourth example exemplified in FIG. 3.

Referring to FIGS. 3, 16 and 17, a first patterning process S21 may be performed on the stack ST described with reference to FIG. 6. In the present example, the first patterning process S21 may include an etching step performed in the selective multi-layer etching manner.

For example, the first patterning process S21 may include a step of etching a portion of the stack ST positioned on the second region R2 to an etch depth corresponding to multiples of the vertical pitch P of the horizontal layer 100. In certain embodiments, the etch depth may be half a height of the stack ST or half the total stacking height of the horizontal layers 100. The first patterning process S21 may be performed using the first etch mask 201, which may be formed to cover the first region R1 and expose the second region R2, as shown in FIG. 17.

Since the first patterning process S21 is performed in the selective etching manner, the first etched portion E1 may be locally formed on the second region R2. Accordingly, two portions of the stack ST positioned on the first region R1 and the second region R2 may be formed to have a height difference corresponding to multiples of the vertical pitch P of the horizontal layer 100 or half the height of the stack ST.

Referring to FIGS. 3, 16 and 18, a second patterning process S22 may be performed on the stack ST. According to the present example, the second patterning process S22 may include a plurality of etching steps, each of which may be performed in the common single-layer etching manner previously described with reference to FIG. 13.

As a result, the stack ST and the first etched portion E1 may be formed to have stepwise structures on the first and second regions R1 and R2. However, the first region R1 of the stack ST may have a stepwise structure formed by the second patterning process S22 and delimited by the second etched portion E2, while the second region R2 of the stack ST may have other stepwise structure formed by the first and second patterning processes S21 and S22 and delimited by the first and second etched portions E1 and E2. Consequently, an upper half of the horizontal layers 100 may be formed to have the connection portions CP on the first region R1 and the aligned portions AP on the second region R2, while a lower half of the horizontal layers 100 may be formed to have the connection portions CP on the second region R2 and the aligned portions AP on the first region R1.

Thereafter, the interconnection structure 300 may be formed on the structure described with reference to FIG. 18, and the resulting structure may have the same structural features as those of FIG. 15.

FIG. 19 is a table illustrating methods of fabricating a semiconductor device according to other exemplary embodiments.

According to other exemplary embodiments, the formation of the connection structure (in S2) may include first, second, and third patterning processes S21, S22, and S23. One of the first to third patterning processes S21, S22, and S23 may include at least one etching step performed in the common single-layer etching manner (hereinafter, referred to as a "common single-layer etching step" or a "common single-layer etching"), another may include at least one etching step performed in the selective multi-layer etching manner (hereinafter, referred to as a "selective multi-layer etching step" or a "selective multi-layer etching"), and the other may include at least one etching step performed in the common multi-layer etching manner (hereinafter, referred to as a "common multi-layer etching step" or a "common multi-layer etching"). The common single-layer etching step, the selective multi-layer etching step, and the common multi-layer etching step may be variously combined to form the stepwise connection structures. For example, the simplest example of such combinations may be realized by one of fifth to tenth examples enumerated in FIG. 19.

Figure 20:
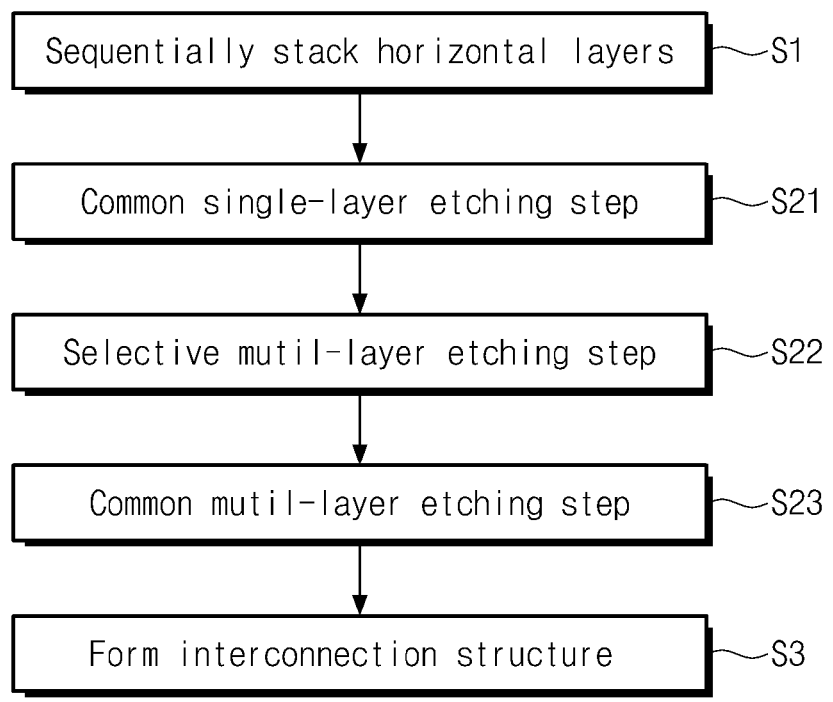
FIG. 20 is a flow chart illustrating a method of fabricating a semiconductor device according to the fifth example exemplified in FIG. 19.

In order to reduce overlapping and complexity in the description, the fifth example of FIG. 19 will be exemplarily described with reference to FIGS. 20 through 29. FIG. 20 is a flow chart illustrating a method of fabricating a semiconductor device according to the fifth example exemplified in FIG. 19, and FIGS. 21 through 24 are sectional views exemplarily illustrating a method of fabricating a semiconductor device according to the fifth example exemplified in FIG. 19.

Figure 21:
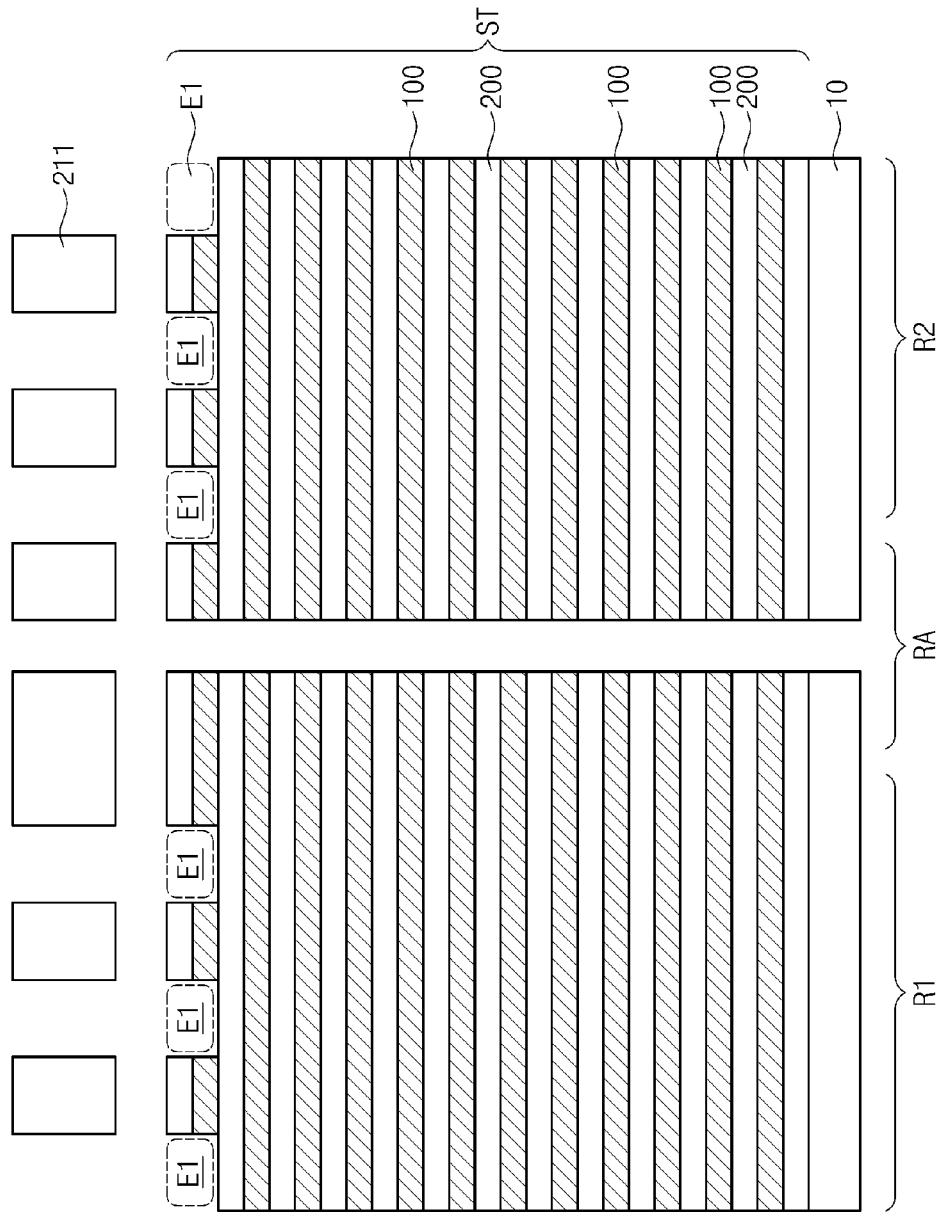
FIGS. 21 through 24 are sectional views exemplarily illustrating a method of fabricating a semiconductor device according to the fifth example exemplified in FIG. 19.

Referring to FIGS. 20 and 21, the horizontal layers 100 and the interlayered insulating layers 200 may be alternatingly stacked on the substrate 10 to form a stack ST (in S1), and a common single-layer etching S21 may be performed to the stack ST. The common single-layer etching S21 may be performed to form first etched portions E1 spaced apart from each other. The common single-layer etching S21 may be performed using a first mask 211, which may be formed to expose both of the first and second regions R1 and R2. Accordingly, the first etched portions E1 may be formed in common on the first and second regions R1 and R2, and etch depths thereof may be equivalent to the vertical pitch of the horizontal layer 100.

Figure 22:
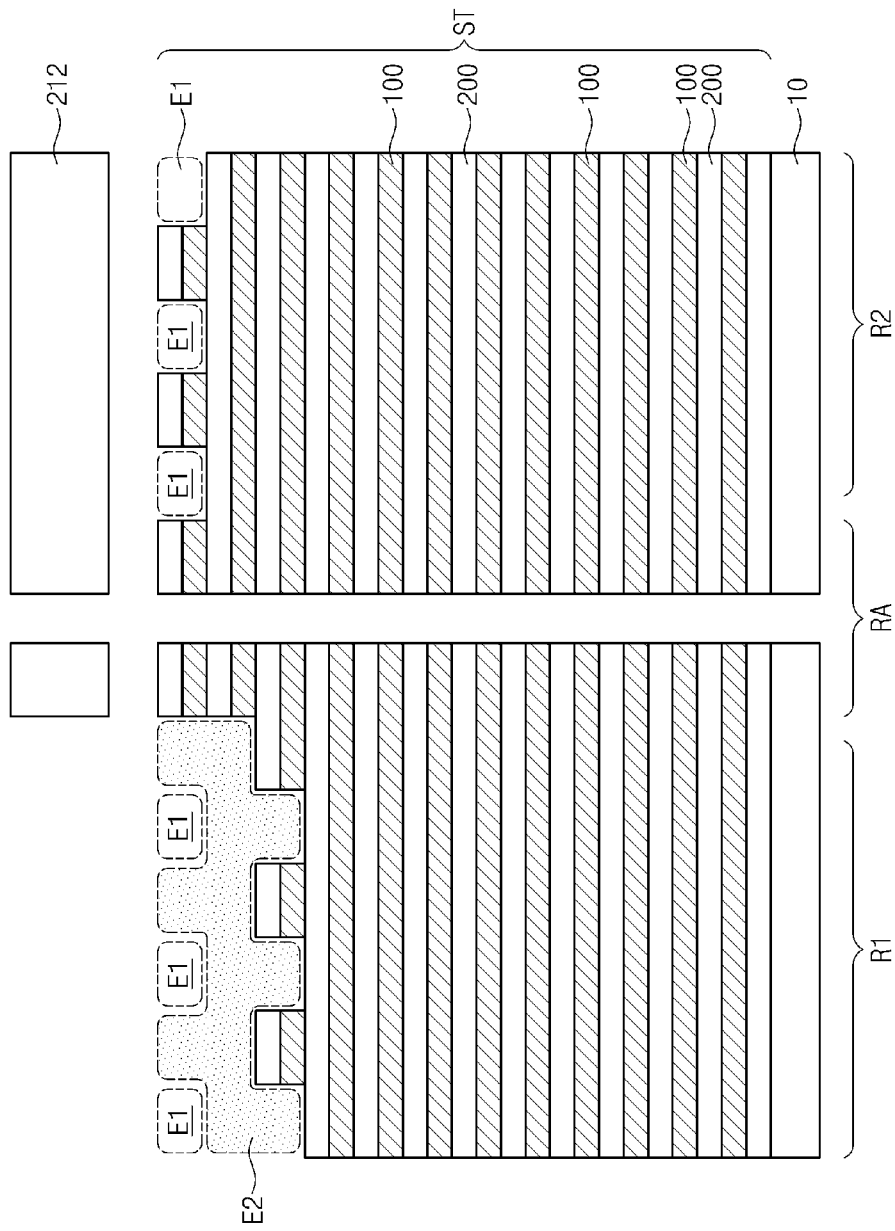

Referring to FIGS. 20 and 22, a selective multi-layer etching S22 may be performed on the stack ST provided with the first etched portions E1. The selective multi-layer etching S22 may be performed using a second mask 212 exposing a portion of the first region R1 and covering the second region R2 and the array region RA as an etch mask. For example, the selective multi-layer etching S22 may include etching some of the horizontal layers 100 on the first region R1. Accordingly, a second etched portion E2 may be locally formed in the stack ST positioned on the first region R1. The second etched portion E2 may be formed to have an etch depth corresponding to twice the vertical pitch P of the horizontal layer 100. As the result of the selective multi-layer etching S22, the first and second regions R1 and R2 may have different structures from each other. For example, two portions of the stack ST positioned on the first region R1 and the second region R2 may no longer have the mirror symmetry with respect to each other.

Figure 23:
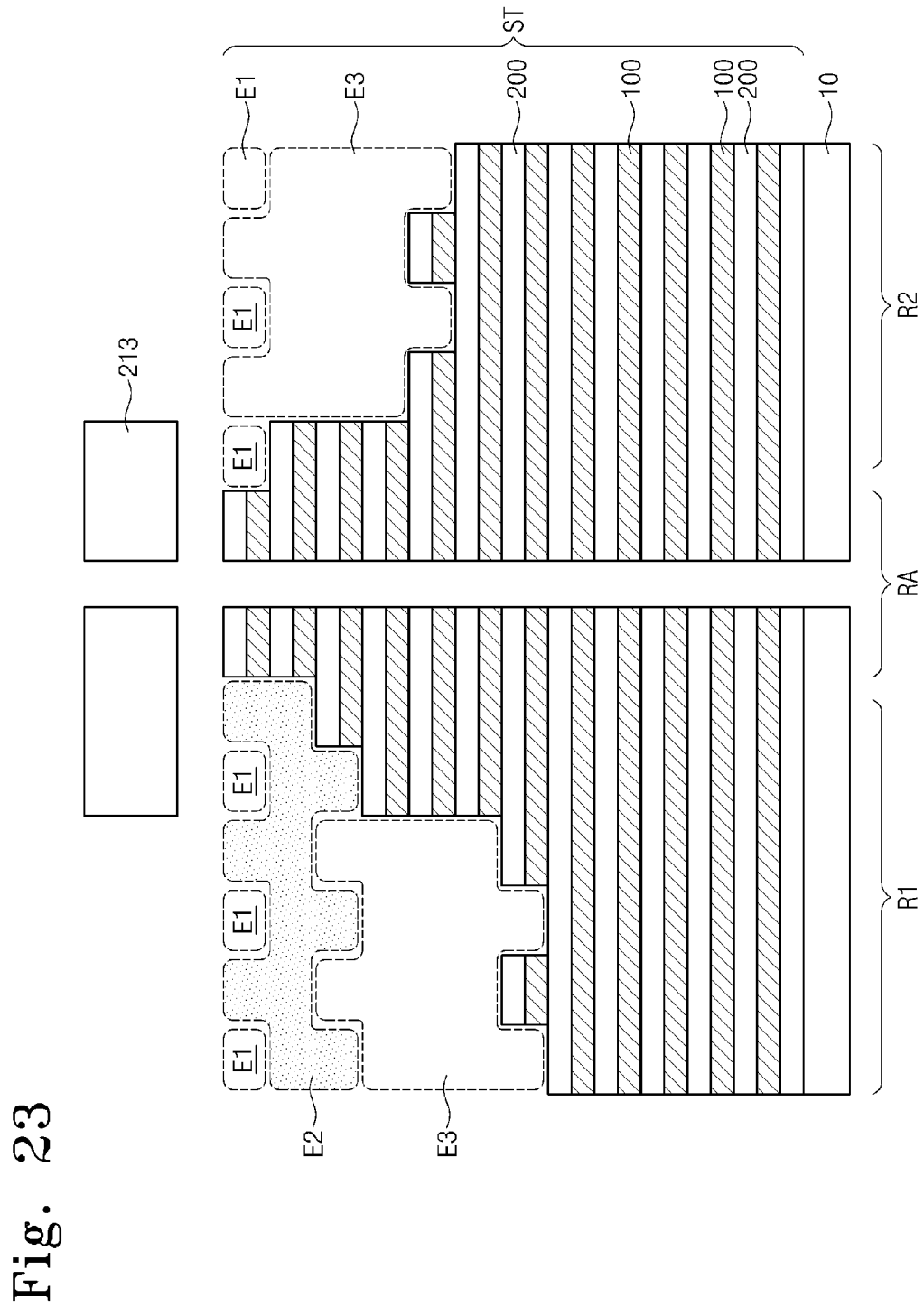
Figure 24:
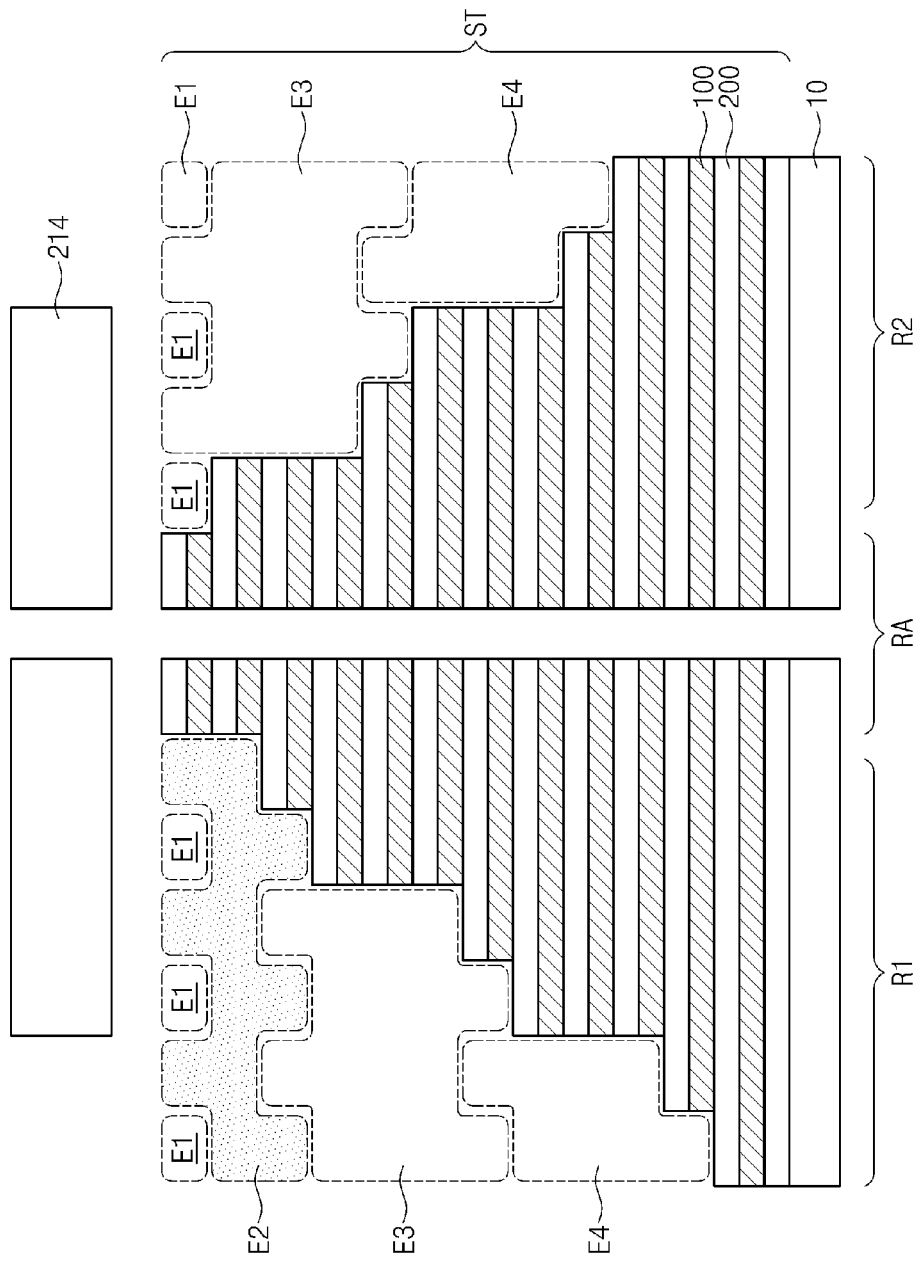

Referring to FIGS. 20, 23 and 24, a common multi-layer etching S23 may be performed on the stack ST provided with the second etched portion E2. The common multi-layer etching steps may include first and second common multi-layer etching steps, respectively. The first and second common multi-layer etching steps may be performed using a third mask 213 and a fourth mask 214, respectively, as an etch mask. The third and fourth masks 213 and 214 may be formed to expose portions of the first and second regions R1 and R2 and cover the array region RA. According to the present example, the fourth mask 214 may be formed to have a width greater than that of the third mask 213 or fully cover a region covered with the third mask 213.

As the result of the first and second common multi-layer etching steps, third and fourth etched portions E3 and E4 may be formed on each of the first and second regions R1 and R2. Each of the third and fourth etched portions E3 and E4 may be formed to have an etch depth corresponding to four times the vertical pitch P of the horizontal layer 100.

In sum, the first to fourth etched portions E1, E2, E3, and E4 may be formed on the first region R1, while the first, third and fourth etched portions E1, E3, and E4 may be formed on the second region R2. Here, the first, third and fourth etched portions E1, E3, and E4 may differ from each other in terms of horizontal position or region thereof. Due to the difference between the horizontal positions of the first, third and fourth etched portions E1, E3, and E4, the stack ST may be formed to have stepwise structures, in which each step height is multiples of the vertical pitch P of the horizontal layer 100. In the case of the absence of the second etched portion E2, two portions of the stack ST on the first and second regions R1 and R2 may have mirror symmetry with respect to each other. However, the mirror symmetric profile of the stack ST may be broken by the presence of the second etched portion E2 formed on the first region R1. For example, some of the horizontal layers 100 may be exposed on the first region R1, and the others may be exposed on the second region R2.

Figure 25:
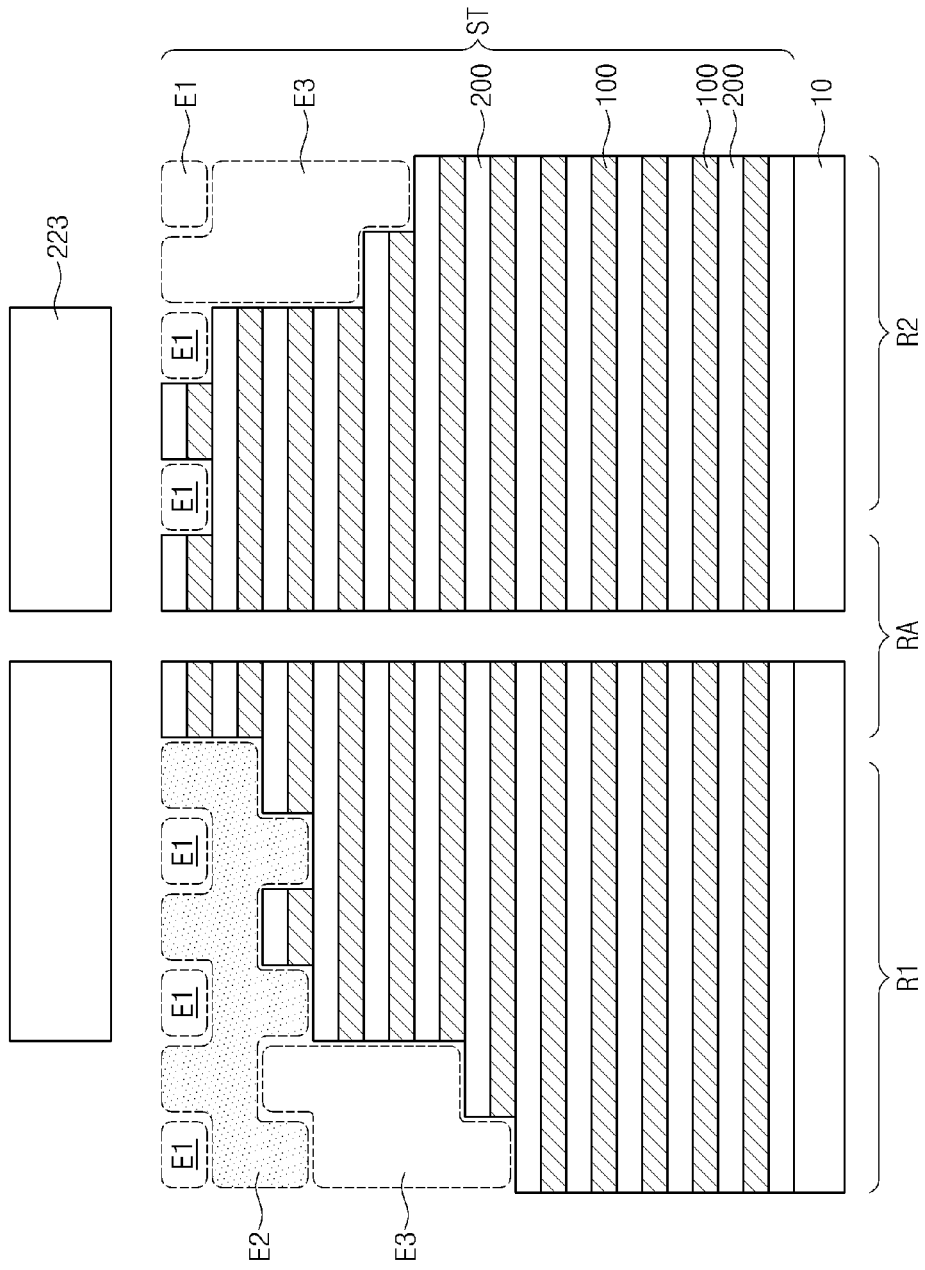
FIGS. 25 and 26 are sectional views exemplarily illustrating a method of fabricating a semiconductor device according to one of modifications of the fifth example exemplified in FIG. 19.
Figure 26:
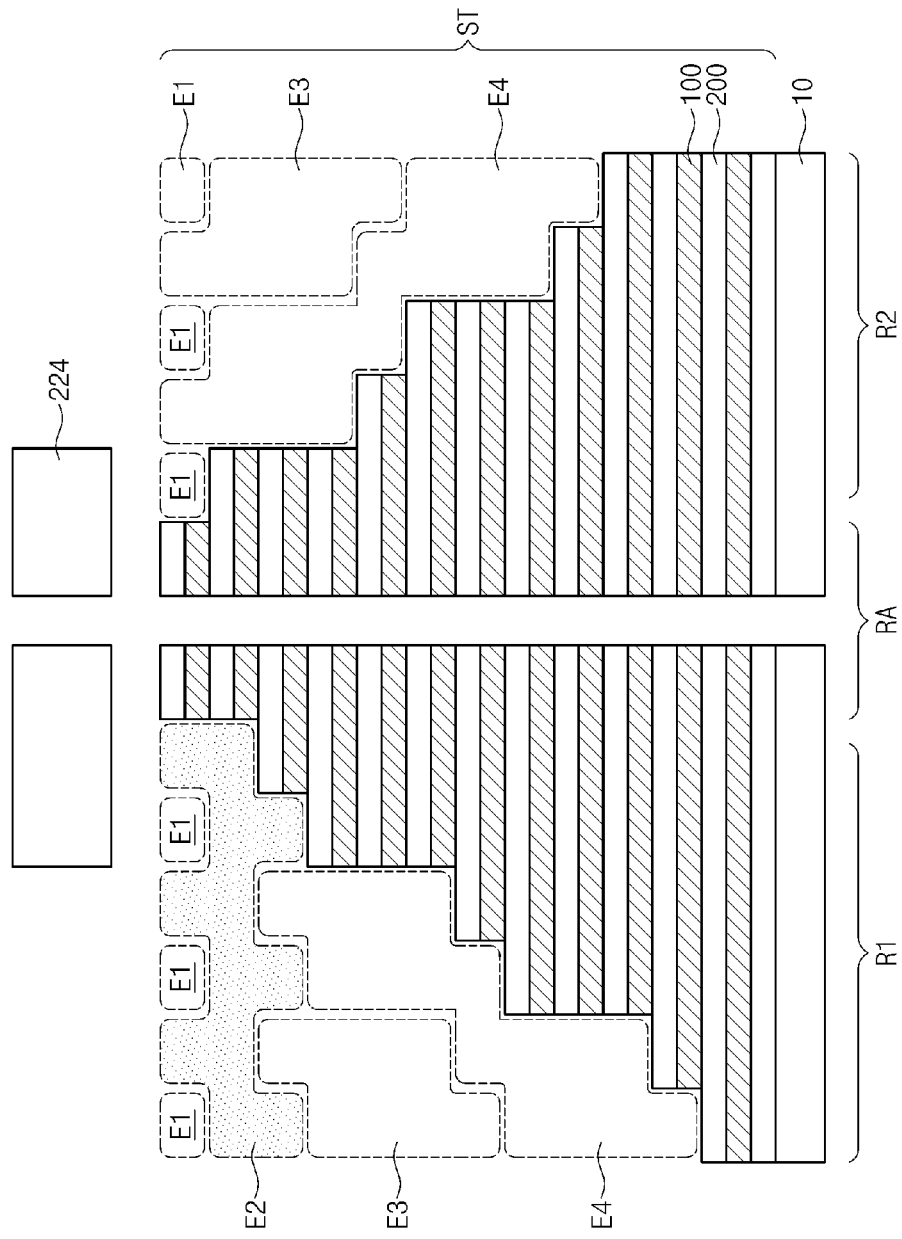

FIGS. 25 and 26 are sectional views exemplarily illustrating a method of fabricating a semiconductor device according to one of modifications of the fifth example exemplified in FIG. 19.

As shown in FIGS. 25 and 26, the common multi-layer etching steps may include first and second common multi-layer etching steps performed using a third mask 223 and a fourth mask 224, respectively, as an etch mask. According to the present example, the third mask 223 may be formed to have a width greater than that of the fourth mask 224 or fully cover a region covered with the fourth mask 224. For example, the fourth mask 224 may be a resulting structure obtained from the above described above described mask shrinking step on the third mask 223. In this case, the fourth etched portion E4 may include an etched portion interposed between the third etched portion E3 and sidewalls of the stack ST.

In other words, in the case where the common multi-layer etching step includes a plurality of etching steps to be performed in the common etching manner, a single etch mask may be used in common for at least successive two of the etching steps. For example, a following one of the etching steps may include a step of reducing or shrinking a horizontal size or width of the third mask 223 that has been used in a preceding one of the etching steps. The reduced third mask 203 may be re-used as the fourth mask 224 in the following etching step. The re-use of the etch mask may relieve technical difficulties caused by a misalignment in a subsequent process and reduce the number of expensive photolithography processes.

Figure 27:
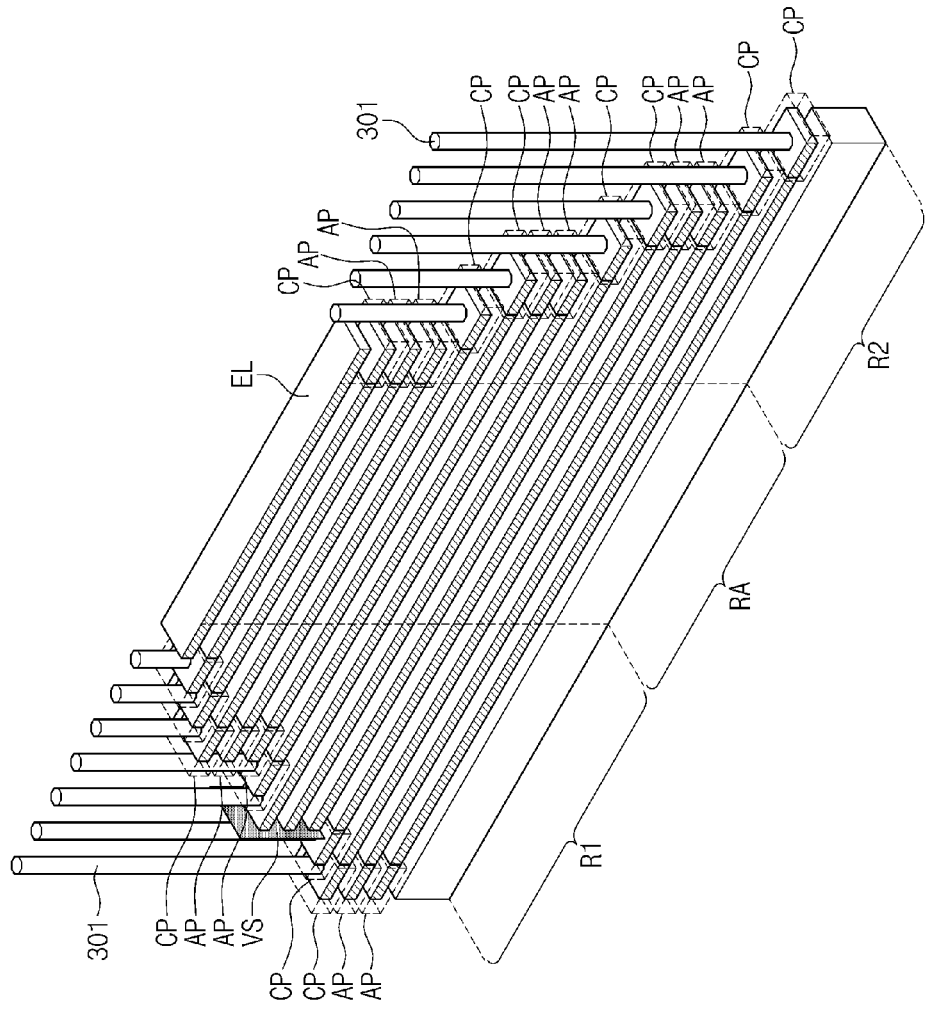
FIG. 27 is a perspective view exemplarily illustrating a portion of a semiconductor device according to other exemplary embodiments.

FIG. 27 is a perspective view exemplarily illustrating a portion of a semiconductor device according to other exemplary embodiments.

According to other exemplary embodiments and their modifications of the inventive concept, as shown in FIG. 27, each of (4n+1)-th and (4n+2)-th ones of the electrodes EL may be formed to have the aligned and connection portions AP and CP on the first and second regions R1 and R2, respectively, and each of (4n+3)-th and (4n+4)-th ones of the electrodes EL may be formed to have the connection and aligned portions CP and AP on the first and second regions R1 and R2, respectively, where n is zero or natural numbers capable of satisfying a condition that (4n+4) should be less than the total stacking number of the horizontal layers.

Figure 28:
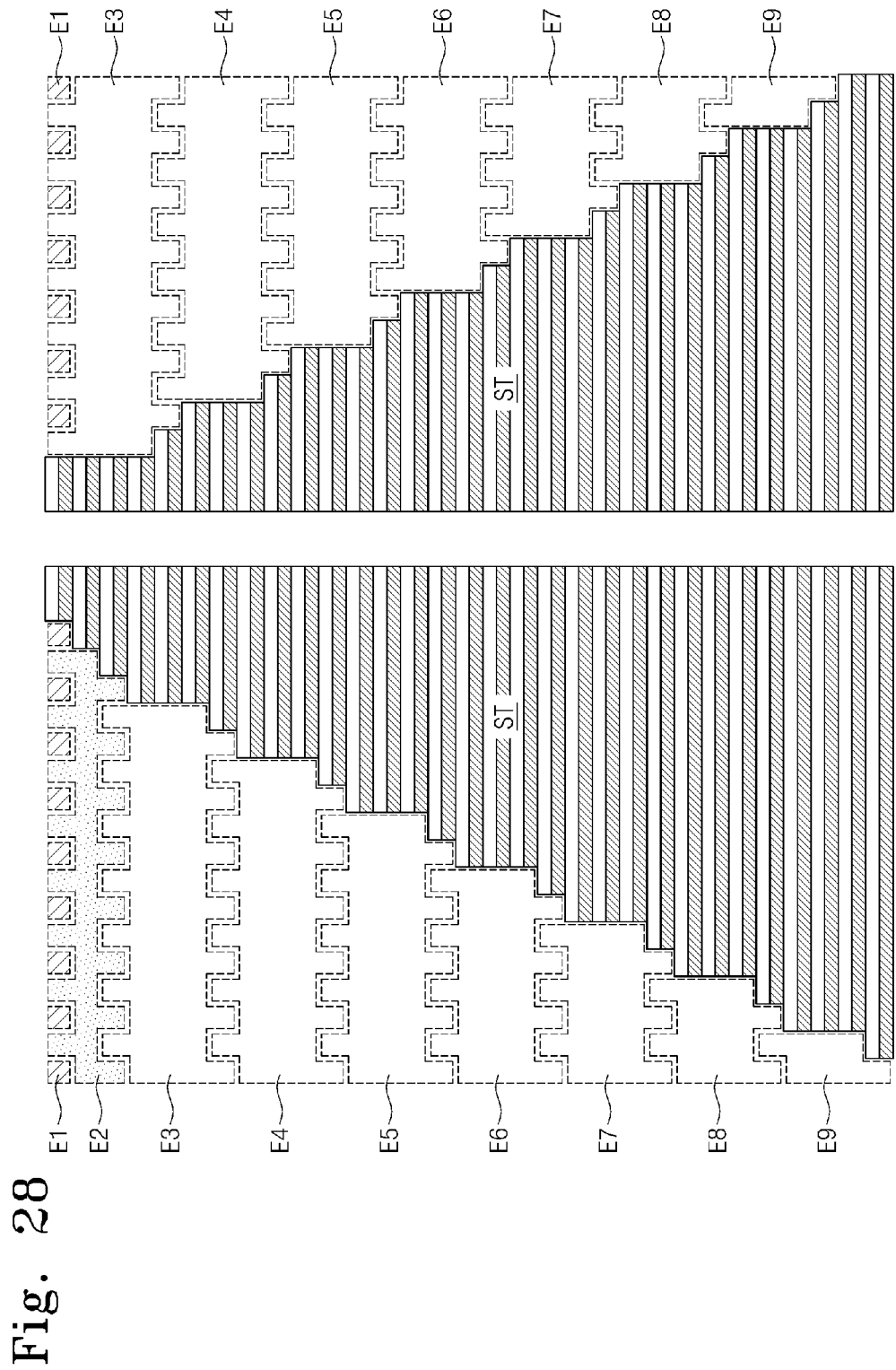
FIGS. 28 and 29 are schematic diagrams illustrating methods of fabricating a semiconductor device according to other exemplary embodiments.
Figure 29:
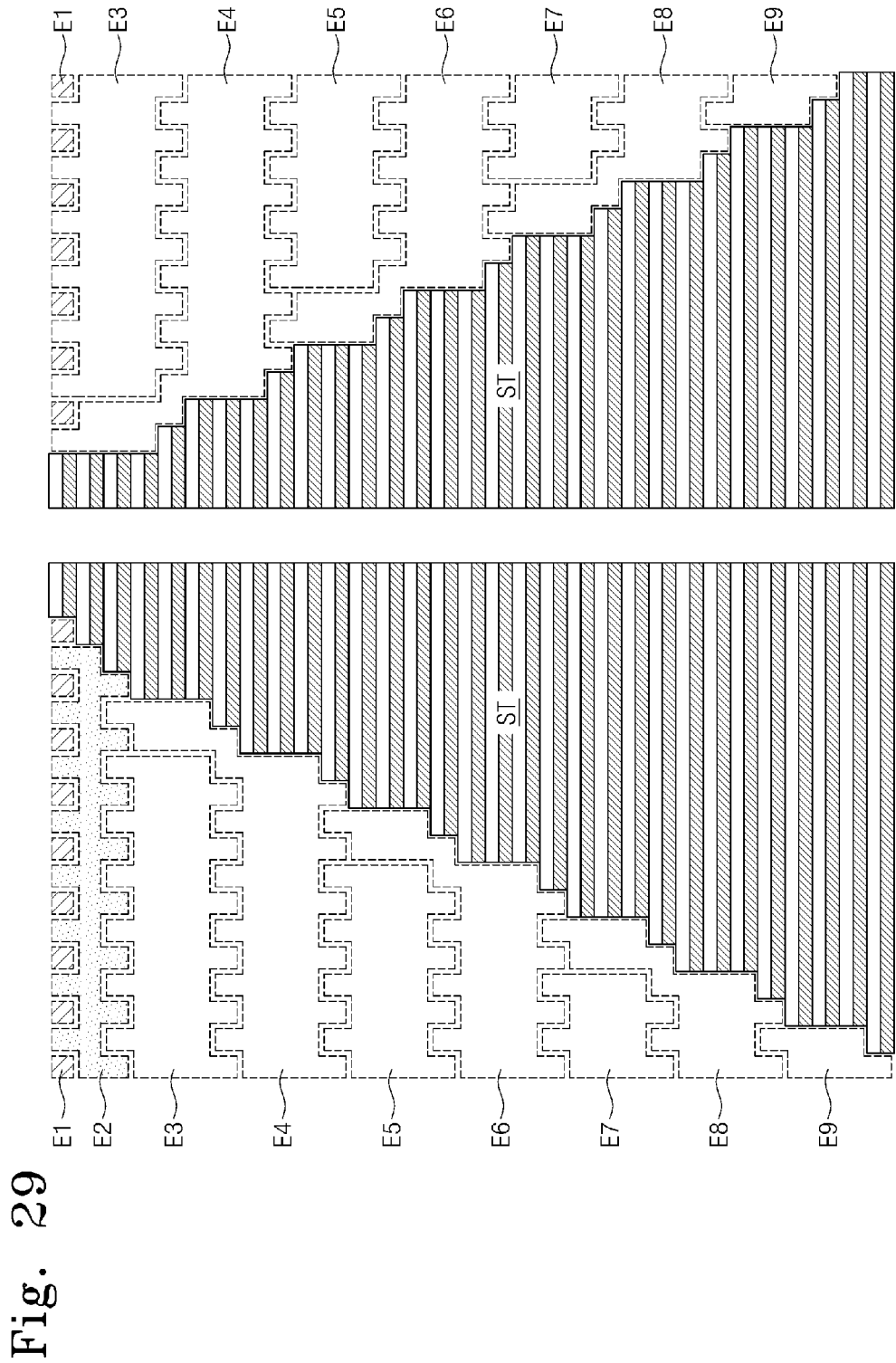

FIGS. 28 and 29 are schematic diagrams illustrating methods of fabricating a semiconductor device according to other exemplary embodiments.

Referring to FIGS. 28 and 29, the formation of the connection structure may include performing the common single-layer etching S21 once to form the first etched portions E1, performing the selective multi-layer etching S22 once to form the second etched portion E2, and then, performing the common multi-layer etching S23 seven times to form third to ninth etched portions E3, E4, E5, E6, E7, E8, and E9.

The common multi-layer etching S23 may be performed using different etch masks from each other. For example, each of the common multi-layer etching S23 may be performed using an etch mask, whose width is greater than that used in the previous step. In this case, as shown in FIG. 28, each of the third to ninth etched portions E3-E9 may be formed below a previously etched portion, and a horizontal position thereof may be farther and farther apart from a center of the stack ST as the common multi-layer etching S23 progress. In modified embodiments, at least one of the common multi-layer etching S23 may be performed using an etch mask, whose width is smaller than that used in the previous step. In this case, as shown in FIG. 29, some (e.g., E4, E6, and E8) of the third to ninth etched portions E3-E9 may be formed adjacent to the center of the stack ST, compared with the previously etched portions (e.g., E3, E5, and E7).

Figure 30:
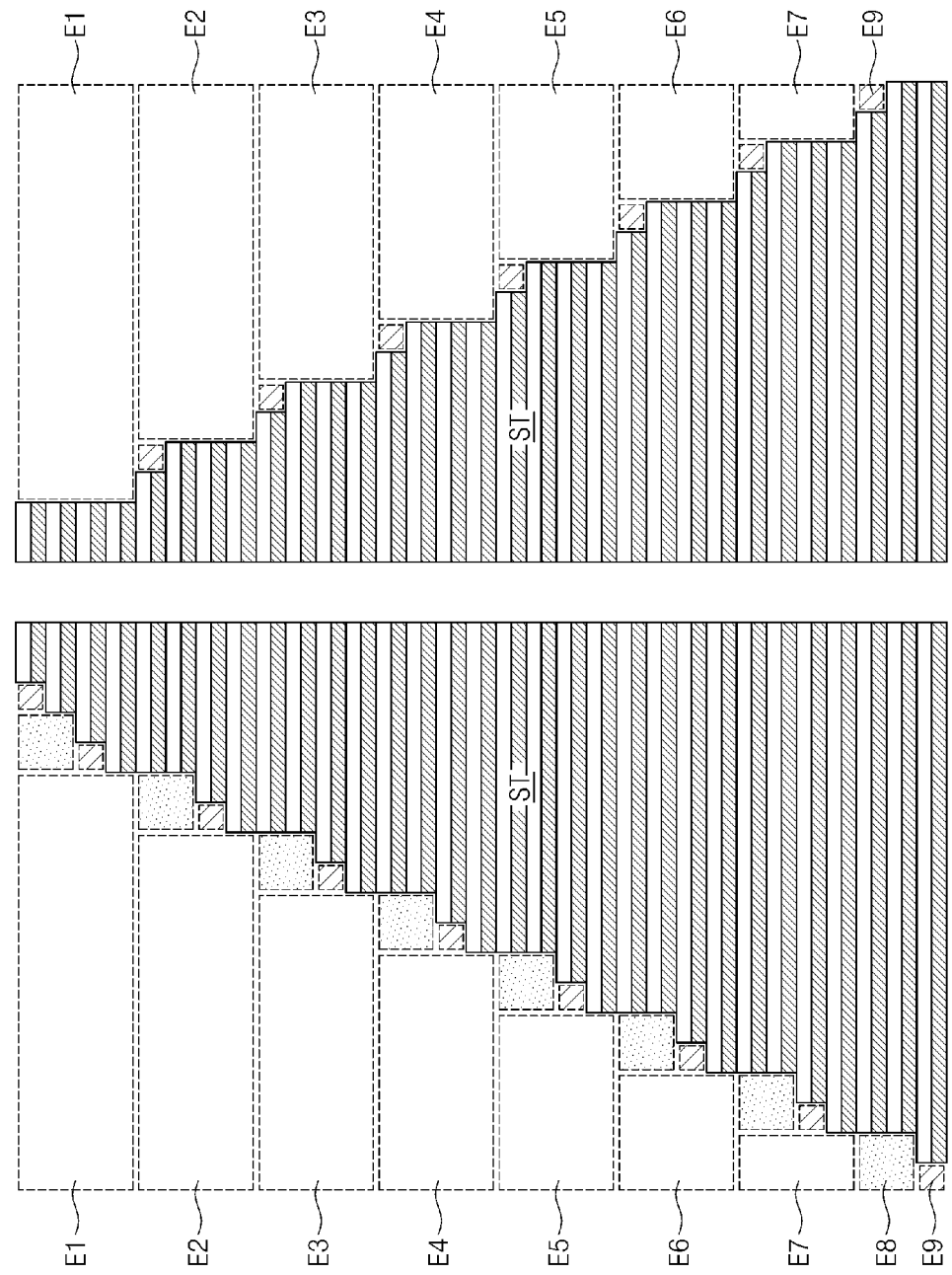
FIG. 30 is a schematic diagram exemplarily illustrating a method of fabricating a semiconductor device according to the tenth example exemplified in FIG. 19.

FIG. 30 is a schematic diagram exemplarily illustrating a method of fabricating a semiconductor device according to the tenth example exemplified in FIG. 19. In the tenth example of FIG. 19, the formation of the connection structure may include performing the common multi-layer etching S23 seven times to form the first to seventh etched portions E1, E2, E3, E4, E5, E6, and E7, performing the common single-layer etching S21 once to form the eighth etched portion E8, and then, performing the selective multi-layer etching S22 once to form the ninth etched portion E9. In other words, the common multi-layer etching S23 may be performed before the common single-layer etching step S21 and the selective multi-layer etching S22.

According to the exemplary embodiments described with reference to FIGS. 28 through 30, the stack ST may be formed to have the same stepwise structure, despite the difference in order of performing the etching steps. This means that the order of performing the etching steps can be variously adjusted depending on developer's need. In this sense, exemplary embodiments may not be limited to the examples already described or to be described below, and can be variously modified based on the above described embodiments.

Figure 31:
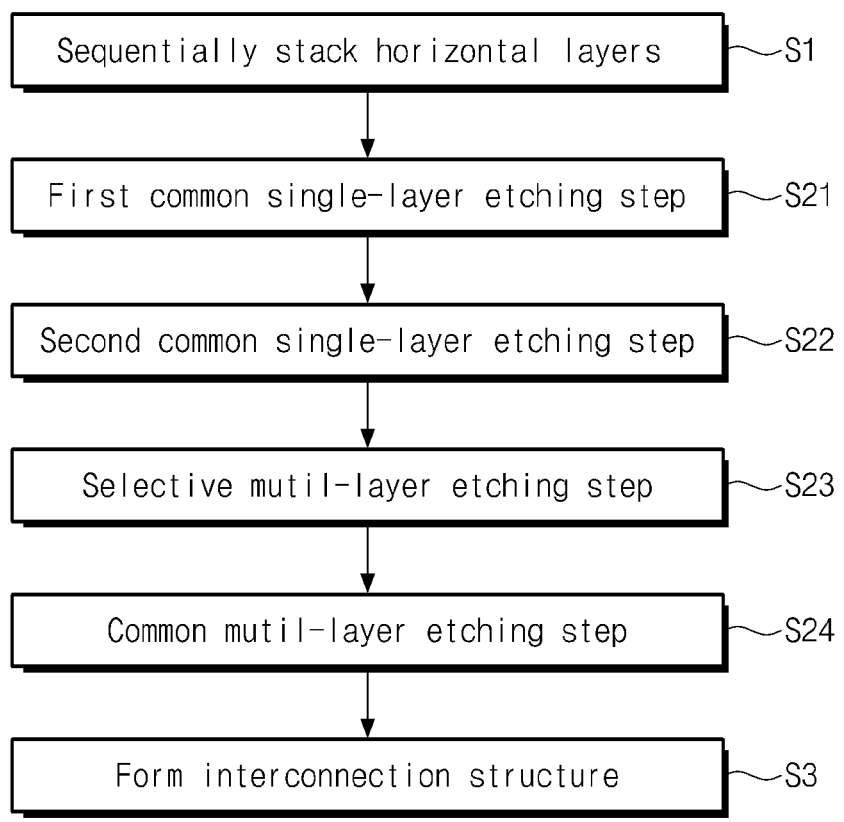
FIG. 31 is a flow chart illustrating methods of fabricating a semiconductor device according to still other exemplary embodiments.
Figure 32:
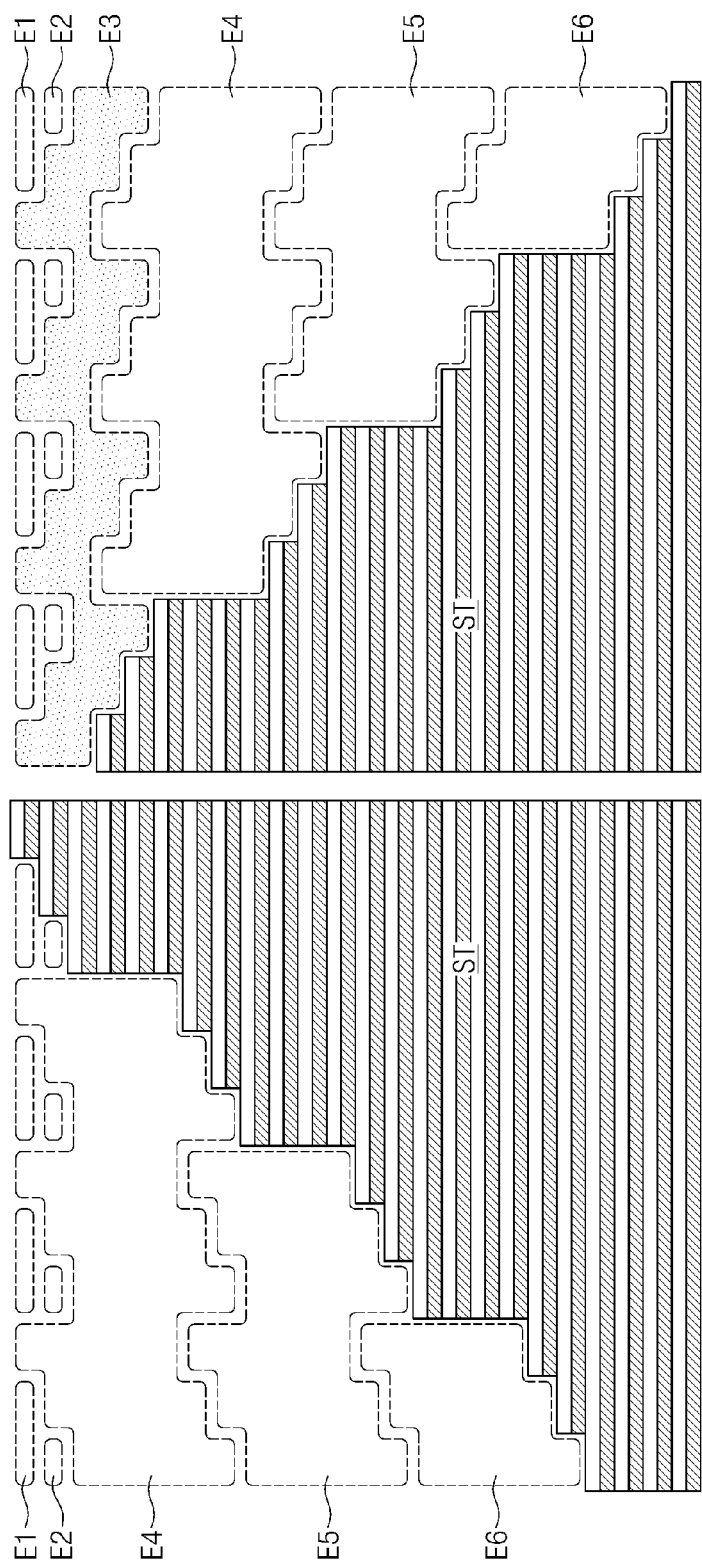
FIG. 32 is a schematic diagram illustrating methods of fabricating a semiconductor device according to still other exemplary embodiments.

FIG. 31 is a flow chart illustrating methods of fabricating a semiconductor device according to still other exemplary embodiments, and FIG. 32 is a schematic diagram illustrating methods of fabricating a semiconductor device according to still other exemplary embodiments.

Referring to FIGS. 31 and 32, the formation of the stepwise connection structure in the present embodiment may include stacking the horizontal layers 100 to form the stack ST (in S1), sequentially performing a first common single-layer etching (in S21), a second common single-layer etching step (in S22), a selective multi-layer etching (in S23), and a common multi-layer etching (in S24) to the stack ST, and then, forming the interconnection structure 300 on the resulting structure (in S3).

The first common single-layer etching S21 may be performed to form first etched portions E1 spaced apart from each other. The first etched portions E1 may be formed on both of the first and second regions R1 and R2, and furthermore, may be formed to have an alternating arrangement on each of the first and second regions R1 and R2. For example, the first etched portions E1 may be formed to have a pitch of 3W and a width of 2W. The first etched portions E1 may have an etch depth corresponding to the vertical pitch of the horizontal layer 100.

The second common single-layer etching S22 may be performed to form second etched portions E2 spaced apart from each other. the second etched portions E2 may be formed on both of the first and second regions R1 and R2, and furthermore, may be formed to have an alternating arrangement on each of the first and second regions R1 and R2, similar to the first etched portions E1. The second etched portions E2 may be formed to have a pitch of 3W and a width of 1W. The second etched portions E2 may have an etch depth corresponding to the vertical pitch of the horizontal layer 100.

The selective multi-layer etching S23 may be performed to form third etched portions R3 locally on the second region R2. Similar to the embodiment described with reference to FIG. 22, the third etched portions R3 may be formed to have an etch depth corresponding to twice the vertical pitch of the horizontal layer 100. As the result of the selective multi-layer etching S23, the first and second regions R1 and R2 may have different structures from each other. For example, two portions of the stack ST positioned on the first region R1 and the second region R2 may no longer have the mirror symmetry with respect to each other.

The common multi-layer etching S24 may be performed to pattern portions of the stack ST located on the first and second regions R1 and R2. In example embodiments, as shown in FIG. 32, the common multi-layer etching S24 may be performed several times during the formation of the connection structure, and each common multi-layer etching S24 may be performed using etch masks with widths different from each other. Accordingly, the etched portions E4, E5, and E6 by the common multi-layer etching S24 may be formed at different levels from each other to define the stepwise structure of the stack ST.

The formation of the interconnection structure 300 (in S3) may be performed in substantially the same manner as that of the embodiment described with reference to FIG. 8.

The stack ST may include a plurality of stair-like regions, e.g., stepped regions, which may be formed on the first and second regions R1 and R2 to allow electric connection between the stack ST and the interconnection structure 300. According to the above embodiments described with reference to FIGS. 31 and 32, each of the stair-like regions may be constituted by three horizontal layers 100 stacked in a successive manner. In the previous examples, each of the stair-like regions may be constituted by one or two horizontal layers 100 stacked in the successive manner. This means that there is no reason that each of the stair-like regions should have a specific vertical thickness or be limited to the number of the horizontal layers. For example, as exemplarily described with reference to FIGS. 31 and 32, a specific thickness of each stair-like region may be variously adjusted depending on developer's need. For example, the number of layers constituting each stair-like region may be at least one of 2 to 16.

FIGS. 33 through 37 are schematic diagrams illustrating methods of fabricating a semiconductor device according to modifications of still other exemplary embodiments. For example, FIGS. 33 through 37 show some examples that may be modified from the embodiment previously described with reference to FIGS. 31 and 32. Although, for the sake of brevity, an repetitive description will be omitted, methodical and structural features to be described here can be applied to other embodiments of the inventive concept already described or to be described below in the same or similar manner. In addition, for the sake of brevity, the elements and features of this example that are similar to those previously shown and described will not be described in much further detail.

Figure 33:
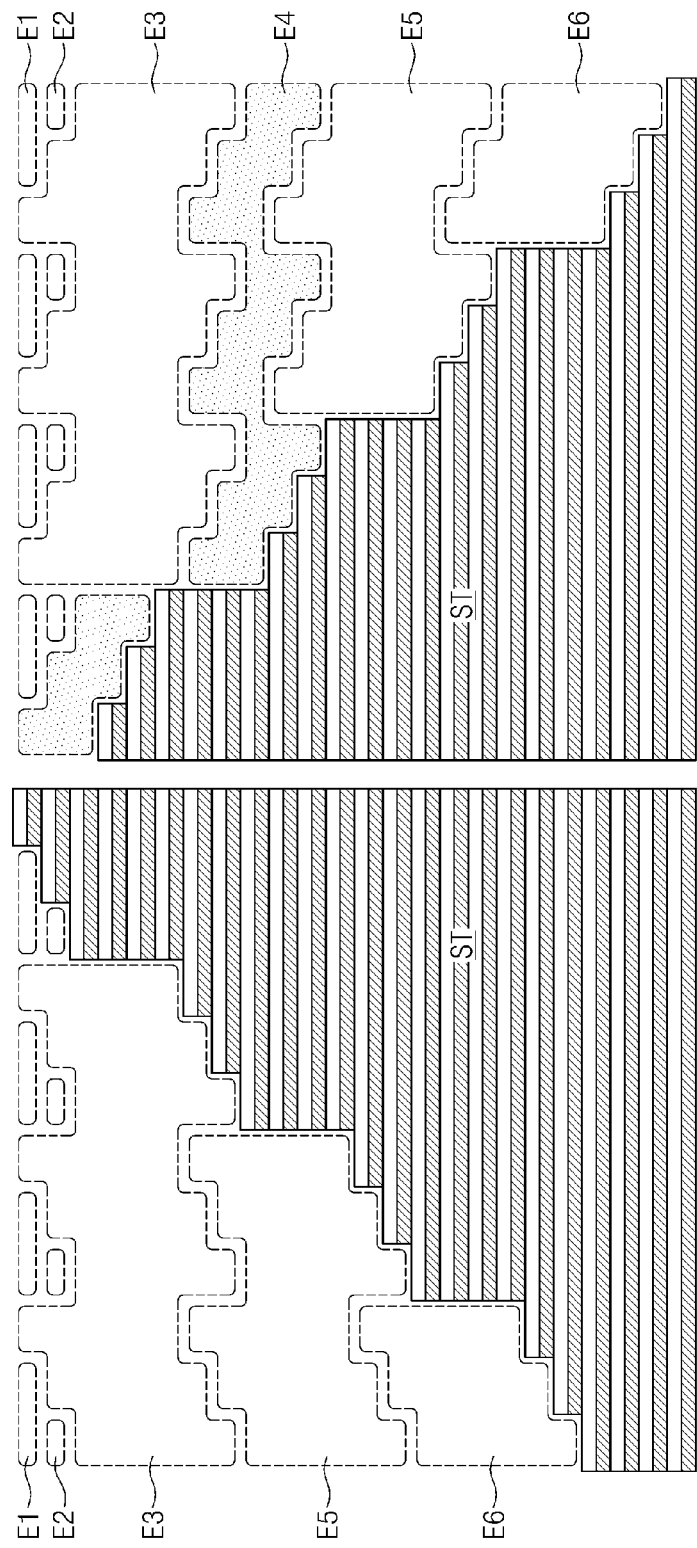
FIGS. 33 through 37 are schematic diagrams illustrating methods of fabricating a semiconductor device according to modifications of still other exemplary embodiments.

The embodiment described with reference to FIG. 32 may be modified to perform the selective multi-layer etching step between the common multi-layer etching steps. For example, as shown in FIG. 33, the selective multi-layer etching step may be performed after the first and second common single-layer etching steps and the common multi-layer etching step to form a fourth etched portion E4 having an etch depth corresponding to twice the vertical pitch of the horizontal layer 100. Thereafter, the stack ST may be further patterned in the common multi-layer etching manner. In the present embodiment, the first and second common single-layer etching steps, the selective multi-layer etching step, the common multi-layer etching steps may be performed in the substantially same manner as those of the embodiment described with reference to FIG. 32. For all that, the final structure of the stack ST may not have a difference between the exemplary embodiments described with reference to FIGS. 32 and 33. This means that it is possible to form the same stepwise structure, regardless of changes in process order or in order of performing the selective multi-layer etching step.

Figure 34:
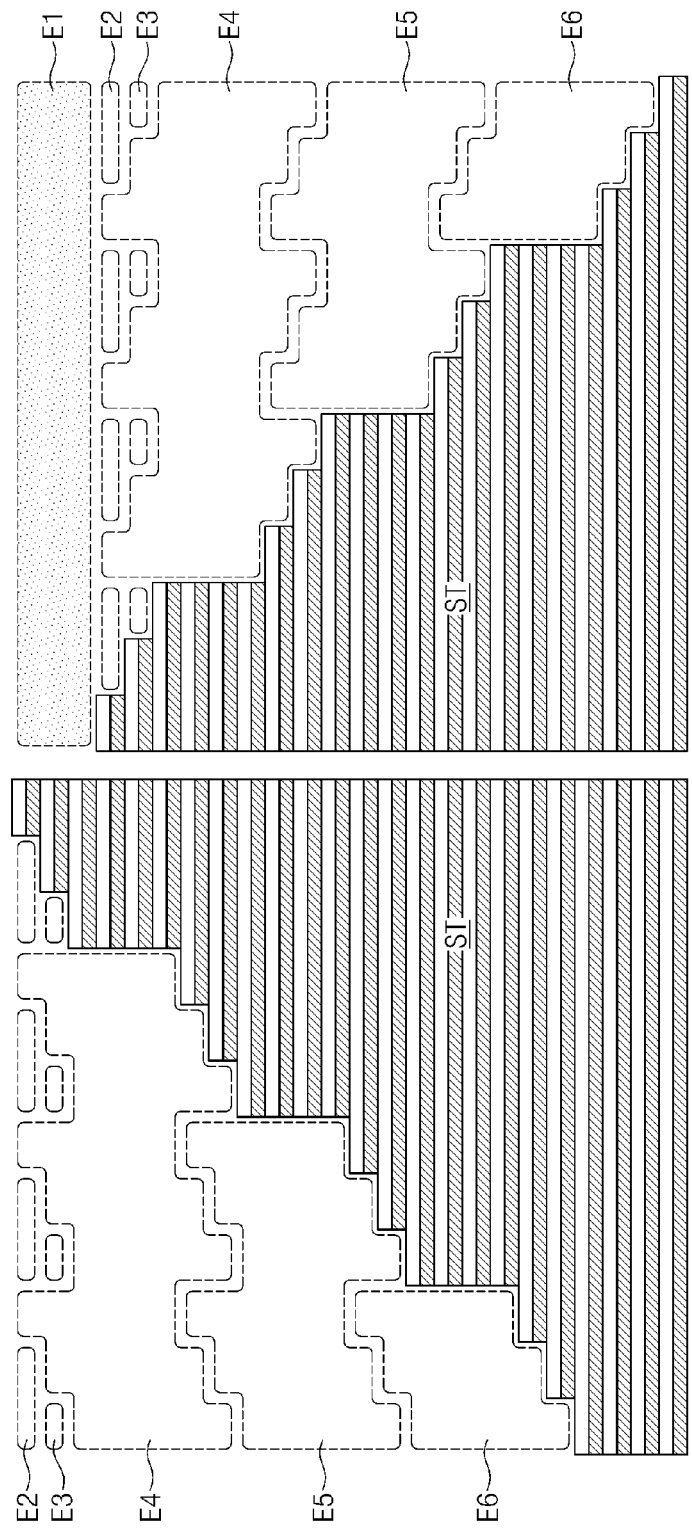

The embodiment described with reference to FIG. 32 may be modified to perform the selective multi-layer etching step before the first and second common single-layer etching steps. For example, as the result of the selective multi-layer etching step, a fourth etched portion E4 may be formed at the uppermost region of the stack ST to have an etch depth corresponding to twice the vertical pitch of the horizontal layer 100, as shown in FIG. 34. Thereafter, the common multi-layer etching step may be performed several times to the stack ST. In the present embodiment, the first and second common single-layer etching steps, the selective multi-layer etching step, the common multi-layer etching steps may be performed in the substantially same manner as those of the embodiment described with reference to FIG. 32. For all that, the final structure of the stack ST may not have a difference between the exemplary embodiments described with reference to FIGS. 32 and 34. This means that, as described with reference to FIG. 33, it is possible to form the same stepwise structure, regardless of changes in process order or in order of performing the selective multi-layer etching step.

Figure 35:
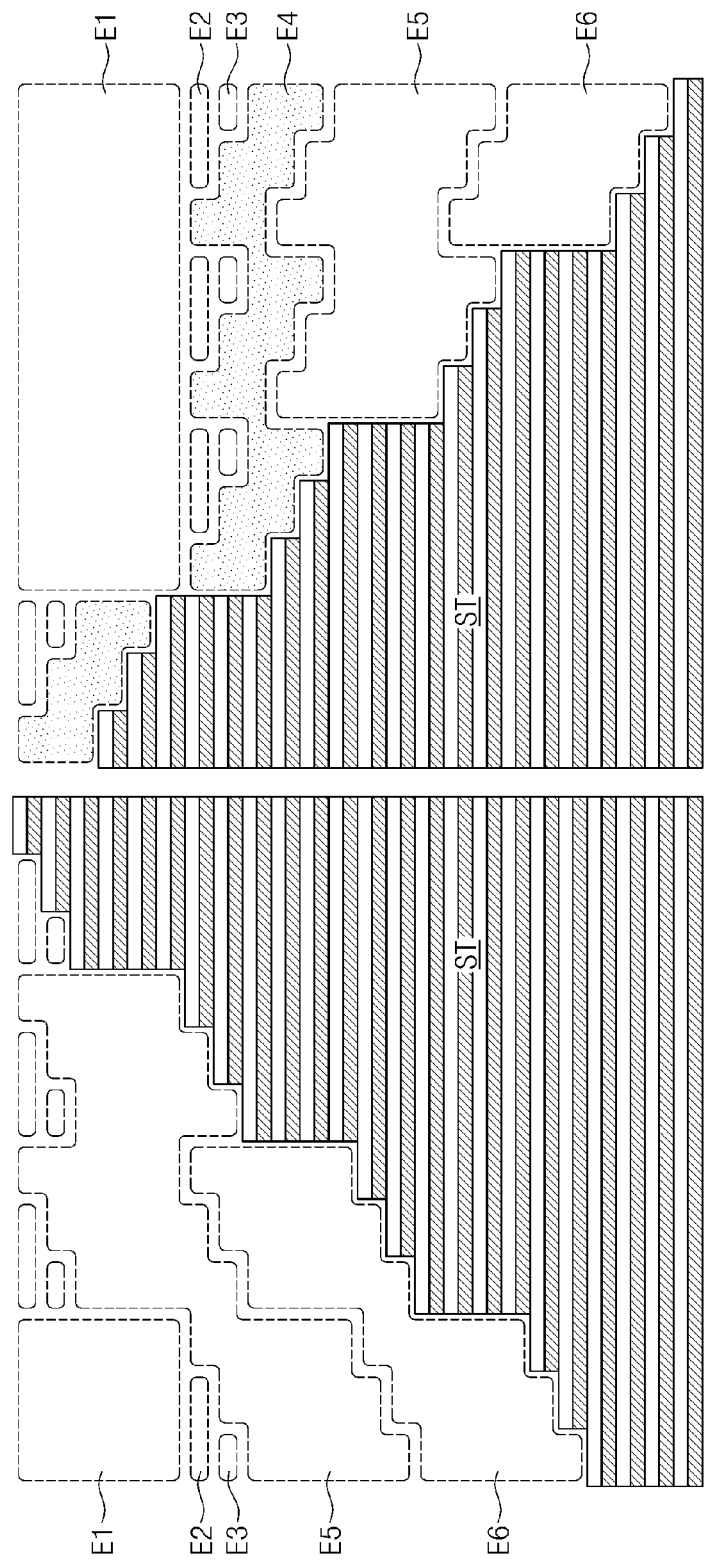

The embodiment described with reference to FIG. 32 may be modified to perform one of the common multi-layer etching steps before the first and second common single-layer etching steps. For example, as the result of the common multi-layer etching step, a first etched portion E1 may be formed at the uppermost region of the stack ST to have an etch depth corresponding to six times the vertical pitch of the horizontal layer 100, as shown in FIG. 35. Thereafter, the first and second common single-layer etching steps, the selective multi-layer etching step, the common multi-layer etching steps may be sequentially performed to the stack ST in the substantially same manner as those of the embodiment described with reference to FIG. 32. For all that, the final structure of the stack ST may not have a difference between the exemplary embodiments described with reference to FIGS. 32 and 35. This means that, as described with reference to FIGS. 33 and 34, it is possible to form the same stepwise structure, regardless of changes in process order or in order of performing the selective multi-layer etching step.

Figure 36:
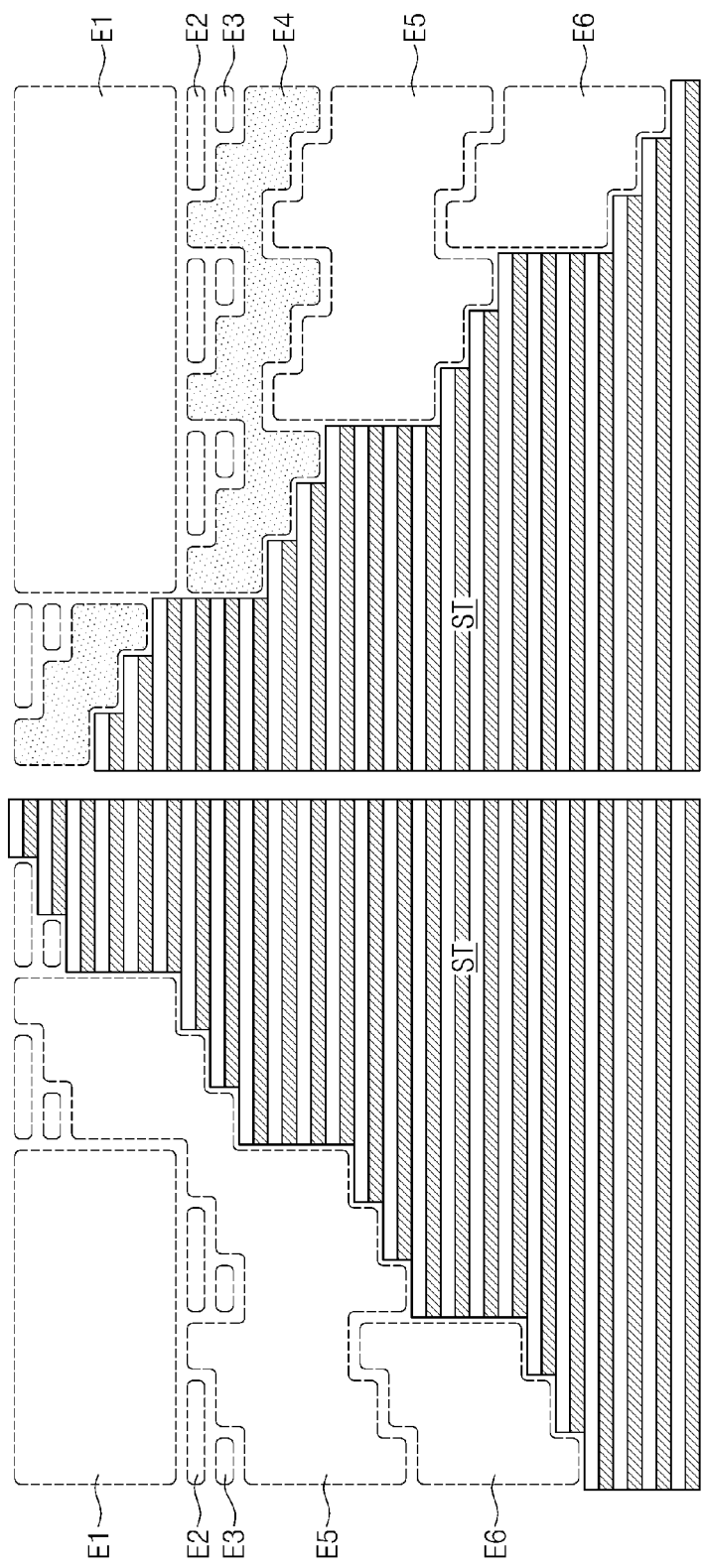

Compared to the embodiment described with reference to FIG. 35, at least one of the common multi-layer etching steps may be modified to make a change in an etching region thereof. For example, the etch masks used to form the first and sixth etched portions E1 and E6 in FIG. 35 may be exchanged with each other, as shown in FIG. 36. However, even in this case, the stack ST may have the same structure as that of the exemplary embodiments described with reference to FIGS.

32 through 35, as shown in FIG. 36. This means that it is possible to form the same stepwise structure, regardless of changes in order of performing the common multi-layer etching step.

The embodiment described with reference to FIG. 32 may be combined with one (e.g., of FIG. 17) of the above described other embodiments to form the stepwise connection region. For example, as exemplarily shown in FIG. 37, a selective multi-layer etching step, a first common single-layer etching step, a second common single-layer etching step, and a plurality of common multi-layer etching steps may be sequentially performed to form the stepwise structure of the stack ST. The common multi-layer etching steps may be performed to form fourth to sixth etched portions E4, E5, and E6, respectively, each of which has an etch depth corresponding to three times the vertical pitch of the horizontal layer 100. The first and second common single-layer etching steps may be performed in the substantially same manner as those of the embodiment described with reference to FIG. 32. Such a combination of the exemplary embodiments may not be limited to that in the method exemplarily shown in FIG. 37, and may be applied, in the same or similar manner, to other embodiments of the inventive concept already described or to be described below.

Figure 38:
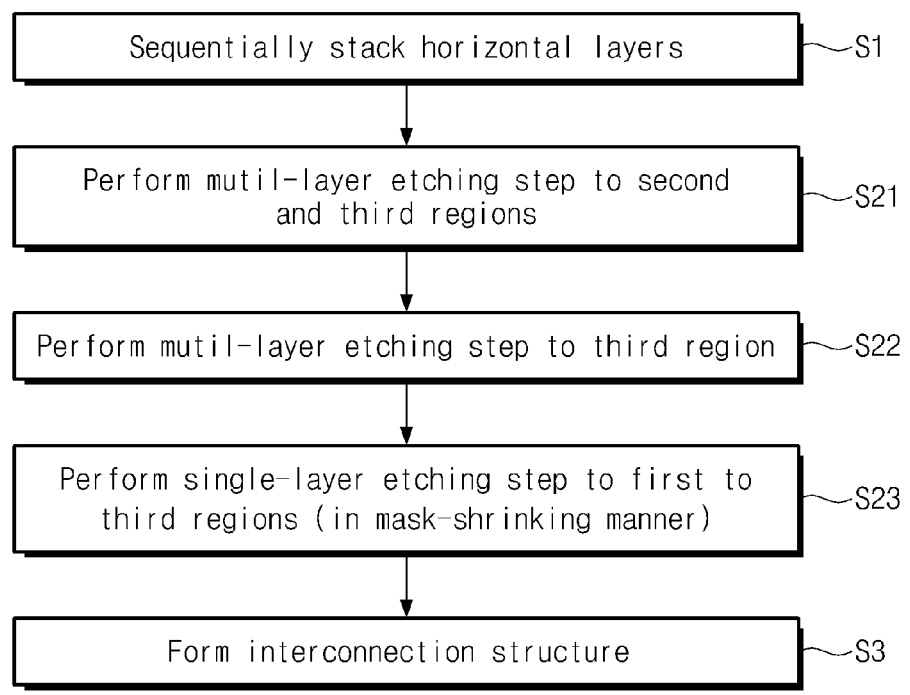
FIG. 38 is a flow chart exemplarily illustrating methods of fabricating a semiconductor device according to even other exemplary embodiments.

FIG. 38 is a flow chart exemplarily illustrating methods of fabricating a semiconductor device according to even other exemplary embodiments. FIGS. 39 through 43 are sectional views exemplarily illustrating a method of fabricating a semiconductor device according to even other exemplary embodiments. For the sake of brevity, the elements and features of this example that are similar to those previously shown and described will not be described in much further detail. Further, methodical and structural features to be described here can be applied to other embodiments of the inventive concept already described or to be described below in the same or similar manner.

Figure 39:
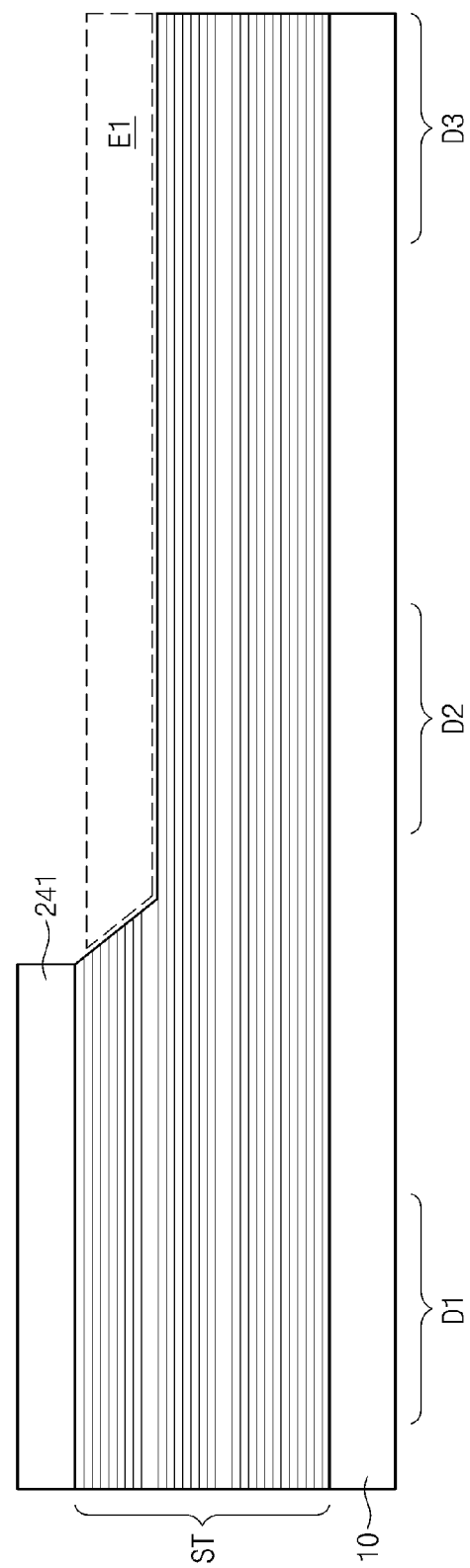
FIGS. 39 through 43 are sectional views exemplarily illustrating a method of fabricating a semiconductor device according to even other exemplary embodiments.

Referring to FIGS. 38 and 39, in the present embodiment, the substrate 10 may include first, second and third regions D1, D2, and D3 spaced apart from each other. The horizontal layers 100 and the interlayered insulating layers 200 may be alternatingly stacked on the substrate 10 to form a stack ST (in 51), and a first multi-layer etching S21 may be performed to the stack ST. The first multi-layer etching S21 may include anisotropically etching the stack ST using a first etch mask 241 exposing the second and third regions D2 and D3. Accordingly, a first etched portion E1 may be formed in a portion of the stack ST located on a region including the second and third regions D2 and D3.

Figure 40:
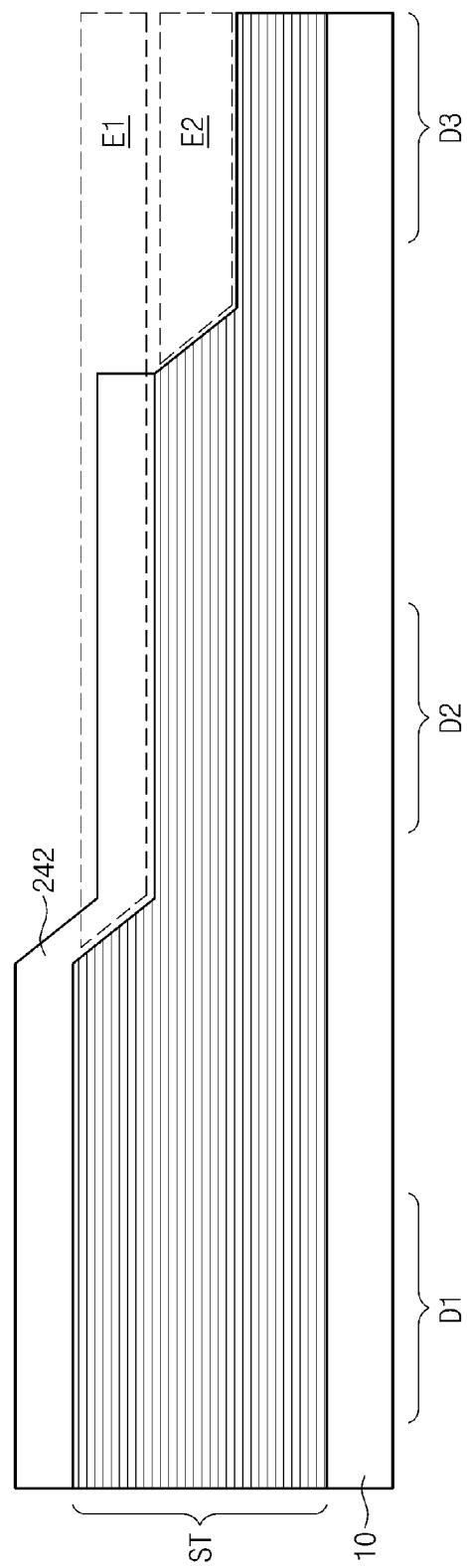

Referring to FIGS. 38 and 40, a second multi-layer etching S22 may be performed on the stack ST. the second multi-layer etching S22 may include anisotropically etching the stack ST using a second etch mask 242 exposing the third region D3. Accordingly, a second etched portion E2 may be formed in a portion of the stack ST located on a region including the third region D3. In example embodiments, the first and second etched portions E1 and E2 may have the same depth as each other, but exemplary embodiments may not be limited thereto.

Figure 41:
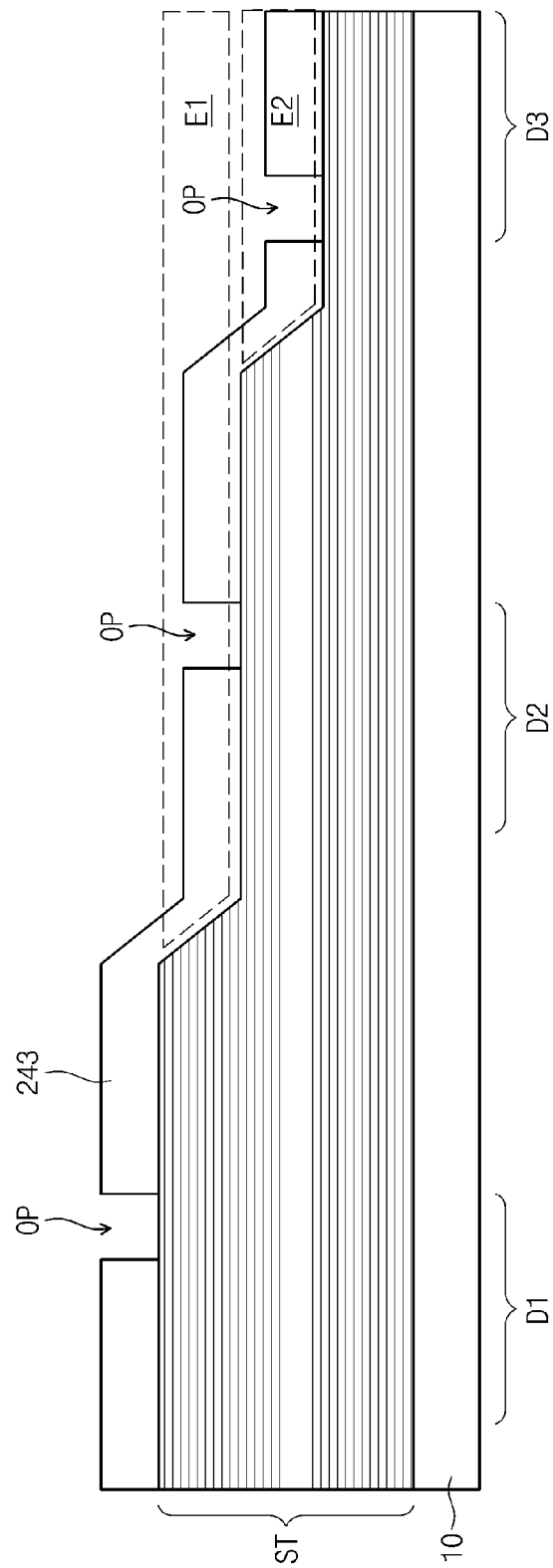

Referring to FIGS. 38 and 41, a third etch mask 243 may be formed on the stack ST, to which the second multi-layer etching S22 has been performed. the third etch mask 243 may be formed to have openings OP, each of which exposes partially the corresponding one of the first to third regions D1, D2, and D3.

Figure 42:
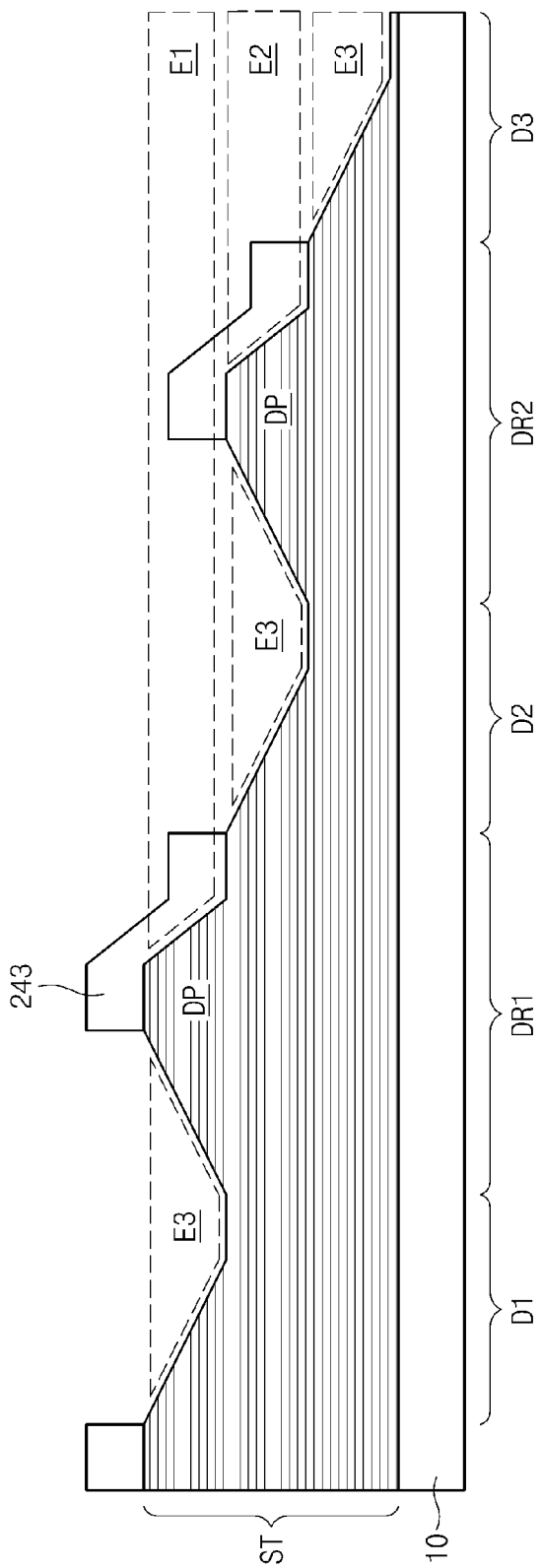

Referring to FIGS. 38 and 42, a common single-layer etching S21 may be performed several times to the stack ST. In example embodiments, the third etch mask 243 may be used in common for the common single-layer etching S21. During the common single-layer etching steps S21, the above described mask shrinking steps may be performed to the third etch mask 243. Accordingly, as the common single-layer etching S21 progresses, an etched portion of the stack ST may become wider and wide, thereby forming third etched portions E3, which are provided on the first to third regions D1, D2, and D3, respectively, and each of which has a downward tapered vertical section.

Figure 43:
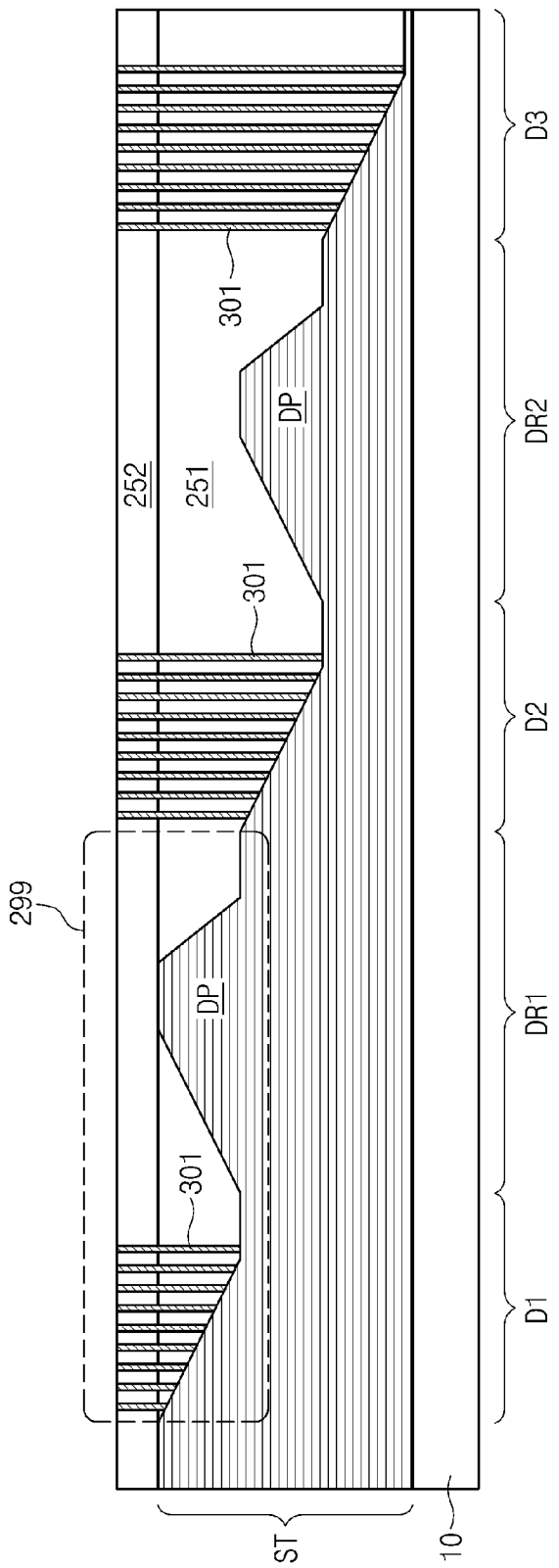

Referring to FIGS. 38 and 43, a first interlayered insulating layer 251 may be formed to fill the first to third etched portions E3. The first interlayered insulating layer 251 may have a substantially flat top surface formed by a planarization process (for example, a chemical mechanical polishing process). Thereafter, the second interlayered insulating layer 252 may be formed, and the plugs 301 may be formed through the second and first interlayered insulating layer 252 and 251. In example embodiments, as described above, before the formation of the plugs 301, a replacement process may be performed to replace the horizontal layers 100 with a conductive material (e.g., a metal-containing material).

Figure 44:
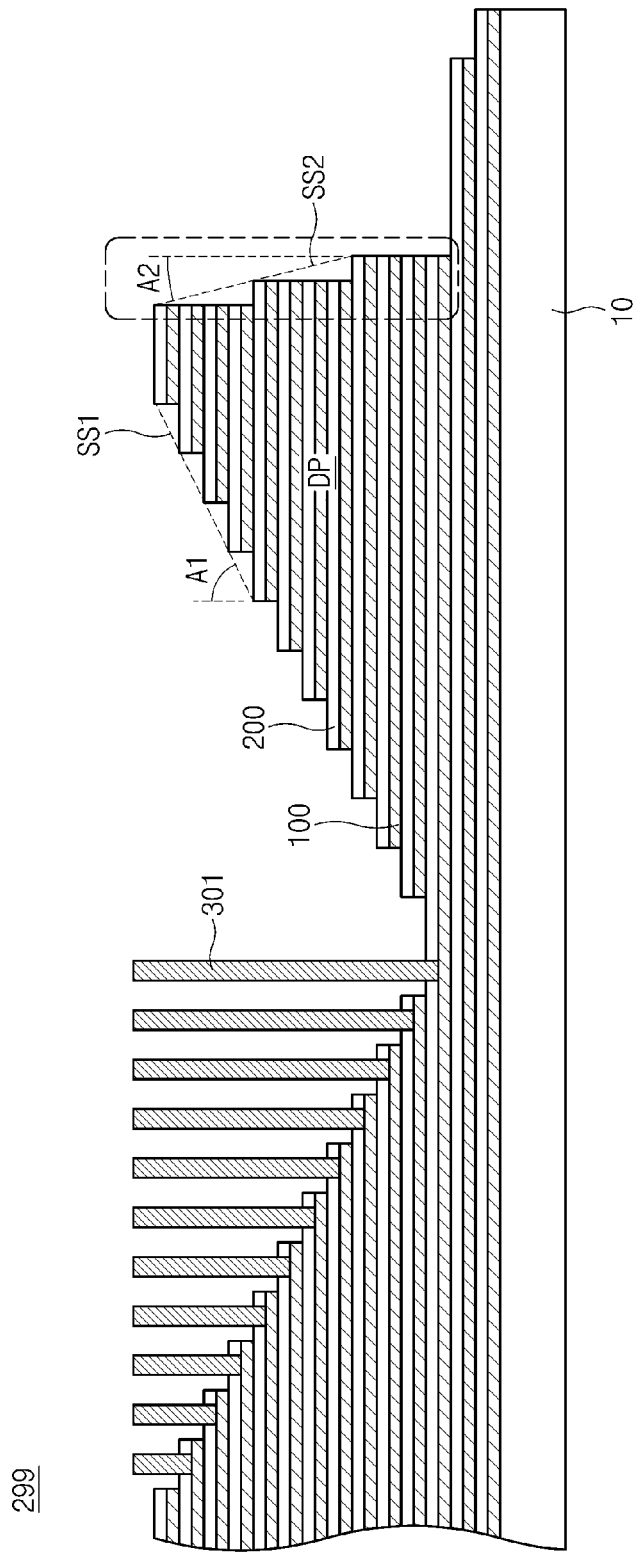
FIG. 44 is an enlarged sectional view illustrating a portion of the semiconductor device of FIG. 43.

According to the above described embodiments, first and second dummy regions DR1 and DR2 may be located between the first and second regions D1 and D2 and between the second and third regions D2 and D3, and dummy patterns DP may be formed on the first and second dummy regions DR1 and DR2, respectively. As shown in FIG. 44, each of the dummy patterns DP may include a first side surface SS1 defined by the common single-layer etching S23 and a second side surface SS2 defined by the first or second multi-layer etching S21 and S22. For example, the first side surface and the stepwise connection structure may be side surfaces of each third etched portion E3 facing each other. Accordingly, the first side surface SS1 may be formed to have a sectional profile that is mirror symmetric with respect to the stepwise connection structure of each of the first to third regions D1, D2, and D3.

By contrast, since the second side surface SS2 is defined by the first or second multi-layer etching S21 or S22, it may have a sectional profile different from the first side surface SS1. For example, the first side surface SS1 may be formed to have a first angle A1, and the second side surface SS2 may be formed to have a second angle A2 different from the first angle A1. In example embodiments, the second angle A2 may range from about 0 degree to about 45 degree.

In example embodiments, one of the first and second multi-layer etching S21 and S22 may include a plurality of multi-layer etching steps successively performed using the mask shrinking step. In this case, as shown in FIG. 44, the second side surface SS2 may be formed to have a stepwise section, and the second angle A2 may be greater than 0 degree. In the case where the second side surface SS2 of the dummy pattern DP has the slant side surface, it is possible to prevent a thinning of the second or third etch mask 242 or 243 and process failures caused by the thinning.

Due to the presence of the dummy patterns DP, it is possible to prevent a height of the stack ST to being abruptly changed near an edge of the stack ST. This improves a deposition profile of the first or second interlayered insulating layer 251 or 252. Furthermore, the dummy patterns DP may prevent the edge portions of the stack ST from being damaged during the planarization process on the first interlayered insulating layer 251.

Figure 45:
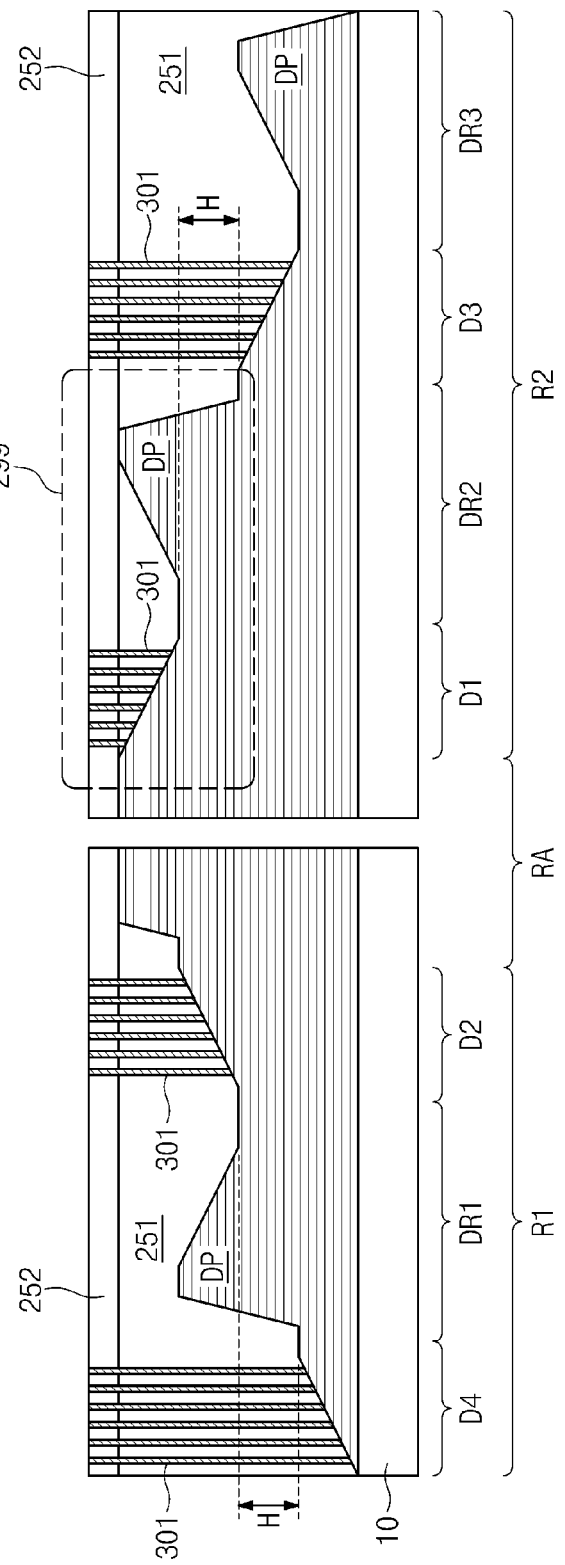
FIGS. 45 and 46 are schematic sectional views illustrating modifications of the exemplary embodiments described with reference to FIGS. 39 through 43.
Figure 46:
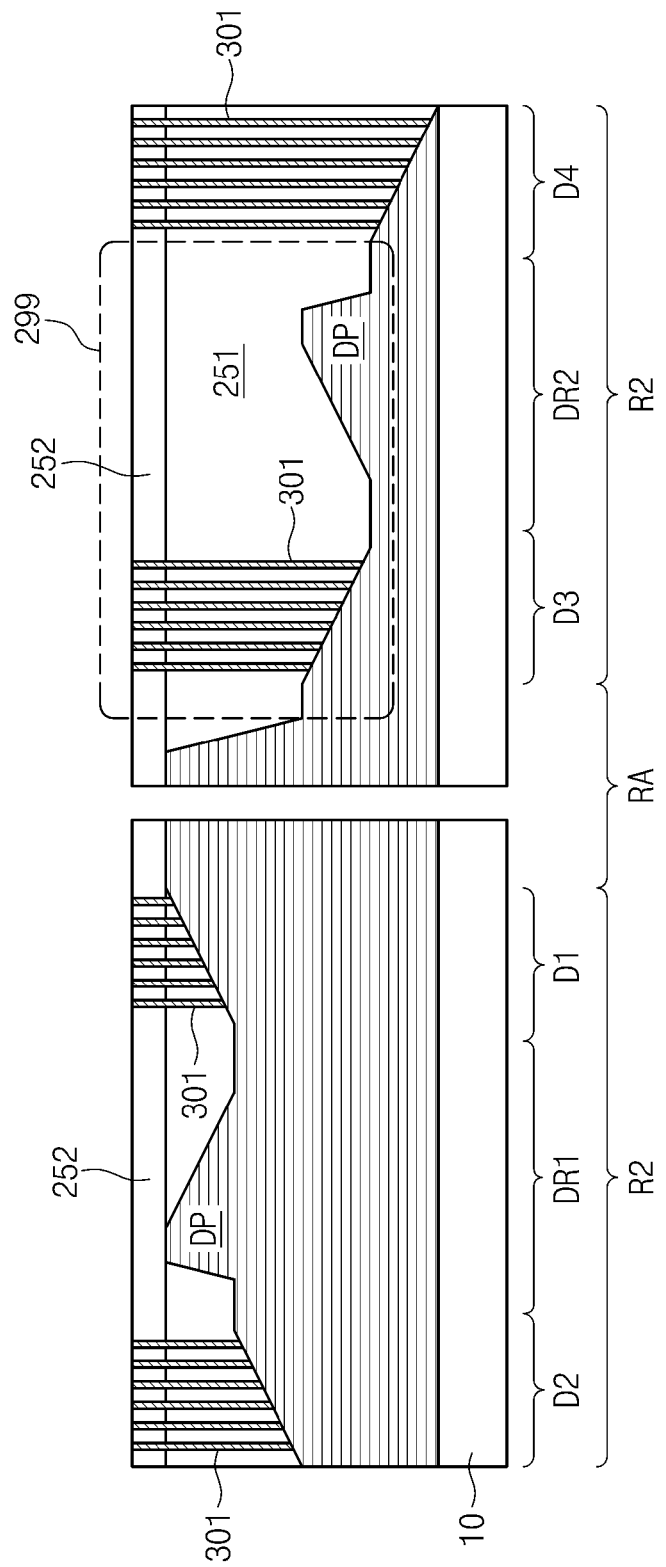

FIGS. 45 and 46 are schematic sectional views illustrating modifications of the exemplary embodiments described with reference to FIGS. 39 through 43.

According to the exemplary embodiments described with reference to FIGS. 39 through 43, the stepwise connection structure may be formed at one side of the array region RA. However, the embodiment described with reference to FIGS. 39 through 43 may be modified in such a way that the stepwise connection structures are formed at both sides of the array region RA.

The stack ST may include first to fourth connection regions D1, D2, D3, and D4 constituting the stepwise structure to be connected to the plugs 301. Here, the first to fourth connection regions D1, D2, D3, and D4 may have vertical portions elevated in order listed. In this case, some of the first to fourth connection regions D1, D2, D3, and D4 may be formed at one side of the array region RA (for example, the first region R1), and the others at other side of the array region RA (for example, the second region R2).

According to the embodiment shown in FIG. 45, the second and fourth connection regions D2 and D4 may be formed on the first region R1, and the first and third connection regions D1 and D3 may be formed on the second region D2. In certain embodiments, a space H of between the second and fourth connection regions D2 and D4 or between the first and third connection regions D1 and D3 may be substantially equivalent to a thickness of one the connection regions positioned therebetween.

According to the embodiment shown in FIG. 46, the first and second connection regions D1 and D2 may be formed on the first region R1, and the third and fourth connection regions D3 and D4 may be formed on the second region D2.

Figure 47:
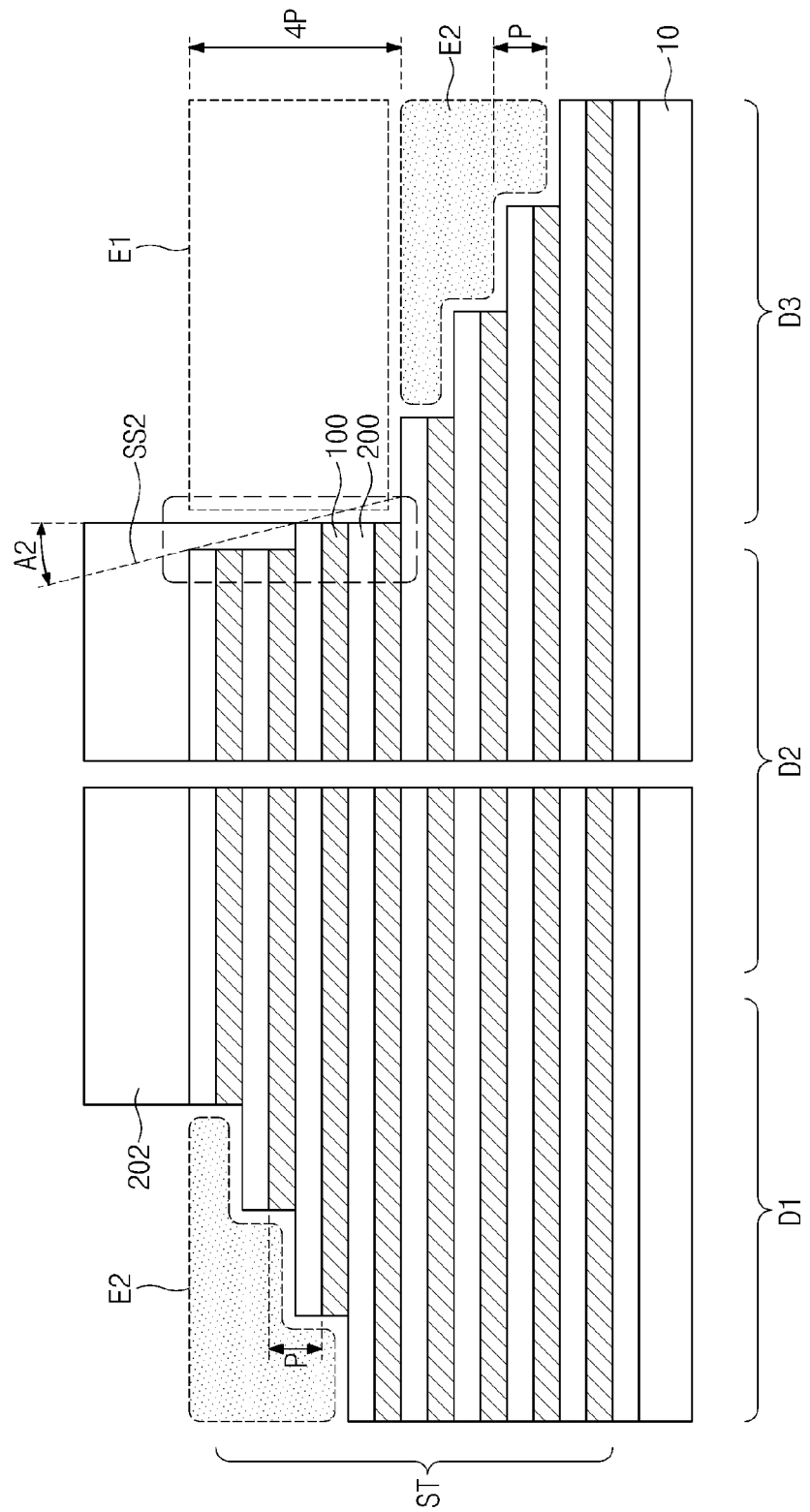
FIGS. 47 and 48 are schematic sectional views exemplarily illustrating semiconductor devices according to other modifications of even other exemplary embodiments.
Figure 48:
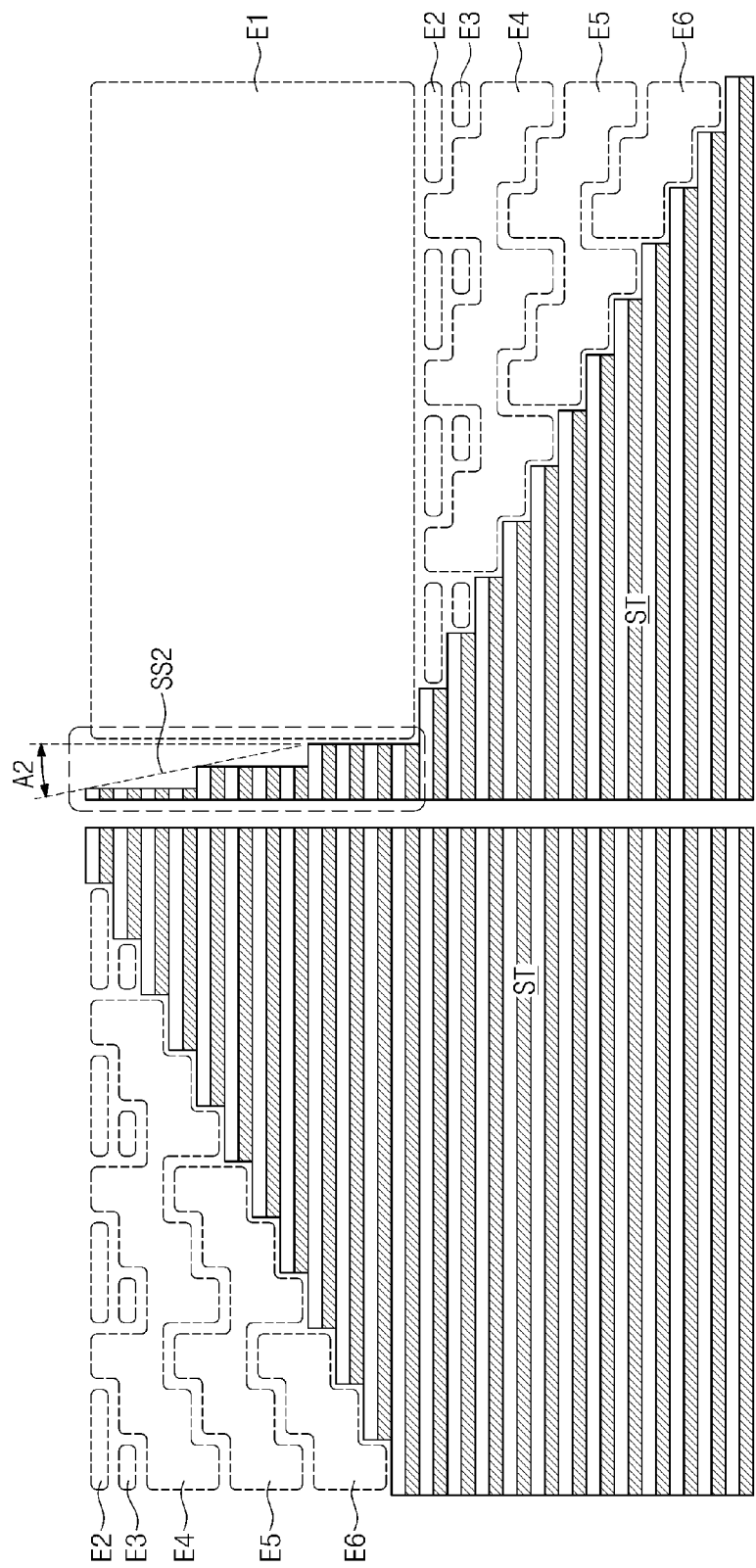

FIGS. 47 and 48 are schematic sectional views exemplarily illustrating semiconductor devices according to other modifications of even other exemplary embodiments. For the sake of brevity, the elements and features of this example that are similar to those previously shown and described will not be described in much further detail. Further, methodical and structural features to be described here can be applied to other embodiments of the inventive concept already described or to be described below in the same or similar manner.

Each embodiment of the inventive concept already described or to be described below may be configured to include a part of technical features described with reference to FIG. 44. For example, in the step described with reference to FIG. 17, a sidewall of the first etched portion E1 may be formed to have technical features of the second side surface SS2 of FIG. 44. In other words, as shown in FIG. 47, the sidewall of the first etched portion E1 may be formed to have a sectional profile at an angle to the normal line with respect to the top surface of the substrate 10. Further, the sidewall of the first etched portion E1 may be formed by a plurality of multi-layer etching steps performed in a mask shrinking manner, and in this case, the sidewall of the first etched portion E1 may have a stepwise sectional profile, as shown in FIG. 47.

Figure 37:
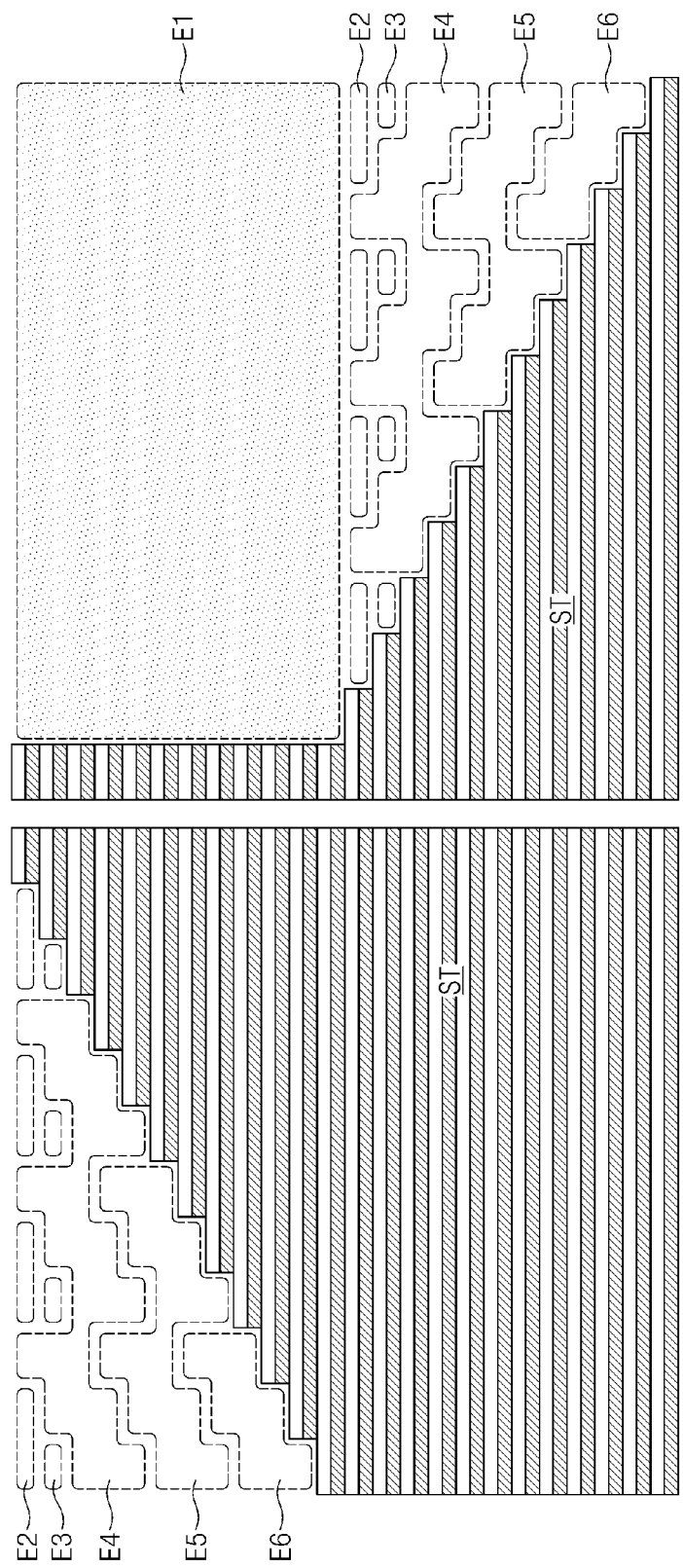

In other example embodiments, in the exemplary embodiments described with reference to FIG. 37, the sidewall of the first etched portion E1 may be formed to have a sectional profile at an angle to the normal line with respect to the top surface of the substrate 10. Further, the sidewall of the first etched portion E1 may be formed by a plurality of multi-layer etching steps performed in a mask shrinking manner, and in this case, the sidewall of the first etched portion E1 may also have a stepwise sectional profile, as shown in FIG. 48.

Figure 49:
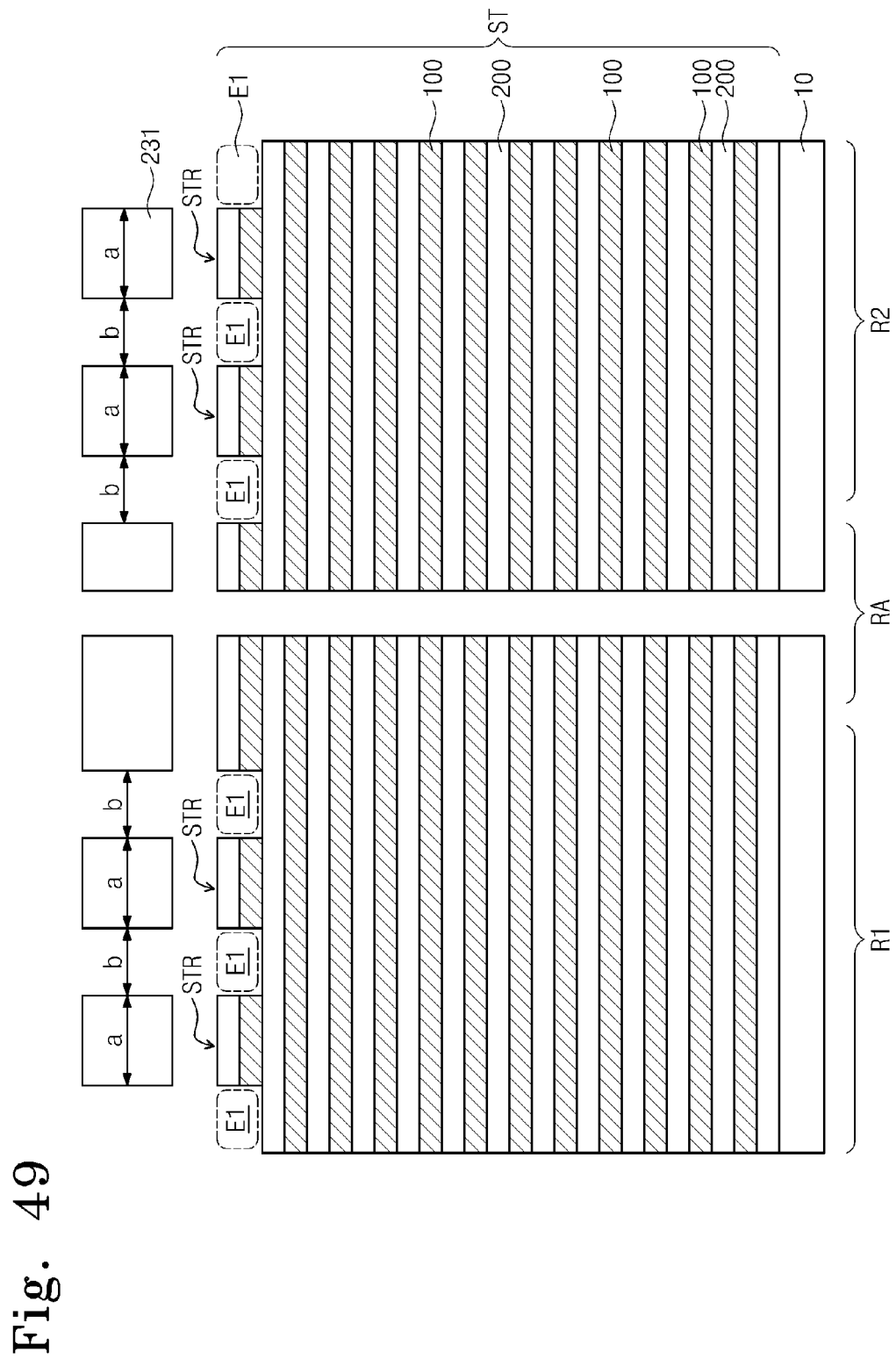
FIGS. 49 through 51 are sectional views exemplarily illustrating a method of fabricating a semiconductor device according to further exemplary embodiments.
Figure 50:
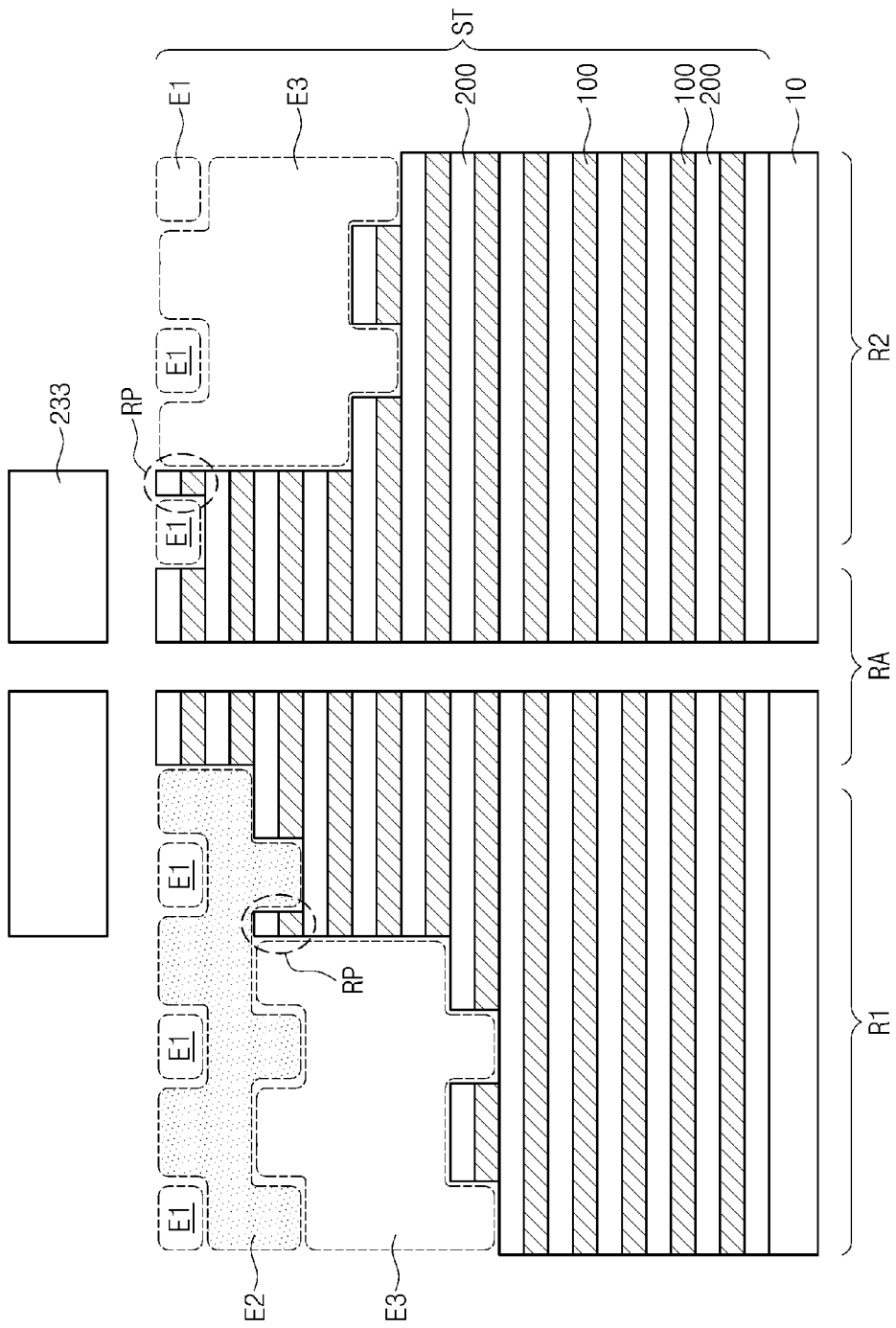
Figure 51:
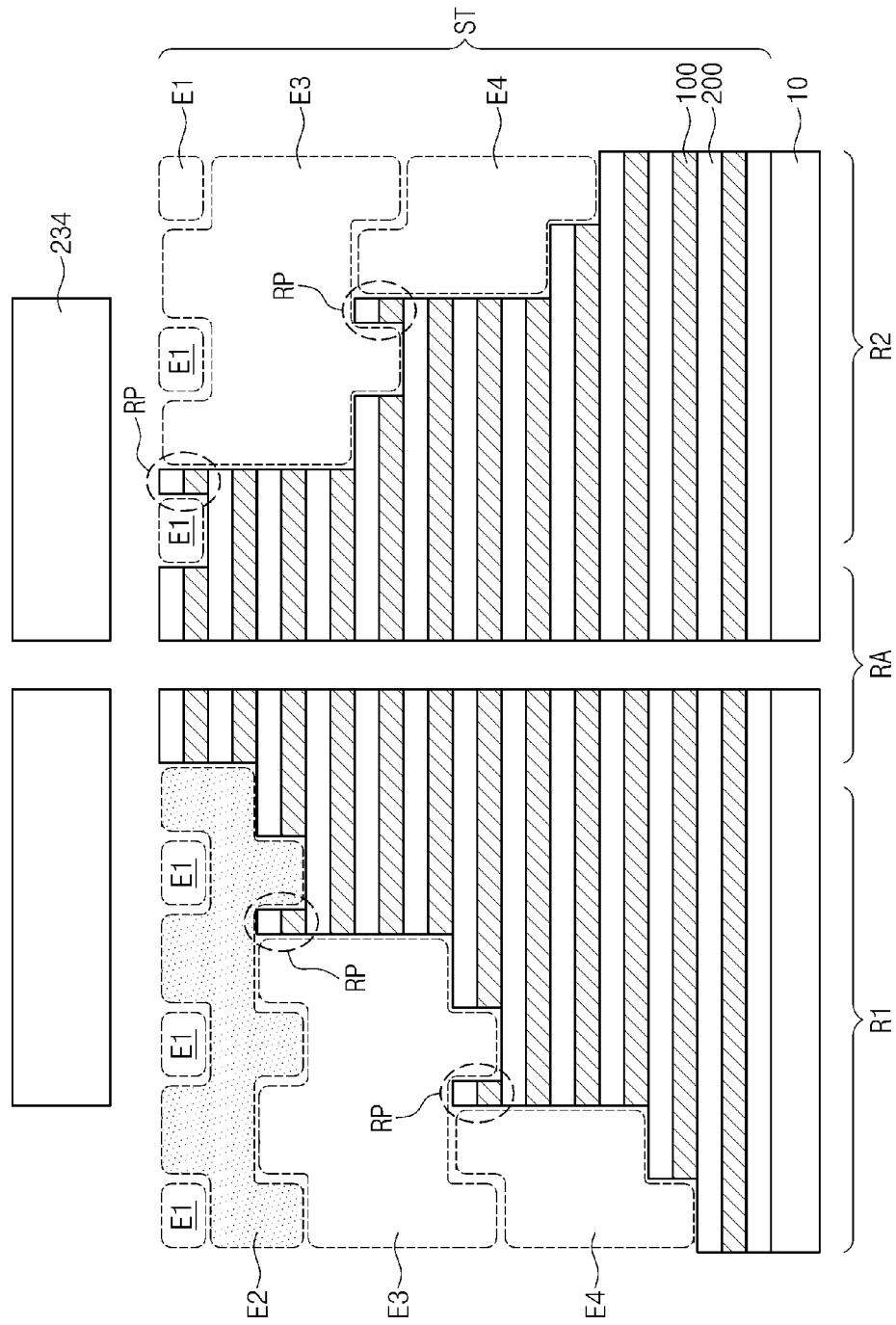
Figure 52:
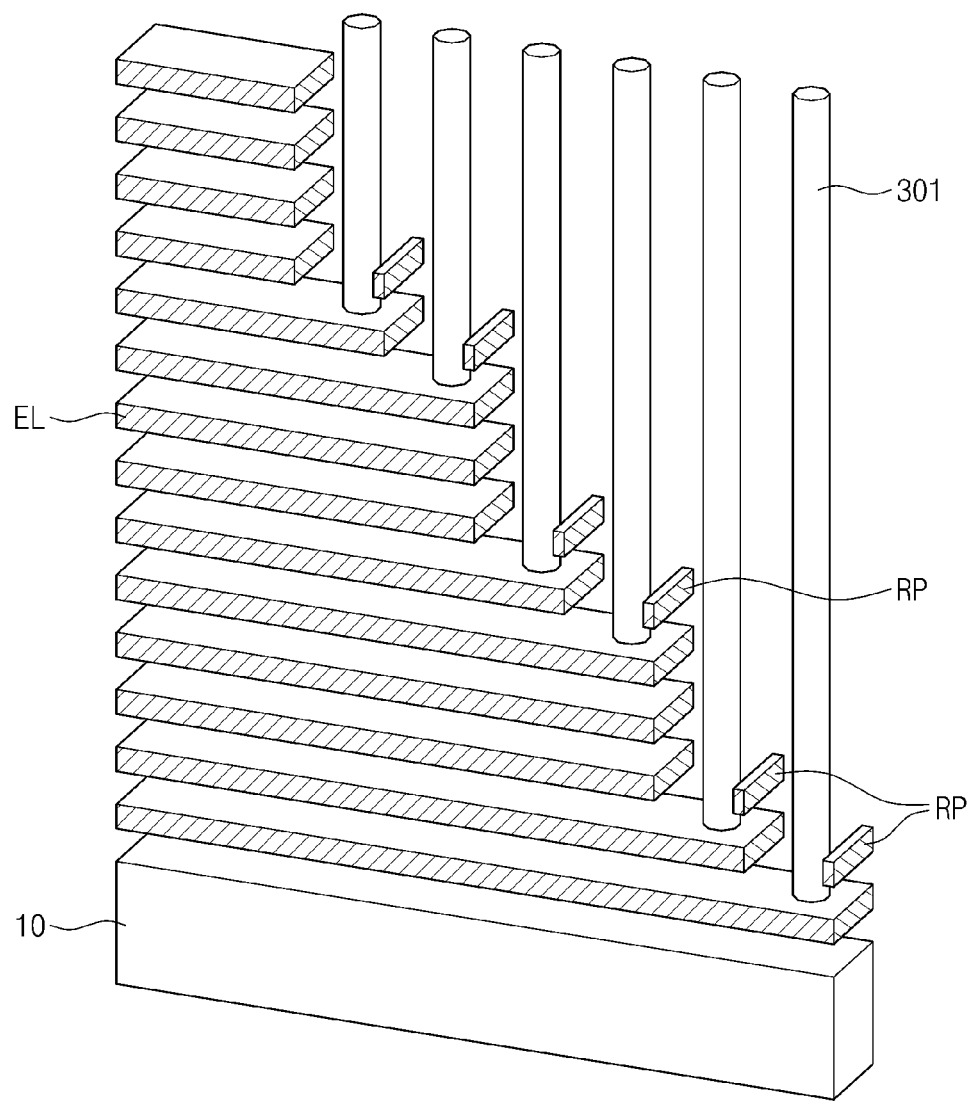
FIG. 52 is a perspective view illustrating a portion of a semiconductor device according to further exemplary embodiments.

FIGS. 49 through 51 are sectional views exemplarily illustrating a method of fabricating a semiconductor device according to further exemplary embodiments, and FIG. 52 is a perspective view illustrating a portion of a semiconductor device according to further exemplary embodiments. For the sake of brevity, the elements and features of this example that are similar to those previously shown and described will not be described in much further detail. Further, methodical and structural features to be described here can be applied to other embodiments of the inventive concept already described or to be described below in the same or similar manner.

Referring to FIG. 49, as the result of the common single-layer etching S21, each of the first etched portions E1 may be formed to have a width smaller than that of portions STR of the stack ST located therebetween. For example, as shown in FIG. 49, each of the first etched portions E1 may have a first width b, and each of the portions STR of the stack ST may have a second width a greater than the first width b.

Referring to FIGS. 50 and 51, the common multi-layer etching S23 may be performed to form remaining portions RP horizontally spaced apart from a central portion of the stack ST. For example, the remaining portions RP may be horizontally separated from a main body of the stack ST by the second to fourth etched portions E2-E4 formed by the common multi-layer etching S23. In this case, as shown in FIG. 52, the remaining portions RP may be provided around the plugs 301, respectively. In the case of the absence of misalignment, each of the remaining portions RP may have a width, which may be given by a difference in width between the portion STR of the stack ST and the first etched portion E1 (i.e., a-b). In example embodiments, the remaining portions RP of FIG. 52 may be formed of the same material as the electrode EL provided at the same level and be electrically separated from other conductive elements (for example, the electrodes EL or the plugs 301) to be electrically floated.

Figure 53:
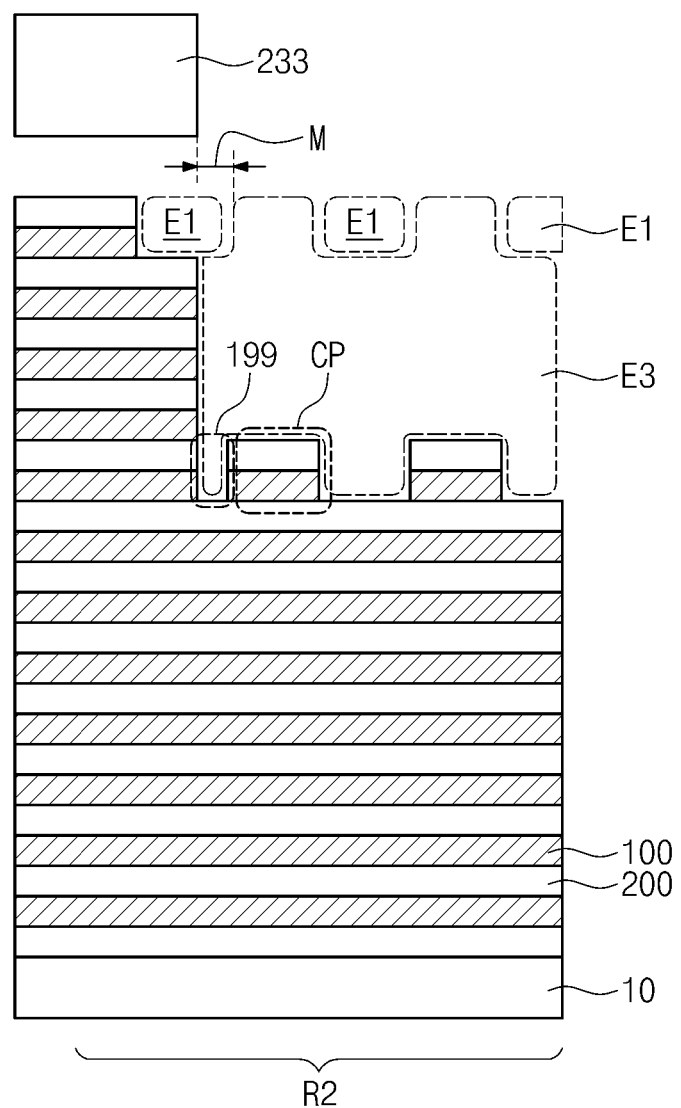
FIG. 53 is a sectional view provided for comparison with the exemplary embodiments described with reference to FIGS. 49 through 51.

FIG. 53 is a sectional view provided for comparison with the exemplary embodiments described with reference to FIGS. 49 through 51.

In the case where there is a misalignment M in the common multi-layer etching S23 described with reference to FIG. 23, the connection portion CP may be formed spaced apart from a central portion of the stack ST by the third etched portion E3, as shown in FIG. 53. This separation of the connection portion CP may lead to failures of semiconductor devices (for example, electric disconnection). By contrast, as described with reference to FIGS. 49 through 51, in the case where the portion STR of the stack ST is formed to have a width greater than that of the first etched portion E1, it is possible to obtain a sufficient alignment margin, and thus, technical problems related to the misalignment M (for example, the electric disconnection) can be reduced.

Figure 54:
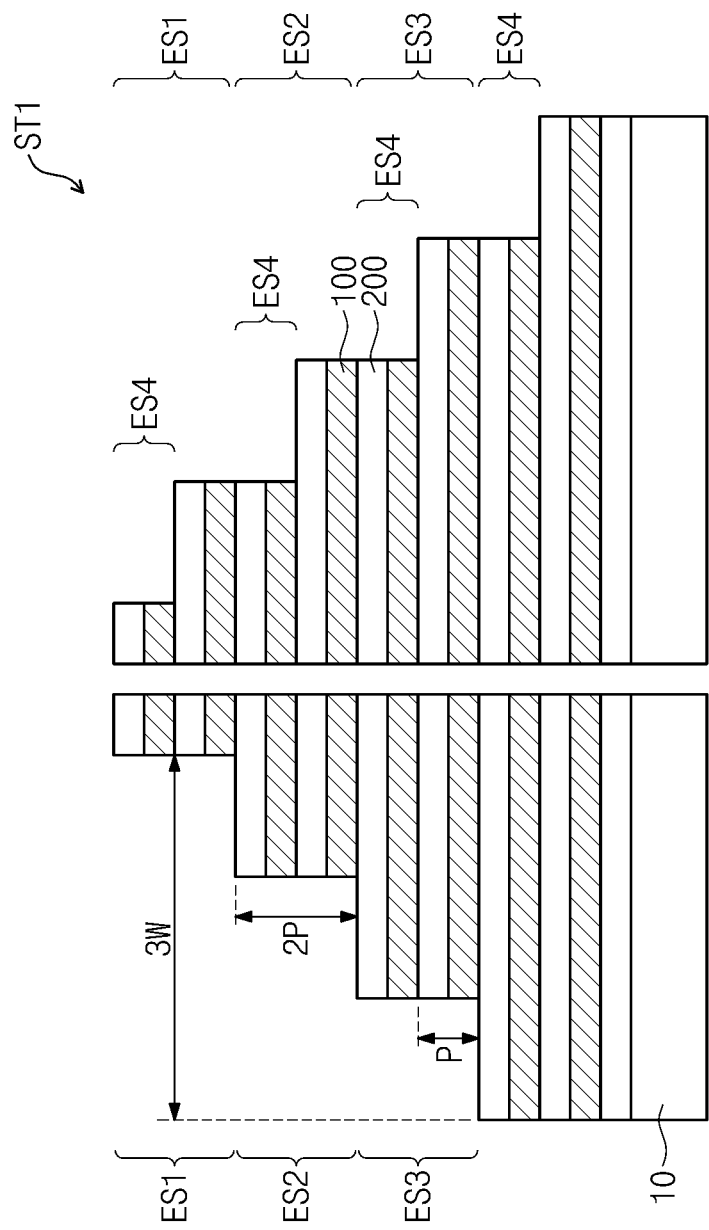
FIGS. 54 and 55 are schematic sectional views illustrating stepwise structures according to an exemplary embodiment of the inventive concept and a comparative embodiment, respectively.
Figure 55:
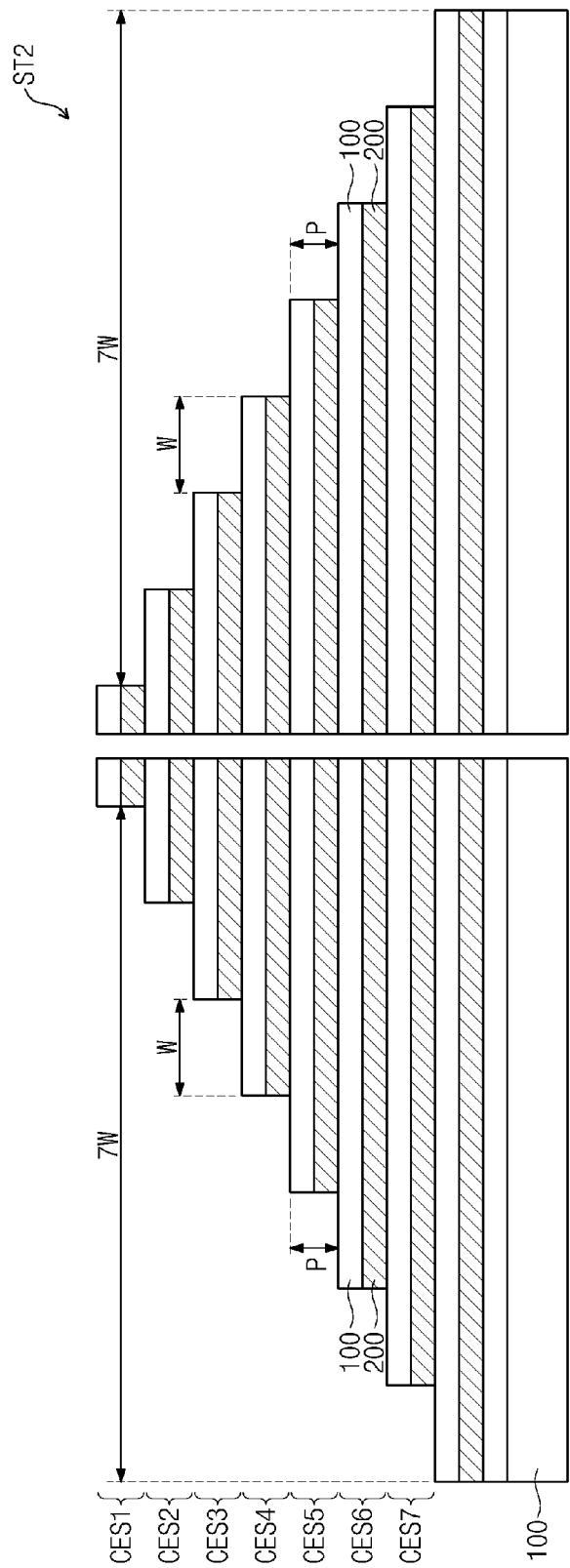

FIGS. 54 and 55 are schematic sectional views illustrating stepwise structures according to an exemplary embodiment of the inventive concept and a comparative embodiment, respectively. A semiconductor device according to the comparative embodiment may be formed by a patterning process, in which a selective etching manner and/or a multi-layer etching manner are not adopted. For example, in the comparative embodiment, the semiconductor device may be fabricated through a plurality of etching steps performed in a common single-layer etching. In this case, the semiconductor device according to exemplary embodiments may be formed to have a first stepwise structure ST1 shown in FIG. 54, while the semiconductor device according to the comparative embodiment may be formed to have a second stepwise structure ST2 shown in FIG. 55.

Referring to FIGS. 54 and 55, in the case of exemplary embodiments, at least one of steps in the first stepwise structure ST1 may have a thickness that is equivalent to or greater than twice the vertical pitch P of the horizontal layer 100, as the result of the use of the patterning process based on the above described multi-layer etching manner. By contrast, in the case of the comparative embodiment, since the patterning process is merely performed in the single-layer etching manner, all of steps in the second stepwise structure ST2 may have a thickness equivalent to the vertical pitch P of the horizontal layer 100. In other words, compared to the second stepwise structure ST2, the first stepwise structure ST1 may have an increased step height, and this reduces a total width of the stepwise region. For example, if the stepwise region of the first stepwise structure ST1 has a width of 3W as exemplarily shown in FIG. 54, then the stepwise region of the second stepwise structure ST2 has a width of 7W as exemplarily shown in FIG. 55. In other words, according to exemplary embodiments, it is possible to reduce by half or more an occupying area of the stepwise structure.

Furthermore, according to exemplary embodiments, the first stepwise structure ST1 shown in FIG. 54 may be formed by performing three times a multi-layer etching ES1, ES2, and ES3 and once a single-layer etching ES4. By contrast, according to the comparative embodiment, since all of the horizontal layers 100 may be patterned in a single-layer etching manner, the second stepwise structure ST2 may be formed through seven etching steps CES1-CES7. In other words, according to exemplary embodiments, it is possible to simplify the formation of the semiconductor device, compared with that of the comparative embodiment. The simplification of the fabrication process may reduce cost and failure of the semiconductor device.

Figure 56:
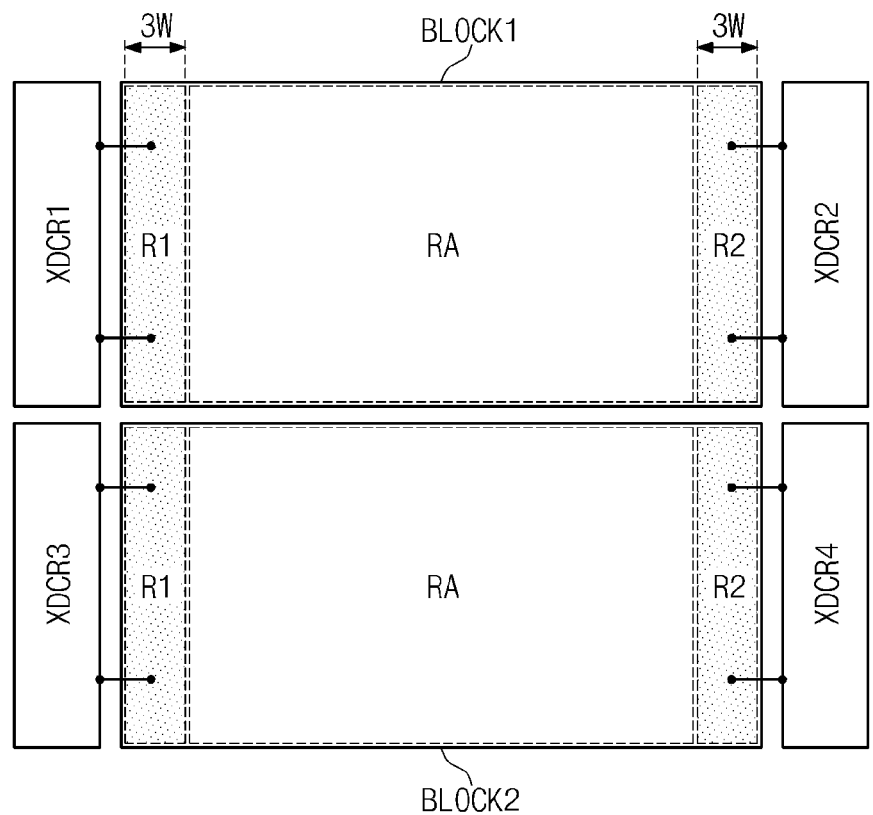
FIGS. 56 and 57 are diagrams provided to explain technical differences between semiconductor devices according to the exemplary embodiment of the inventive concept and the comparative embodiment, respectively.
Figure 57:
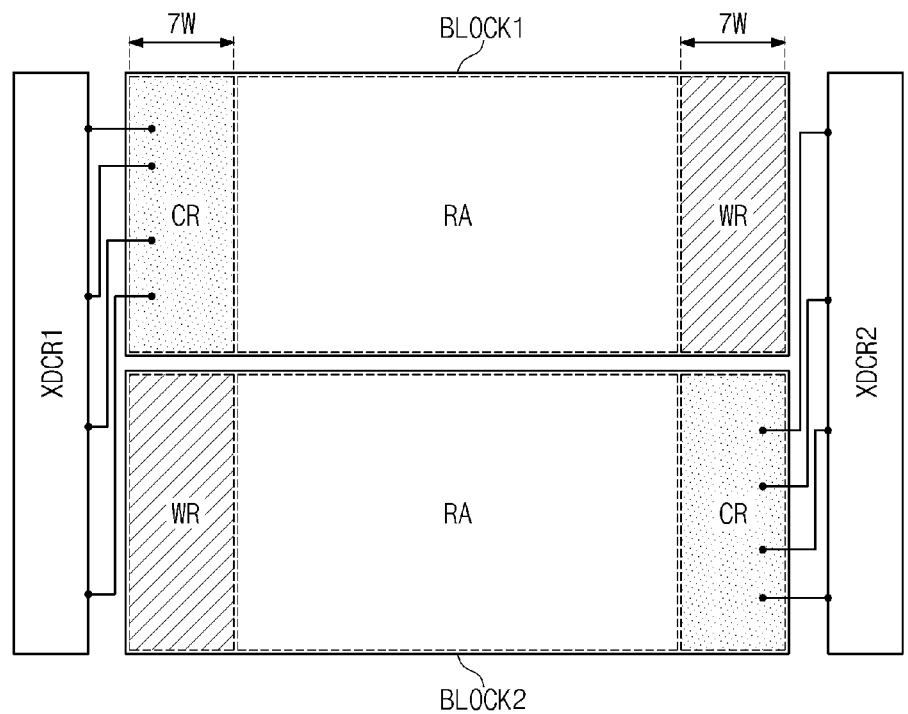

FIGS. 56 and 57 are diagrams provided to explain technical differences between semiconductor devices according to the exemplary embodiment of the inventive concept and the comparative embodiment, respectively.

Referring to FIGS. 56 and 57, a semiconductor device may include first and second blocks BLOCK1 and BLOCK2, each of which is provided with three-dimensionally arranged memory cells, and a plurality of X-decoders provided around the first and second blocks BLOCK1 and BLOCK2.

According to exemplary embodiments, as shown in FIG. 56, each of the first and second blocks BLOCK1 and BLOCK2 may include an array region RA and first and second regions R1 and R2 disposed at both sides thereof, respectively, and the X-decoders may include first and second X-decoders XDCR1 and XDCR2 provided adjacent to the first and second regions R1 and R2, respectively, of the first block BLOCK1 and third and fourth X-decoders XDCR3 and XDCR4 provided adjacent to the first and second regions R1 and R2, respectively, of the second block BLOCK2.

According to the comparative embodiment, as shown in FIG. 45, each of the first and second blocks BLOCK1 and BLOCK2 may include the array region RA and an connection region CR and a wasting region WR disposed at both sides thereof, respectively, and the X-decoders may include first and second X-decoders XDCR1 and XDCR2, which may be provided adjacent to the connection regions CR of the first and second blocks BLOCK1 and BLOCK2, respectively.

In the case of the comparative embodiment, the X-decoders may be connected to the memory cells disposed on the array region RA via the connection regions CR. However, the wasting region WR is just a subordinate structure unnecessarily obtained as the result of the etching steps based on the common etching manner, and thus, it is not used to connect the first and second X-decoders XDCR1 and XDCR2 electrically with the horizontal layers 100 or the electrodes EL. By contrast, according to exemplary embodiments, each or all of the first and second regions R1 and R2 may be used to connect the first to fourth X-decoders XDCR1-XDCR4 electrically with the horizontal layers 100 or the electrodes EL.

According to exemplary embodiments, as described with reference to FIGS. 54 and 55, the stepwise structure can be formed to have a reduced occupying area, and as a result, a width of each of the first and second regions R1 and R2 may be smaller than widths of the connection and waste regions CR and WR in the comparative embodiment. For example, as shown in FIGS. 56 and 57, each of the first and second regions R1 and R2 may have a width of 3W, and each of the connection and waste regions CR and WR may have a width of 7W. In other words, in the case of the comparative embodiment, the waste region WR may not be used for realizing an electric connection and have an occupying area greater than that of each of the first and second regions R1 and R2. Due to the presence of the waste region WR having a large occupying area, the semiconductor device according to exemplary embodiments can have an increased integration density or an increased memory capacity, compared with that of the comparative embodiment.

Figure 58:
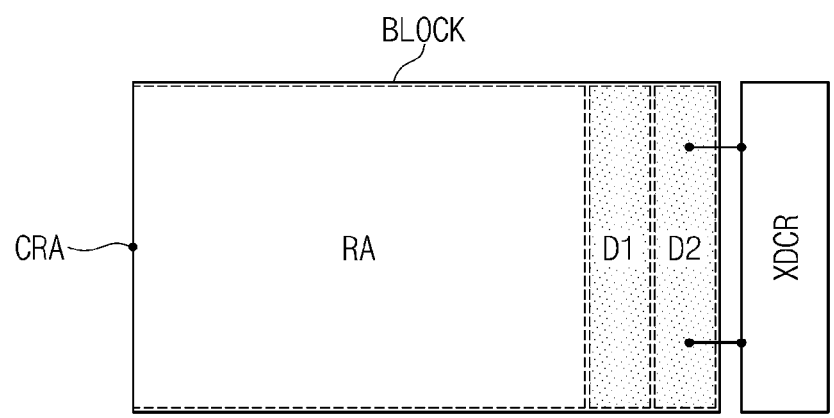
FIGS. 58 and 59 are diagrams provided to explain structural features of semiconductor device according to some exemplary embodiments.
Figure 59:
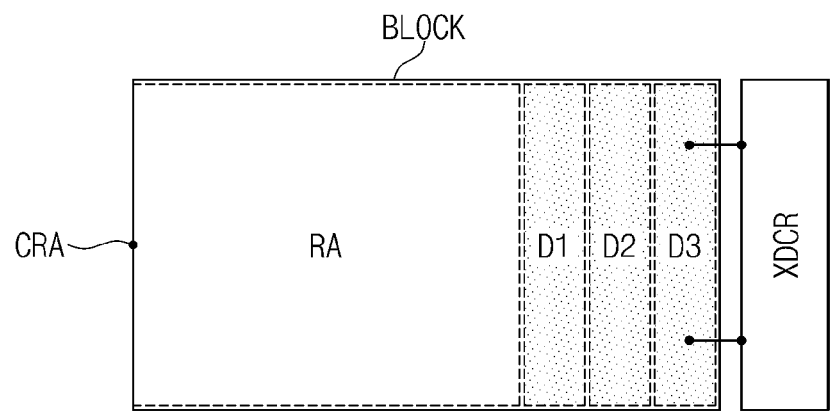

FIGS. 58 and 59 are diagrams provided to explain structural features of semiconductor device according to some exemplary embodiments.

The first and second regions R1 and R2 do not need to be formed at opposite both sides of the array region RA, and disposition thereof may be variously modified. For example, as shown in FIG. 58, the first and second regions R1 and R2 constituting the connection region may be formed between the array region RA (or its center CRA) and the X-decoder XDCR. Furthermore, in the case of the embodiment described with reference to FIGS. 39 through 43, the first to third regions R1, R2, and R3 may be formed between the array region RA (or its center CRA) and the X-decoder XDCR, as shown in FIG. 59.

Figure 60:
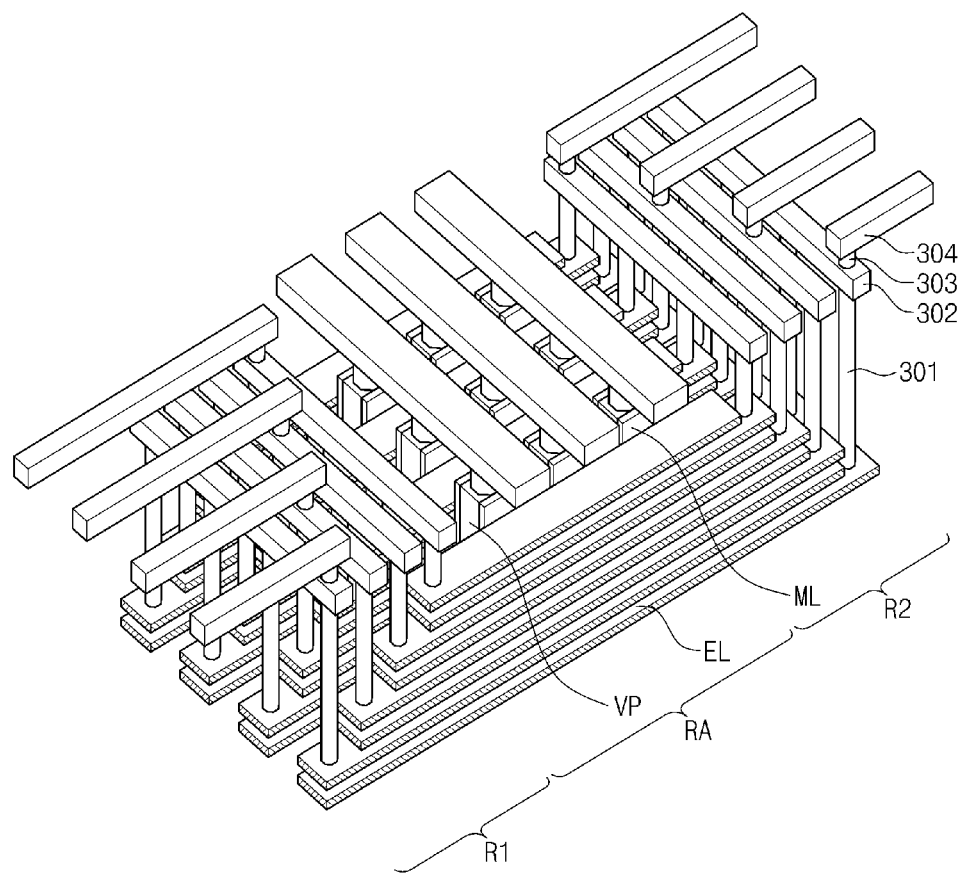
FIGS. 60 and 61 are perspective views exemplarily illustrating three-dimensional semiconductor memory devices according to exemplary embodiments.
Figure 61:
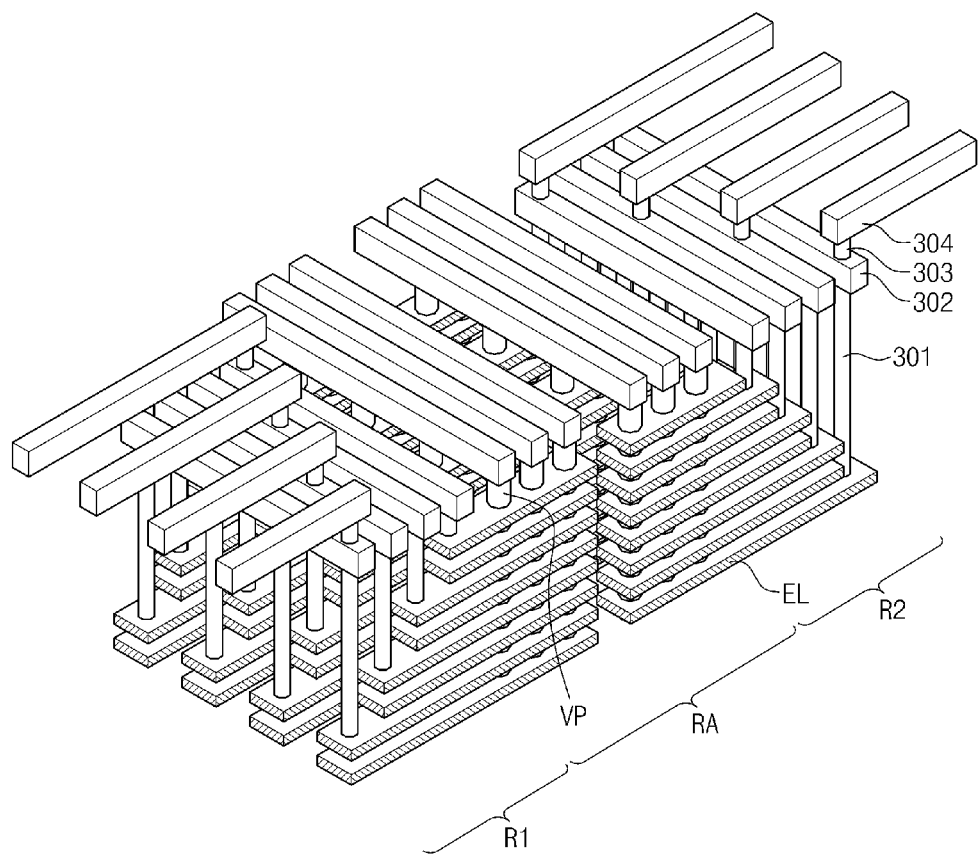

FIGS. 60 and 61 are perspective views exemplarily illustrating three-dimensional semiconductor memory devices according to exemplary embodiments. For example, the semiconductor memory devices shown in FIGS. 60 and 61 may be fabricated by one of the methods described previously. As has been the case, the elements and features of this example that are similar to those previously shown and described will not be described in much further detail for the sake of brevity.

Referring to FIGS. 60 and 61, the electrodes EL may be configured to have the same structural features as those of the exemplary embodiments previously described with reference to FIG. 1 or FIG. 27. Vertical patterns VP may be provided to vertically penetrate the electrodes EL or vertically cross between the electrodes EL. In example embodiments, the vertical pattern VP may be used a channel region of at least one transistor. For example, the vertical pattern VP may be used an active pattern of a cell string CSTR of a vertical NAND FLASH memory device, which will be exemplarily described with reference to FIG. 62. In other embodiments, the vertical pattern VP may be used as an electrode or conductive line, which allows the connection of two-terminal memory elements electrically with each other. For example, the vertical pattern VP may be used as a vertical electrode VE of a three-dimensional variable resistance memory device, which will be exemplarily described with reference to FIG. 63.

A memory layer ML or memory elements may be interposed between the vertical pattern VP and the electrodes EL. In example embodiments, the memory layer ML may include a material or a layer structure, in which electric charges can be selectively stored. In other embodiments, the memory layer ML may include a material or a layer structure exhibiting a variable resistance property.

Figure 62:
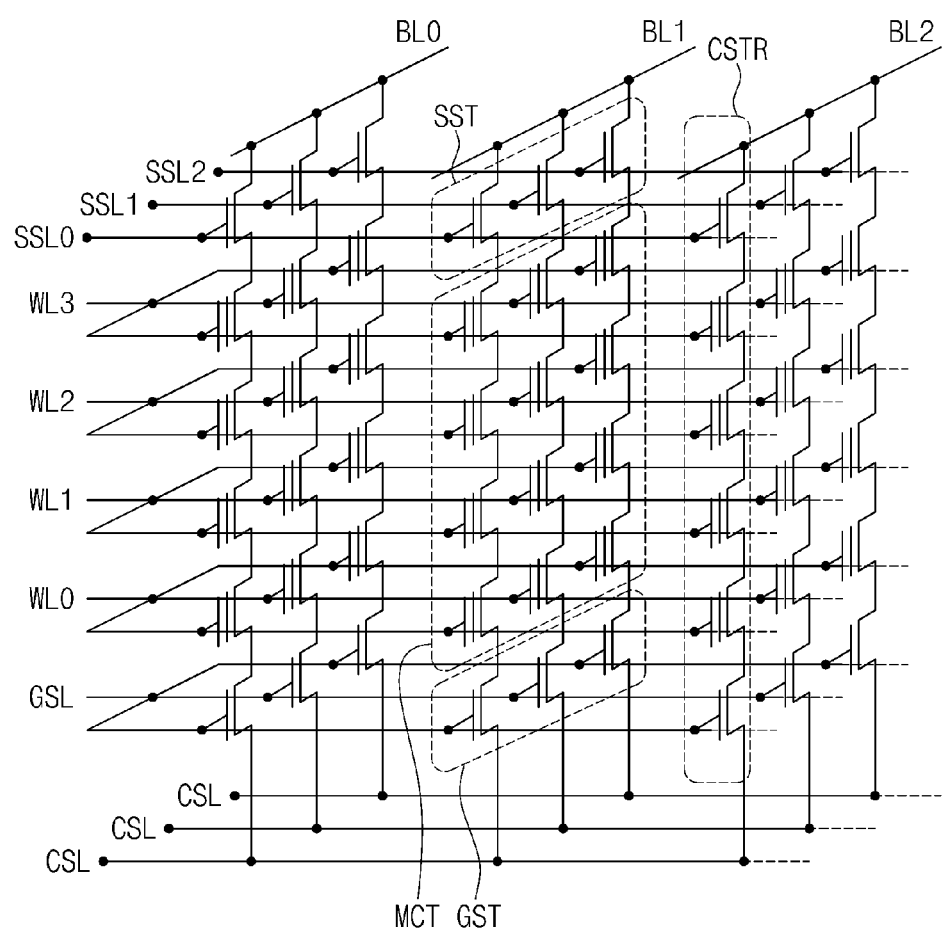
FIGS. 62 and 63 are circuit diagrams exemplarily illustrating three-dimensional memory semiconductor devices according to exemplary embodiments.
Figure 63:
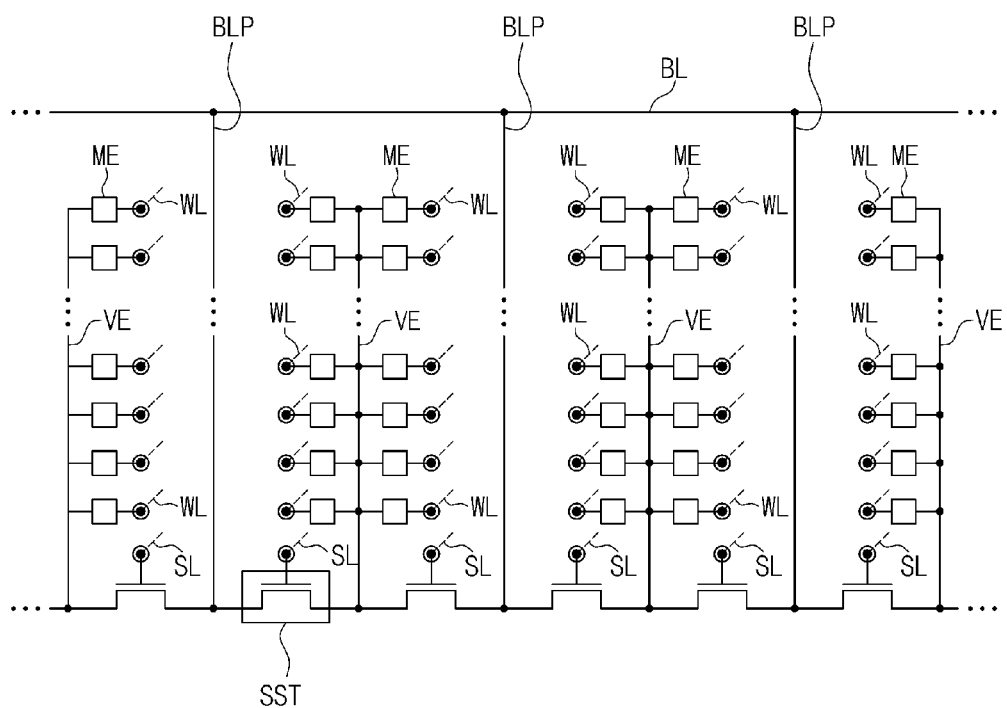

FIGS. 62 and 63 are circuit diagrams exemplarily illustrating three-dimensional memory semiconductor devices according to exemplary embodiments.

Referring to FIG. 62, a three-dimensional semiconductor memory device may include a common source line CSL, a plurality of bit lines BL0, BL1, and BL2, and a plurality of cell strings CSTR disposed between the common source line CSL and the bit lines BL0-BL2.

The common source line CSL may be a conductive pattern provided on the substrate 10 or a doped region provided in the substrate 10. The bit lines BL0-BL2 may be conductive patterns (for example, metal lines) provided over the substrate 10. The bit lines BL0-BL2 may be two-dimensionally arranged, and a plurality of cell strings CSTR may be connected in parallel to each of the bit lines BL0-BL2. Accordingly, the cell strings CSTR may also be two-dimensionally provided on the common source line CSL or the substrate 10.

Each of the cell strings CSTR may include a ground selection transistor GST coupled to the common source line CSL, a string selection transistor SST coupled to one of the bit lines BL0-BL2, and a plurality of memory cell transistors MCT disposed between the ground and string selection transistors GST and SST. The ground selection transistor GST, the string selection transistor SST, and the memory cell transistors MCT may be connected in series to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The ground selection transistors GST may be disposed at the substantially same level (for example, relative to the substrate 10), and the gate electrodes thereof may be connected in common to the ground selection line GSL, thereby being in an equipotential state. Similarly, the gate electrodes of the memory cell transistors MCT located at the same level may be connected in common to one of the word lines WL0-WL3, thereby being in an equipotential state. Since each of the cell strings CSTR includes a plurality of the memory cell transistors MCT disposed at different levels from each other, the word lines WL0-WL3 may have a multi-layered structure between the common source line CSL and the bit lines BL0-BL2. The word lines WL0-WL3 of the multi-layered structure may be configured to have the above described technical features of the semiconductor devices according to exemplary embodiments.

Each of the cell strings CSTR may include an active pattern (e.g., the vertical pattern VP of FIGS. 60 and 61) vertically extending from the common source line CSL to be connected to one of the bit line BL0-BL3. A memory layer (e.g., ML of FIGS. 60 and 61) may be provided between the word lines WL0-WL3 and the active pattern. In example embodiments, the memory layer may include a material or a layer structure, in which electric charges can be selectively stored. For example, the memory layer may include one of an insulating layer with many trap sites (e.g., a silicon nitride layer), a floating gate electrode, or an insulating layer provided with conductive nano dots.

Referring to FIG. 63, a plurality of selection transistors SST may be connected in parallel to a bit line BL via a plurality of bit line plugs BLP. Each of the bit line plugs BLP may be connected in common to a pair of the selection transistors SST disposed adjacent thereto.

A plurality of word lines WL and a plurality of vertical electrodes VE may be provided between the bit line BL and the selection transistors SST. The word lines WL may be configured to have the above described technical features according to exemplary embodiments. The vertical electrodes VE may be provided between the bit line plugs BLP.

For example, the vertical electrodes VE and the bit line plugs BLP may be alternatingly arranged along a direction parallel to the bit line BL. Furthermore, each of the vertical electrodes VE may be connected in common to a pair of the selection transistors SST disposed adjacent thereto.

A plurality of memory elements ME may be connected in parallel to each of the vertical electrodes VE. Each of the memory elements ME may be connected to the corresponding one of the word lines WL. In other words, each of the word lines WL may be connected to the corresponding one of the vertical electrodes VE via the corresponding one of the memory elements ME.

Each of the selection transistors SST may include a selection line SL serving as a gate electrode thereof. In example embodiments, the selection lines SL may be parallel to the word lines WL.

Three-dimensional semiconductor memory devices according to exemplary embodiments have been described with reference to FIGS. 62 and 63. These are merely provided as examples, to which the inventive concept can be applied, but exemplary embodiments may not be limited thereto.

Figure 64:
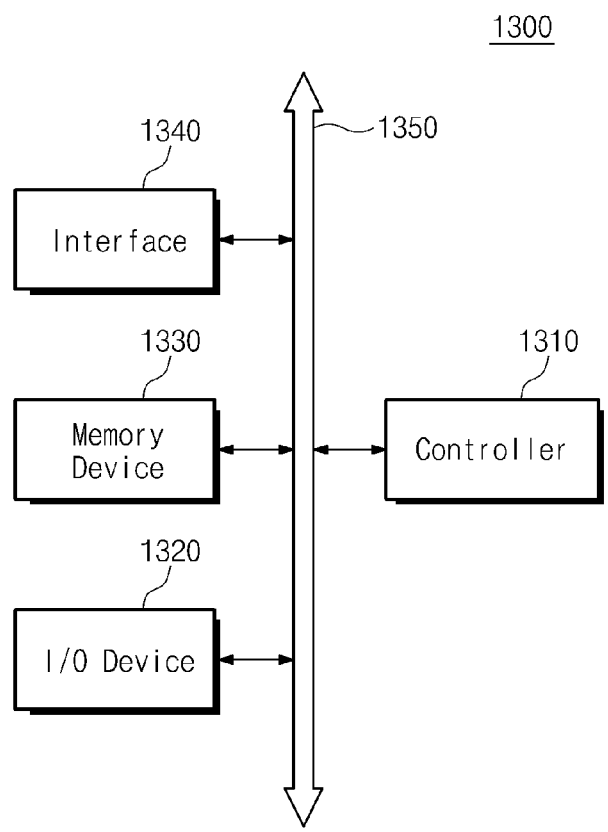
FIGS. 64 and 65 are schematic block diagrams exemplarily illustrating electronic devices, in which a semiconductor device according to exemplary embodiments is provided.
Figure 65:
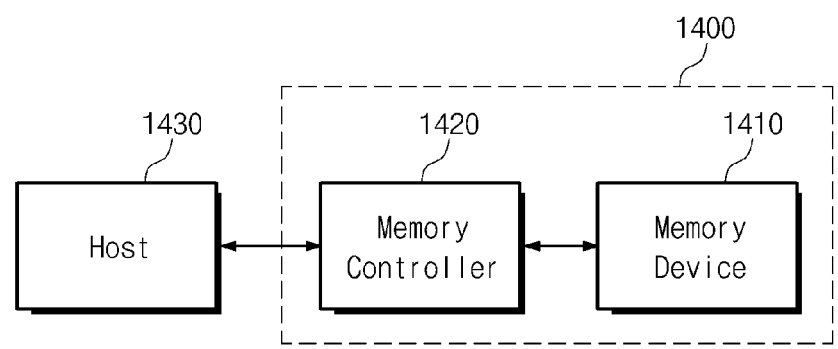

FIGS. 64 and 65 are schematic block diagrams exemplarily illustrating electronic devices, in which a semiconductor device according to exemplary embodiments is provided.

Referring to FIG. 64, an electronic device 1300 including a semiconductor device according to exemplary embodiments of inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to exemplary embodiments of inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 65, a memory system including a semiconductor device according to exemplary embodiments of inventive concept will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to exemplary embodiments of inventive concepts.

The semiconductor devices disclosed above may be encapsulated using various and diverse packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above embodiments is mounted may further include at least one semiconductor device (e.g., a controller and/or a logic device) that controls the semiconductor device.

According to exemplary embodiments, electrodes with a stepwise connection structure may be formed by first and second patterning processes, which are different from each other in terms of both of an etch depth and an etch region. Accordingly, compared to a conventional structure realized by using only a common single-layer etching method, the stepwise connection structure according to exemplary embodiments can be formed to have a reduced occupying area, and moreover, a process of fabricating the same can be simplified.

While exemplary embodiments have been particularly shown and described, it will be understood by one of ordinary skill in the art that variations in form and detail may be made therein without departing from the spirit and scope of the attached claims.

What is claimed is:

1. A three-dimensional semiconductor device, comprising an electrode structure including electrodes sequentially stacked on a substrate,
   wherein each of the electrodes comprises:
      a connecting portion horizontally protruding outward relative to a plane at which a sidewall of one of the electrodes located thereon, is disposed; and
      an aligned portion having a sidewall that is coplanar with a sidewall of the one of the electrodes located thereon or another of the electrodes located thereunder,
   wherein vertically adjacent at least two of the electrodes have sidewalls that are coplanar,
   wherein the electrode structure comprises at least one first group and at least one second group, and each of the at least one first group and the at least one second group comprises plural ones of the electrodes that are stacked on the substrate along a direction perpendicular to a top surface of the substrate,
   wherein the connecting portions of the electrodes of the at least one first group are positioned at a first side of the electrode structure and the aligned portions of the at least one first group are positioned at a second side of the electrode structure opposite to the first side of the electrode structure, and
   the connecting portions of the electrodes of the at least one second group are positioned at the second side of the electrode structure and the aligned portions of the at least one second group are positioned at the first side of the electrode structure.

2. The device of claim 1, wherein a number of the electrodes of each of the at least one first group and the at least one second group ranges from 2 to 16.

3. The device of claim 1, wherein the at least one first group comprises even-numbered ones of the electrodes stacked on the substrate and the at least one second group comprises odd-numbered electrodes stacked on the substrate.

4. The device of claim 1, wherein the at least one second group is disposed on or below the at least one first group.

5. The device of claim 1, wherein the at least one first group comprises $(4n+1)$-th and $(4n+2)$-th ones of the electrodes stacked on the substrate and the at least one second group comprises $(4n+3)$-th and $(4n+4)$-th ones of the electrodes, and
   wherein n is at least one selected from zero or natural numbers in such a way that $(4n+4)$ is smaller a total stacking number of the electrodes.

6. The device of claim 1, wherein the connecting and the aligned portions of each of the electrodes are positioned at both opposite end portions of corresponding electrode.

7. The device of claim 1, wherein the electrode structure comprises a first region, a second region, and an array region interposed therebetween, and each of the connecting portions and the aligned portions is positioned on one of the first and the second regions.

8. The device of claim 7, further comprising:
   vertical patterns vertically penetrating the array region of the electrode structure; and
   memory elements interposed between the vertical patterns and the electrodes.

9. The device of claim 8, wherein the memory elements comprise a material or a layer structure configured to be able to store charges or exhibit a variable resistance property.

10. A three-dimensional semiconductor device comprising an electrode structure including electrodes sequentially stacked on a substrate,
    wherein each of the electrodes comprises:
       a connecting portion horizontally protruding outward relative to a plane at which a sidewall of one of the electrodes located thereon, is disposed; and
       an aligned portion having a sidewall that is coplanar with a sidewall of the one of the electrodes located thereon or another of the electrodes located thereunder,
    wherein vertically adjacent at least two of the electrodes have sidewalls that are coplanar,
    wherein connecting portions of even-numbered ones of the electrodes are positioned at a first side of the electrode structure and the aligned portions of the even-numbered ones of the electrodes are positioned at a second side of the electrode structure opposite to the first side of the electrode structure, and
    wherein connecting portions of odd-numbered ones of the electrodes are positioned at the second side of the electrode structure and the aligned portions of odd-numbered ones of the electrodes are positioned at the first side of the electrode structure.

11. A three-dimensional semiconductor device comprising an electrode structure including electrodes sequentially stacked on a substrate,
    wherein each of the electrodes comprises:
       a connecting portion horizontally protruding outward relative to a plane at which a sidewall of one of the electrodes located thereon, is disposed; and
       an aligned portion having a sidewall that is coplanar with a sidewall of the one of the electrodes located thereon or another of the electrodes located thereunder, and wherein at least one dummy pattern is spaced apart horizontally from one of electrodes and is formed of the same material as the one of the electrodes.

12. The device of claim 11, wherein the at least one dummy pattern is in an electrical floating state.

13. A three-dimensional semiconductor device comprising an electrode structure including electrodes sequentially stacked on a substrate,
wherein each of the electrodes comprises:
a connecting portion horizontally protruding outward relative to a plane at which a sidewall of one of the electrodes located thereon, is disposed; and
an aligned portion having a sidewall that is coplanar with a sidewall of the one of the electrodes located thereon or another of the electrodes located thereunder,
wherein vertically adjacent at least two of the electrodes have sidewalls that are coplanar, and
wherein plugs are disposed on the electrode structure, and
wherein the electrode structure comprises:
a body portion including ones of the electrodes that are electrically connected to the plugs; and
a dummy portion including ones of the electrodes that are electrically separated from the plugs,
wherein the dummy portion is spaced apart horizontally from the body portion.

14. The device of claim 13, wherein the body portion comprises at least one body sidewall portion, and the dummy portion comprises a first dummy sidewall portion facing the body sidewall portion,
wherein the body sidewall portion and the first dummy sidewall portion are disposed to have mirror symmetry to each other, and each of the body sidewall portion and the first dummy sidewall portion has a stepwise section.

15. The device of claim 14, wherein the dummy portion further comprises a second dummy sidewall portion facing the first dummy sidewall portion, and
the second dummy sidewall portion is smaller than the first dummy sidewall portion, in terms of an angle with respect to a line normal to a top surface of the substrate.

16. The device of claim 15, wherein the second dummy sidewall portion has a stepwise section.

17. The device of claim 13, wherein the dummy portion includes plural ones of the electrodes that are consecutively stacked on the substrate.

* * * * *